US009176900B2

(12) United States Patent
Whitt, III et al.

(10) Patent No.: US 9,176,900 B2
(45) Date of Patent: Nov. 3, 2015

(54) FLEXIBLE HINGE AND REMOVABLE ATTACHMENT

(71) Applicant: Microsoft Corporation, Redmond, WA (US)

(72) Inventors: David Otto Whitt, III, Sammamish, WA (US); Eric Joseph Wahl, Kirkland, WA (US); David C. Vandervoort, Seattle, WA (US); Todd David Pleake, Sammamish, WA (US); Rob Huala, Bellevue, WA (US); Summer L. Schneider, Portland, OR (US); Robyn Rebecca Reed McLaughlin, Seattle, WA (US); Matthew David Mickelson, Seattle, WA (US); Joel Lawrence Pelley, Bellevue, WA (US); Timothy C. Shaw, Sammamish, WA (US); Ralf Groene, Kirkland, WA (US); Hua Wang, Sammamish, WA (US); Christopher Harry Stoumbos, Sammamish, WA (US); Karsten Aagaard, Monroe, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/225,276

(22) Filed: Mar. 25, 2014

(65) Prior Publication Data

US 2014/0204515 A1    Jul. 24, 2014

Related U.S. Application Data

(63) Continuation of application No. 13/939,002, filed on Jul. 10, 2013, now Pat. No. 8,780,541, which is a (Continued)

(51) Int. Cl.
   *G06F 1/16* (2006.01)
   *G06F 13/10* (2006.01)
   (Continued)

(52) U.S. Cl.
   CPC .............. *G06F 13/102* (2013.01); *G05B 11/01* (2013.01); *G06F 1/1618* (2013.01);
   (Continued)

(58) Field of Classification Search
   CPC ... G06F 1/1654; G06F 1/1669; G06F 1/1681; G06F 1/1683
   USPC .......................... 361/679.09, 679.15, 679.17, 361/679.27–679.29; 345/168, 169; 400/472; 439/38–40
   See application file for complete search history.

(56) References Cited

U.S. PATENT DOCUMENTS 578,325 A    3/1897  Fleming
(Continued)

FOREIGN PATENT DOCUMENTS

CA    990023    6/1976
(Continued)

OTHER PUBLICATIONS

"Accessing Device Sensors", retrieved from <https://developer.palm.com/content/api/dev-guide/pdk/accessing-device-sensors.html> on May 25, 2012, 2011, 4 pages.

(Continued)

*Primary Examiner* — Ramon Barrera
(74) *Attorney, Agent, or Firm* — Jeremy Snodgrass; Judy Yee; Micky Minhas

(57) ABSTRACT

Flexible hinge and removable attachment techniques are described. In one or more implementations, a flexible hinge is configured to communicatively and physically couple an input device to a computing device and may implement functionality such as a support layer and minimum bend radius. The input device may also include functionality to promote a secure physical connection between the input device and the computing device. One example of this includes use of one or more protrusions that are configured to be removed from respective cavities of the computing device along a particular axis but mechanically bind along other axes. Other techniques include use of a laminate structure to form a connection portion of the input device.

12 Claims, 14 Drawing Sheets

Related U.S. Application Data continuation of application No. 13/470,633, filed on May 14, 2012, now Pat. No. 8,498,100.

(60) Provisional application No. 61/606,301, filed on Mar. 2, 2012, provisional application No. 61/606,313, filed on Mar. 2, 2012.

(51) Int. Cl.

| | | |
|---|---|---|
| *H01H 13/79* | (2006.01) | |
| *H01H 13/78* | (2006.01) | |
| *H01H 13/785* | (2006.01) | |
| *G06F 3/02* | (2006.01) | |
| *H05K 5/02* | (2006.01) | |
| *H04M 1/02* | (2006.01) | |
| *H04M 1/725* | (2006.01) | |
| *G05B 11/01* | (2006.01) | |
| *G06F 3/041* | (2006.01) | |
| *H01H 13/704* | (2006.01) | |
| *H01H 13/82* | (2006.01) | |
| *G06F 3/00* | (2006.01) | |
| *G06F 3/01* | (2006.01) | |
| *H01H 13/702* | (2006.01) | |
| *H01H 13/14* | (2006.01) | |
| *H01H 13/703* | (2006.01) | |
| *G06F 9/54* | (2006.01) | |
| *G06F 11/30* | (2006.01) | |
| *G06F 3/023* | (2006.01) | |
| *H01H 9/26* | (2006.01) | |

(52) U.S. Cl.
CPC ........... *G06F 1/1654* (2013.01); *G06F 1/1656* (2013.01); *G06F 1/1662* (2013.01); *G06F 1/1669* (2013.01); *G06F 1/1681* (2013.01); *G06F 1/1683* (2013.01); *G06F 1/1684* (2013.01); *G06F 3/002* (2013.01); *G06F 3/01* (2013.01); *G06F 3/0202* (2013.01); *G06F 3/023* (2013.01); *G06F 3/0414* (2013.01); *G06F 3/0416* (2013.01); *G06F 9/541* (2013.01); *G06F 11/3089* (2013.01); *H01H 13/14* (2013.01); *H01H 13/702* (2013.01); *H01H 13/703* (2013.01); *H01H 13/704* (2013.01); *H01H 13/78* (2013.01); *H01H 13/785* (2013.01); *H01H 13/79* (2013.01); *H01H 13/82* (2013.01); *H04M 1/0216* (2013.01); *H04M 1/0254* (2013.01); *H04M 1/72527* (2013.01); *H05K 5/0226* (2013.01); *H05K 5/0234* (2013.01); *H01H 9/26* (2013.01); *H01H 2201/036* (2013.01); *H01H 2205/006* (2013.01); *H01H 2211/006* (2013.01); *H01H 2217/004* (2013.01); *H04M 1/0245* (2013.01); *Y10T 16/5401* (2015.01); *Y10T 16/551* (2015.01); *Y10T 29/49826* (2015.01)

(56) References Cited

U.S. PATENT DOCUMENTS

| | | |
|---|---|---|
| 3,600,528 A | 8/1971 | Leposavic |
| 3,777,082 A | 12/1973 | Hatley |
| 3,879,586 A | 4/1975 | DuRocher et al. |
| 3,968,336 A | 7/1976 | Johnson |
| 4,046,975 A | 9/1977 | Seeger, Jr. |
| 4,065,649 A | 12/1977 | Carter et al. |
| 4,086,451 A | 4/1978 | Boulanger |
| 4,239,338 A | 12/1980 | Borrelli et al. |
| 4,243,861 A | 1/1981 | Strandwitz |
| 4,261,042 A | 4/1981 | Ishiwatari et al. |
| 4,302,648 A | 11/1981 | Sado et al. |
| 4,317,013 A | 2/1982 | Larson |
| 4,365,130 A | 12/1982 | Christensen |
| 4,492,829 A | 1/1985 | Rodrique |
| 4,503,294 A | 3/1985 | Matsumaru |
| 4,527,021 A | 7/1985 | Morikawa et al. |
| 4,559,426 A | 12/1985 | Van Zeeland et al. |
| 4,576,436 A | 3/1986 | Daniel |
| 4,577,822 A | 3/1986 | Wilkerson |
| 4,588,187 A | 5/1986 | Dell |
| 4,607,147 A | 8/1986 | Ono et al. |
| 4,615,579 A | 10/1986 | Whitehead |
| 4,651,133 A | 3/1987 | Ganesan et al. |
| 4,735,394 A | 4/1988 | Facco |
| 4,735,495 A | 4/1988 | Henkes |
| 4,824,268 A | 4/1989 | Diernisse |
| 4,864,084 A | 9/1989 | Cardinale |
| 4,996,511 A | 2/1991 | Ohkawa et al. |
| 5,008,497 A | 4/1991 | Asher |
| 5,021,638 A | 6/1991 | Nopper et al. |
| 5,107,401 A | 4/1992 | Youn |
| 5,111,223 A | 5/1992 | Omura |
| 5,128,829 A | 7/1992 | Loew |
| 5,220,318 A | 6/1993 | Staley |
| 5,220,521 A | 6/1993 | Kikinis |
| 5,235,495 A | 8/1993 | Blair et al. |
| 5,249,978 A | 10/1993 | Gazda et al. |
| 5,253,362 A | 10/1993 | Nolan et al. |
| 5,283,559 A | 2/1994 | Kalendra et al. |
| 5,319,455 A | 6/1994 | Hoarty et al. |
| 5,331,443 A | 7/1994 | Stanisci |
| 5,339,382 A | 8/1994 | Whitehead |
| 5,340,528 A | 8/1994 | Machida et al. |
| 5,349,403 A | 9/1994 | Lo |
| 5,363,075 A | 11/1994 | Fanucchi |
| 5,375,076 A | 12/1994 | Goodrich et al. |
| 5,404,133 A | 4/1995 | Moriike et al. |
| 5,406,415 A | 4/1995 | Kelly |
| 5,480,118 A | 1/1996 | Cross |
| 5,491,313 A | 2/1996 | Bartley et al. |
| 5,546,271 A | 8/1996 | Gut et al. |
| 5,548,477 A | 8/1996 | Kumar et al. |
| 5,558,577 A | 9/1996 | Kato |
| 5,576,981 A | 11/1996 | Parker et al. |
| 5,581,682 A | 12/1996 | Anderson et al. |
| 5,596,700 A | 1/1997 | Darnell et al. |
| 5,618,232 A | 4/1997 | Martin |
| 5,621,494 A | 4/1997 | Kazumi et al. |
| 5,661,279 A | 8/1997 | Kenmochi |
| 5,666,112 A | 9/1997 | Crowley et al. |
| 5,681,220 A | 10/1997 | Bertram et al. |
| 5,737,183 A | 4/1998 | Kobayashi et al. |
| 5,745,376 A | 4/1998 | Barker et al. |
| 5,748,114 A | 5/1998 | Koehn |
| 5,781,406 A | 7/1998 | Hunte |
| 5,806,955 A | 9/1998 | Parkyn, Jr. et al. |
| 5,807,175 A | 9/1998 | Davis et al. |
| 5,808,713 A | 9/1998 | Broer et al. |
| 5,818,361 A | 10/1998 | Acevedo |
| 5,828,770 A | 10/1998 | Leis et al. |
| 5,838,403 A | 11/1998 | Jannson et al. |
| 5,842,027 A | 11/1998 | Oprescu et al. |
| 5,850,135 A | 12/1998 | Kuki et al. |
| 5,861,990 A | 1/1999 | Tedesco |
| 5,874,697 A | 2/1999 | Selker et al. |
| 5,905,485 A | 5/1999 | Podoloff |
| 5,920,317 A | 7/1999 | McDonald |
| 5,924,555 A | 7/1999 | Sadamori et al. |
| 5,926,170 A | 7/1999 | Oba |
| 5,929,946 A | 7/1999 | Sharp et al. |
| 5,948,990 A | 9/1999 | Hashida |
| 5,957,191 A | 9/1999 | Okada et al. |
| 5,971,635 A | 10/1999 | Wise |
| 5,999,147 A | 12/1999 | Teitel |
| 6,002,389 A | 12/1999 | Kasser |
| 6,002,581 A | 12/1999 | Lindsey |
| 6,005,209 A | 12/1999 | Burleson et al. |
| 6,012,714 A | 1/2000 | Worley et al. |
| 6,014,800 A | 1/2000 | Lee |
| 6,040,823 A | 3/2000 | Seffernick et al. |

(56) References Cited

U.S. PATENT DOCUMENTS

| | | |
|---|---|---|
| 6,042,075 A | 3/2000 | Burch, Jr. |
| 6,044,717 A | 4/2000 | Biegelsen et al. |
| 6,046,857 A | 4/2000 | Morishima et al. |
| 6,055,705 A | 5/2000 | Komatsu et al. |
| 6,061,644 A | 5/2000 | Leis |
| 6,072,551 A | 6/2000 | Jannson et al. |
| 6,108,200 A | 8/2000 | Fullerton |
| 6,112,797 A | 9/2000 | Colson et al. |
| 6,124,906 A | 9/2000 | Kawada et al. |
| 6,128,007 A | 10/2000 | Seybold |
| 6,129,444 A | 10/2000 | Tognoni |
| 6,141,388 A | 10/2000 | Servais et al. |
| 6,178,085 B1 | 1/2001 | Leung |
| 6,178,443 B1 | 1/2001 | Lin |
| 6,188,391 B1 | 2/2001 | Seely et al. |
| 6,228,926 B1 | 5/2001 | Golumbic |
| 6,232,934 B1 | 5/2001 | Heacock et al. |
| 6,234,820 B1 | 5/2001 | Perino et al. |
| 6,254,105 B1 | 7/2001 | Rinde et al. |
| 6,256,447 B1 | 7/2001 | Laine |
| 6,278,490 B1 | 8/2001 | Fukuda et al. |
| 6,279,060 B1 | 8/2001 | Luke et al. |
| 6,300,986 B1 | 10/2001 | Travis |
| 6,329,617 B1 | 12/2001 | Burgess |
| 6,344,791 B1 | 2/2002 | Armstrong |
| 6,353,503 B1 | 3/2002 | Spitzer et al. |
| 6,366,440 B1 | 4/2002 | Kung |
| 6,380,497 B1 | 4/2002 | Hashimoto et al. |
| 6,437,682 B1 | 8/2002 | Vance |
| 6,450,046 B1 | 9/2002 | Maeda |
| 6,506,983 B1 | 1/2003 | Wilson et al. |
| 6,511,378 B1 | 1/2003 | Bhatt et al. |
| 6,529,179 B1 | 3/2003 | Hashimoto et al. |
| 6,532,147 B1 | 3/2003 | Christ, Jr. |
| 6,543,949 B1 | 4/2003 | Ritchey et al. |
| 6,555,024 B2 | 4/2003 | Ueda et al. |
| 6,565,439 B2 | 5/2003 | Shinohara et al. |
| 6,574,030 B1 | 6/2003 | Mosier |
| 6,585,435 B2 | 7/2003 | Fang |
| 6,597,347 B1 | 7/2003 | Yasutake |
| 6,600,121 B1 | 7/2003 | Olodort et al. |
| 6,603,408 B1 | 8/2003 | Gaba |
| 6,603,461 B2 | 8/2003 | Smith, Jr. et al. |
| 6,608,664 B1 | 8/2003 | Hasegawa |
| 6,617,536 B2 | 9/2003 | Kawaguchi |
| 6,648,485 B1 | 11/2003 | Colgan et al. |
| 6,651,943 B2 | 11/2003 | Cho et al. |
| 6,684,166 B2 | 1/2004 | Bellwood et al. |
| 6,685,369 B2 | 2/2004 | Lien |
| 6,687,614 B2 | 2/2004 | Ihara et al. |
| 6,695,273 B2 | 2/2004 | Iguchi |
| 6,700,617 B1 | 3/2004 | Hamamura et al. |
| 6,704,864 B1 | 3/2004 | Philyaw |
| 6,721,019 B2 | 4/2004 | Kono et al. |
| 6,725,318 B1 | 4/2004 | Sherman et al. |
| 6,774,888 B1 | 8/2004 | Genduso |
| 6,776,546 B2 | 8/2004 | Kraus et al. |
| 6,780,019 B1 | 8/2004 | Ghosh et al. |
| 6,781,819 B2 | 8/2004 | Yang et al. |
| 6,784,869 B1 | 8/2004 | Clark et al. |
| 6,790,054 B1 | 9/2004 | Boonsue |
| 6,795,146 B2 | 9/2004 | Dozov et al. |
| 6,798,887 B1 | 9/2004 | Andre |
| 6,813,143 B2 | 11/2004 | Makela |
| 6,819,082 B2 | 11/2004 | Yang |
| 6,819,316 B2 | 11/2004 | Schulz et al. |
| 6,847,488 B2 | 1/2005 | Travis |
| 6,856,506 B2 | 2/2005 | Doherty et al. |
| 6,856,789 B2 | 2/2005 | Pattabiraman et al. |
| 6,859,565 B2 | 2/2005 | Baron |
| 6,861,961 B2 | 3/2005 | Sandbach et al. |
| 6,870,671 B2 | 3/2005 | Travis |
| 6,895,164 B2 | 5/2005 | Saccomanno |
| 6,898,315 B2 | 5/2005 | Guha |
| 6,902,214 B2 | 6/2005 | Smith |
| 6,909,354 B2 | 6/2005 | Baker et al. |
| 6,914,197 B2 | 7/2005 | Doherty et al. |
| 6,950,950 B2 | 9/2005 | Sawyers et al. |
| 6,962,454 B1 | 11/2005 | Costello |
| 6,970,957 B1 | 11/2005 | Oshins et al. |
| 6,976,799 B2 | 12/2005 | Kim et al. |
| 6,980,177 B2 | 12/2005 | Struyk |
| 7,002,624 B1 | 2/2006 | Uchino et al. |
| 7,006,080 B2 | 2/2006 | Gettemy |
| 7,007,238 B2 | 2/2006 | Glaser |
| 7,018,678 B2 | 3/2006 | Gronbeck et al. |
| 7,019,491 B2 | 3/2006 | Bozzone et al. |
| 7,025,908 B1 | 4/2006 | Hayashi et al. |
| 7,051,149 B2 | 5/2006 | Wang et al. |
| 7,068,496 B2 | 6/2006 | Wong et al. |
| 7,083,295 B1 | 8/2006 | Hanna |
| 7,091,436 B2 | 8/2006 | Serban |
| 7,095,404 B2 | 8/2006 | Vincent et al. |
| 7,099,149 B2 | 8/2006 | Krieger et al. |
| 7,101,048 B2 | 9/2006 | Travis |
| 7,102,683 B2 | 9/2006 | Perry et al. |
| 7,104,679 B2 | 9/2006 | Shin et al. |
| 7,106,222 B2 | 9/2006 | Ward et al. |
| 7,116,309 B1 | 10/2006 | Kimura et al. |
| 7,123,292 B1 | 10/2006 | Seeger et al. |
| 7,129,979 B1 | 10/2006 | Lee |
| 7,136,282 B1 | 11/2006 | Rebeske |
| 7,152,985 B2 | 12/2006 | Benitez et al. |
| 7,153,017 B2 | 12/2006 | Yamashita et al. |
| D535,292 S | 1/2007 | Shi et al. |
| 7,162,153 B2 | 1/2007 | Harter, Jr. et al. |
| 7,169,460 B1 | 1/2007 | Chen et al. |
| 7,194,662 B2 | 3/2007 | Do et al. |
| 7,199,554 B2 | 4/2007 | Kim et al. |
| 7,199,931 B2 | 4/2007 | Boettiger et al. |
| 7,201,508 B2 | 4/2007 | Misaras |
| 7,213,323 B2 | 5/2007 | Baker et al. |
| 7,213,991 B2 | 5/2007 | Chapman et al. |
| 7,224,830 B2 | 5/2007 | Nefian et al. |
| 7,239,505 B2 | 7/2007 | Keely et al. |
| 7,252,512 B2 | 8/2007 | Tai et al. |
| 7,260,221 B1 | 8/2007 | Atsmon |
| 7,260,823 B2 | 8/2007 | Schlack et al. |
| 7,277,087 B2 | 10/2007 | Hill et al. |
| 7,280,348 B2 | 10/2007 | Ghosh |
| 7,295,720 B2 | 11/2007 | Raskar |
| 7,301,759 B2 | 11/2007 | Hsiung |
| 7,311,526 B2 | 12/2007 | Rohrbach et al. |
| 7,331,793 B2 | 2/2008 | Hernandez et al. |
| 7,348,513 B2 | 3/2008 | Lin |
| 7,365,967 B2 | 4/2008 | Zheng |
| 7,370,342 B2 | 5/2008 | Ismail et al. |
| 7,374,312 B2 | 5/2008 | Feng et al. |
| 7,375,885 B2 | 5/2008 | Ijzerman et al. |
| 7,379,094 B2 | 5/2008 | Yoshida et al. |
| 7,400,377 B2 | 7/2008 | Evans et al. |
| 7,415,676 B2 | 8/2008 | Fujita |
| 7,431,489 B2 | 10/2008 | Yeo et al. |
| 7,443,443 B2 | 10/2008 | Raskar et al. |
| 7,447,934 B2 | 11/2008 | Dasari et al. |
| 7,457,108 B2 | 11/2008 | Ghosh |
| 7,467,948 B2 | 12/2008 | Lindberg et al. |
| 7,469,386 B2 | 12/2008 | Bear et al. |
| 7,486,165 B2 | 2/2009 | Ligtenberg et al. |
| 7,499,037 B2 | 3/2009 | Lube |
| 7,499,216 B2 | 3/2009 | Niv et al. |
| 7,502,803 B2 | 3/2009 | Culter et al. |
| 7,503,684 B2 | 3/2009 | Ueno et al. |
| 7,509,042 B2 | 3/2009 | Mori et al. |
| 7,515,143 B2 | 4/2009 | Keam et al. |
| 7,528,337 B2 | 5/2009 | Tanabe et al. |
| 7,528,374 B2 | 5/2009 | Smitt et al. |
| 7,539,882 B2 | 5/2009 | Jessup et al. |
| 7,542,052 B2 | 6/2009 | Solomon et al. |
| 7,558,594 B2 | 7/2009 | Wilson |
| 7,559,834 B1 | 7/2009 | York |
| 7,561,131 B2 | 7/2009 | Ijzerman et al. |
| 7,572,045 B2 | 8/2009 | Hoelen et al. |
| RE40,891 E | 9/2009 | Yasutake |

(56) References Cited

U.S. PATENT DOCUMENTS

| | | |
|---|---|---|
| 7,594,638 B2 | 9/2009 | Chan et al. |
| 7,620,244 B1 | 11/2009 | Collier |
| 7,631,327 B2 | 12/2009 | Dempski et al. |
| 7,636,921 B2 | 12/2009 | Louie |
| 7,639,329 B2 | 12/2009 | Takeda et al. |
| 7,639,876 B2 | 12/2009 | Clary et al. |
| 7,643,213 B2 | 1/2010 | Boettiger et al. |
| 7,656,392 B2 | 2/2010 | Bolender |
| 7,675,598 B2 | 3/2010 | Hong |
| 7,686,694 B2 | 3/2010 | Cole |
| 7,705,558 B2 | 4/2010 | Silverman |
| 7,715,187 B2 | 5/2010 | Hotelling et al. |
| 7,722,358 B2 | 5/2010 | Chatterjee et al. |
| 7,722,792 B2 | 5/2010 | Uezaki et al. |
| 7,724,952 B2 | 5/2010 | Shum et al. |
| 7,728,923 B2 | 6/2010 | Kim et al. |
| 7,729,493 B2 | 6/2010 | Krieger et al. |
| 7,731,147 B2 | 6/2010 | Rha |
| 7,733,326 B1 | 6/2010 | Adiseshan |
| 7,761,119 B2 | 7/2010 | Patel |
| 7,773,076 B2 | 8/2010 | Pittel et al. |
| 7,773,121 B1 | 8/2010 | Huntsberger et al. |
| 7,774,155 B2 | 8/2010 | Sato et al. |
| 7,777,972 B1 | 8/2010 | Chen et al. |
| 7,782,341 B2 | 8/2010 | Kothandaraman |
| 7,782,342 B2 | 8/2010 | Koh |
| 7,813,715 B2 | 10/2010 | McKillop et al. |
| 7,815,358 B2 | 10/2010 | Inditsky |
| 7,822,338 B2 | 10/2010 | Wernersson |
| 7,844,985 B2 | 11/2010 | Hendricks et al. |
| 7,855,716 B2 | 12/2010 | McCreary et al. |
| 7,865,639 B2 | 1/2011 | McCoy et al. |
| 7,884,807 B2 | 2/2011 | Hovden et al. |
| 7,893,921 B2 | 2/2011 | Sato |
| 7,898,797 B2 | 3/2011 | Fan et al. |
| D636,397 S | 4/2011 | Green |
| 7,918,559 B2 | 4/2011 | Tesar |
| 7,927,654 B2 | 4/2011 | Hagood et al. |
| 7,928,964 B2 | 4/2011 | Kolmykov-Zotov et al. |
| 7,932,890 B2 | 4/2011 | Onikiri et al. |
| 7,936,501 B2 | 5/2011 | Smith et al. |
| 7,944,520 B2 | 5/2011 | Ichioka et al. |
| 7,945,717 B2 | 5/2011 | Rivalsi |
| 7,957,082 B2 | 6/2011 | Mi et al. |
| 7,965,268 B2 | 6/2011 | Gass et al. |
| 7,967,462 B2 | 6/2011 | Ogiro et al. |
| 7,970,246 B2 | 6/2011 | Travis et al. |
| 7,973,771 B2 | 7/2011 | Geaghan |
| 7,976,393 B2 | 7/2011 | Haga et al. |
| 7,978,281 B2 | 7/2011 | Vergith et al. |
| 8,016,255 B2 | 9/2011 | Lin |
| 8,018,386 B2 | 9/2011 | Qi et al. |
| 8,018,579 B1 | 9/2011 | Krah |
| 8,026,904 B2 | 9/2011 | Westerman |
| 8,035,614 B2 | 10/2011 | Bell et al. |
| 8,035,624 B2 | 10/2011 | Bell et al. |
| 8,053,688 B2 | 11/2011 | Conzola et al. |
| 8,059,384 B2 | 11/2011 | Park et al. |
| 8,065,624 B2 | 11/2011 | Morin et al. |
| 8,069,356 B2 | 11/2011 | Rathi et al. |
| RE42,992 E | 12/2011 | David |
| 8,077,160 B2 | 12/2011 | Land et al. |
| 8,090,885 B2 | 1/2012 | Callaghan et al. |
| 8,098,233 B2 | 1/2012 | Hotelling et al. |
| 8,102,362 B2 | 1/2012 | Ricks et al. |
| 8,115,499 B2 | 2/2012 | Osoinach et al. |
| 8,115,718 B2 | 2/2012 | Chen et al. |
| 8,117,362 B2 | 2/2012 | Rodriguez et al. |
| 8,118,274 B2 | 2/2012 | McClure et al. |
| 8,118,681 B2 | 2/2012 | Mattice et al. |
| 8,120,166 B2 | 2/2012 | Koizumi et al. |
| 8,130,203 B2 | 3/2012 | Westerman |
| 8,149,219 B2 | 4/2012 | Lii et al. |
| 8,154,524 B2 | 4/2012 | Wilson et al. |
| 8,159,372 B2 | 4/2012 | Sherman |
| 8,162,282 B2 | 4/2012 | Hu et al. |
| D659,139 S | 5/2012 | Gengler |
| 8,169,185 B2 | 5/2012 | Partovi et al. |
| 8,169,421 B2 | 5/2012 | Wright et al. |
| 8,179,236 B2 | 5/2012 | Weller et al. |
| 8,184,190 B2 | 5/2012 | Dosluoglu |
| 8,189,973 B2 | 5/2012 | Travis et al. |
| 8,216,074 B2 | 7/2012 | Sakuma |
| 8,229,509 B2 | 7/2012 | Paek et al. |
| 8,229,522 B2 | 7/2012 | Kim et al. |
| 8,231,099 B2 | 7/2012 | Chen |
| 8,243,432 B2 | 8/2012 | Duan et al. |
| 8,248,791 B2 | 8/2012 | Wang et al. |
| 8,255,708 B1 | 8/2012 | Zhang |
| 8,263,730 B2 | 9/2012 | Shimizu |
| 8,264,310 B2 | 9/2012 | Lauder et al. |
| 8,267,368 B2 | 9/2012 | Torii et al. |
| 8,269,731 B2 | 9/2012 | Molne |
| 8,274,784 B2 | 9/2012 | Franz et al. |
| 8,279,589 B2 | 10/2012 | Kim |
| 8,310,508 B2 | 11/2012 | Hekstra et al. |
| 8,310,768 B2 | 11/2012 | Lin et al. |
| 8,322,290 B1 | 12/2012 | Mignano |
| 8,325,416 B2 | 12/2012 | Lesage et al. |
| 8,342,857 B2 | 1/2013 | Palli et al. |
| 8,345,920 B2 | 1/2013 | Ferren et al. |
| 8,346,206 B1 | 1/2013 | Andrus et al. |
| 8,354,806 B2 | 1/2013 | Travis et al. |
| 8,362,975 B2 | 1/2013 | Uehara |
| 8,371,174 B2 | 2/2013 | Chen et al. |
| 8,373,664 B2 | 2/2013 | Wright |
| 8,384,566 B2 | 2/2013 | Bocirnea |
| 8,387,078 B2 | 2/2013 | Memmott |
| 8,387,938 B2 | 3/2013 | Lin |
| 8,389,078 B2 | 3/2013 | Lin et al. |
| 8,403,576 B2 | 3/2013 | Merz |
| 8,416,206 B2 | 4/2013 | Carpendale et al. |
| 8,416,559 B2 | 4/2013 | Agata et al. |
| 8,424,160 B2 | 4/2013 | Chen |
| 8,464,079 B2 | 6/2013 | Chueh et al. |
| 8,466,902 B2 | 6/2013 | Boer et al. |
| 8,497,657 B2 | 7/2013 | Franks et al. |
| 8,498,100 B1 | 7/2013 | Whitt, III et al. |
| 8,514,568 B2 | 8/2013 | Qiao et al. |
| 8,520,371 B2 | 8/2013 | Peng et al. |
| 8,543,227 B1 | 9/2013 | Perek et al. |
| 8,548,608 B2 | 10/2013 | Perek et al. |
| 8,564,944 B2 | 10/2013 | Whitt, III et al. |
| 8,569,640 B2 | 10/2013 | Yamada et al. |
| 8,570,725 B2 | 10/2013 | Whitt, III et al. |
| 8,576,031 B2 | 11/2013 | Lauder et al. |
| 8,582,280 B2 | 11/2013 | Ryu |
| 8,587,701 B2 | 11/2013 | Tatsuzawa |
| 8,599,542 B1 | 12/2013 | Healey et al. |
| 8,600,526 B2 | 12/2013 | Nielsen et al. |
| 8,610,015 B2 | 12/2013 | Whitt et al. |
| 8,614,666 B2 | 12/2013 | Whitman et al. |
| 8,646,999 B2 | 2/2014 | Shaw et al. |
| 8,654,030 B1 | 2/2014 | Mercer |
| 8,674,941 B2 | 3/2014 | Casparian et al. |
| 8,699,215 B2 | 4/2014 | Whitt, III et al. |
| 8,719,603 B2 | 5/2014 | Belesiu et al. |
| 8,724,302 B2 | 5/2014 | Whitt et al. |
| 8,744,070 B2 | 6/2014 | Zhang et al. |
| 8,744,391 B2 | 6/2014 | Tenbrook et al. |
| 8,762,746 B1 | 6/2014 | Lachwani et al. |
| 8,767,388 B2 | 7/2014 | Ahn et al. |
| 8,780,540 B2 | 7/2014 | Whitt, III et al. |
| 8,780,541 B2 | 7/2014 | Whitt et al. |
| 8,791,382 B2 | 7/2014 | Whitt, III et al. |
| 8,797,765 B2 | 8/2014 | Lin et al. |
| 8,825,187 B1 | 9/2014 | Hamrick et al. |
| 8,830,668 B2 | 9/2014 | Whitt, III et al. |
| 8,850,241 B2 | 9/2014 | Oler et al. |
| 8,854,799 B2 | 10/2014 | Whitt, III et al. |
| 8,873,227 B2 | 10/2014 | Whitt et al. |
| 8,891,232 B2 | 11/2014 | Wang |
| 8,896,993 B2 | 11/2014 | Belesiu et al. |
| 8,903,517 B2 | 12/2014 | Perek et al. |

(56) References Cited

U.S. PATENT DOCUMENTS

| | | |
|---|---|---|
| 8,908,858 B2 | 12/2014 | Chiu et al. |
| 8,934,221 B2 | 1/2015 | Guo |
| 8,935,774 B2 | 1/2015 | Belesiu et al. |
| 8,939,422 B2 | 1/2015 | Liu et al. |
| 8,947,864 B2 | 2/2015 | Whitt, III et al. |
| 8,949,477 B2 | 2/2015 | Drasnin |
| 8,964,376 B2 | 2/2015 | Chen |
| 9,047,207 B2 | 6/2015 | Belesiu et al. |
| 9,064,654 B2 | 6/2015 | Whitt, III et al. |
| 9,075,566 B2 | 7/2015 | Whitt, III et al. |
| 9,098,117 B2 | 8/2015 | Lutz, III et al. |
| 9,098,304 B2 | 8/2015 | Young et al. |
| 9,111,703 B2 | 8/2015 | Whitt, III et al. |
| 9,116,550 B2 | 8/2015 | Siddiqui et al. |
| 9,134,807 B2 | 9/2015 | Shaw et al. |
| 9,134,808 B2 | 9/2015 | Siddiqui et al. |
| 2001/0023818 A1 | 9/2001 | Masaru et al. |
| 2002/0005108 A1 | 1/2002 | Ludwig |
| 2002/0044216 A1 | 4/2002 | Cha |
| 2002/0070883 A1 * | 6/2002 | Dosch ............................ 341/22 |
| 2002/0113882 A1 | 8/2002 | Pollard et al. |
| 2002/0126445 A1 | 9/2002 | Minaguchi et al. |
| 2002/0134828 A1 | 9/2002 | Sandbach et al. |
| 2002/0135457 A1 | 9/2002 | Sandbach et al. |
| 2002/0163510 A1 | 11/2002 | Williams et al. |
| 2002/0195177 A1 | 12/2002 | Hinkley et al. |
| 2003/0007648 A1 | 1/2003 | Currell |
| 2003/0011576 A1 | 1/2003 | Sandbach et al. |
| 2003/0016282 A1 | 1/2003 | Koizumi |
| 2003/0036365 A1 | 2/2003 | Kuroda |
| 2003/0051983 A1 | 3/2003 | Lahr |
| 2003/0067450 A1 | 4/2003 | Thursfield et al. |
| 2003/0108720 A1 | 6/2003 | Kashino |
| 2003/0128285 A1 | 7/2003 | Itoh |
| 2003/0132916 A1 | 7/2003 | Kramer |
| 2003/0148740 A1 | 8/2003 | Yau et al. |
| 2003/0163611 A1 | 8/2003 | Nagao |
| 2003/0165017 A1 | 9/2003 | Amitai |
| 2003/0173195 A1 | 9/2003 | Federspiel |
| 2003/0197687 A1 | 10/2003 | Shetter |
| 2003/0197806 A1 | 10/2003 | Perry et al. |
| 2003/0198008 A1 | 10/2003 | Leapman et al. |
| 2003/0231243 A1 | 12/2003 | Shibutani |
| 2004/0005184 A1 | 1/2004 | Kim et al. |
| 2004/0046796 A1 | 3/2004 | Fujita |
| 2004/0048941 A1 | 3/2004 | Raffel et al. |
| 2004/0056843 A1 | 3/2004 | Lin et al. |
| 2004/0100457 A1 | 5/2004 | Mandle |
| 2004/0113956 A1 | 6/2004 | Bellwood et al. |
| 2004/0115994 A1 | 6/2004 | Wulff et al. |
| 2004/0156168 A1 | 8/2004 | LeVasseur et al. |
| 2004/0160734 A1 | 8/2004 | Yim |
| 2004/0169641 A1 | 9/2004 | Bean et al. |
| 2004/0189822 A1 | 9/2004 | Shimada |
| 2004/0212598 A1 | 10/2004 | Kraus et al. |
| 2004/0212601 A1 | 10/2004 | Cake et al. |
| 2004/0231969 A1 | 11/2004 | Kitano et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0047773 A1 | 3/2005 | Satake et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0059489 A1 | 3/2005 | Kim |
| 2005/0062715 A1 | 3/2005 | Tsuji et al. |
| 2005/0068460 A1 | 3/2005 | Lin |
| 2005/0094895 A1 | 5/2005 | Baron |
| 2005/0099400 A1 | 5/2005 | Lee |
| 2005/0100690 A1 | 5/2005 | Mayer et al. |
| 2005/0134717 A1 | 6/2005 | Misawa |
| 2005/0146512 A1 | 7/2005 | Hill et al. |
| 2005/0231156 A1 | 10/2005 | Yan |
| 2005/0236848 A1 | 10/2005 | Kim et al. |
| 2005/0240949 A1 | 10/2005 | Liu et al. |
| 2005/0264653 A1 | 12/2005 | Starkweather et al. |
| 2005/0264988 A1 | 12/2005 | Nicolosi |
| 2005/0265035 A1 | 12/2005 | Brass et al. |
| 2005/0283731 A1 | 12/2005 | Saint-Hilaire et al. |
| 2005/0285703 A1 | 12/2005 | Wheeler et al. |
| 2006/0010400 A1 | 1/2006 | Dehlin et al. |
| 2006/0028400 A1 | 2/2006 | Lapstun et al. |
| 2006/0028838 A1 | 2/2006 | Imade |
| 2006/0049920 A1 | 3/2006 | Sadler et al. |
| 2006/0049993 A1 | 3/2006 | Lin et al. |
| 2006/0061555 A1 | 3/2006 | Mullen |
| 2006/0070384 A1 | 4/2006 | Ertel |
| 2006/0083004 A1 | 4/2006 | Cok |
| 2006/0085658 A1 | 4/2006 | Allen et al. |
| 2006/0092139 A1 | 5/2006 | Sharma |
| 2006/0096392 A1 | 5/2006 | Inkster et al. |
| 2006/0102914 A1 | 5/2006 | Smits et al. |
| 2006/0125799 A1 | 6/2006 | Hillis et al. |
| 2006/0132423 A1 | 6/2006 | Travis |
| 2006/0146573 A1 | 7/2006 | Iwauchi et al. |
| 2006/0154725 A1 | 7/2006 | Glaser et al. |
| 2006/0155391 A1 | 7/2006 | Pistemaa et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |
| 2006/0181514 A1 | 8/2006 | Newman |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0197755 A1 | 9/2006 | Bawany |
| 2006/0215244 A1 | 9/2006 | Yosha et al. |
| 2006/0227393 A1 | 10/2006 | Herloski |
| 2006/0238510 A1 | 10/2006 | Panotopoulos et al. |
| 2006/0238550 A1 | 10/2006 | Page |
| 2006/0254042 A1 | 11/2006 | Chou et al. |
| 2006/0261778 A1 | 11/2006 | Elizalde Rodarte |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2006/0279501 A1 | 12/2006 | Lu et al. |
| 2007/0002587 A1 | 1/2007 | Miyashita |
| 2007/0003267 A1 | 1/2007 | Shibutani |
| 2007/0019181 A1 | 1/2007 | Sinclair et al. |
| 2007/0024742 A1 | 2/2007 | Raskar et al. |
| 2007/0046625 A1 | 3/2007 | Yee |
| 2007/0047221 A1 | 3/2007 | Park |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0076434 A1 | 4/2007 | Uehara et al. |
| 2007/0081091 A1 | 4/2007 | Pan et al. |
| 2007/0114967 A1 | 5/2007 | Peng |
| 2007/0116929 A1 | 5/2007 | Fujimori et al. |
| 2007/0117600 A1 | 5/2007 | Robertson et al. |
| 2007/0121956 A1 | 5/2007 | Bai et al. |
| 2007/0126393 A1 | 6/2007 | Bersenev |
| 2007/0145945 A1 | 6/2007 | McGinley et al. |
| 2007/0161262 A1 | 7/2007 | Lloyd |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0188478 A1 | 8/2007 | Silverstein et al. |
| 2007/0189667 A1 | 8/2007 | Wakita et al. |
| 2007/0194752 A1 | 8/2007 | McBurney |
| 2007/0200830 A1 | 8/2007 | Yamamoto |
| 2007/0201246 A1 | 8/2007 | Yeo et al. |
| 2007/0201859 A1 | 8/2007 | Sarrat |
| 2007/0220708 A1 | 9/2007 | Lewis |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247338 A1 | 10/2007 | Marchetto |
| 2007/0247432 A1 | 10/2007 | Oakley |

(56) References Cited

U.S. PATENT DOCUMENTS

| | | |
|---|---|---|
| 2007/0247800 A1 | 10/2007 | Smith et al. |
| 2007/0252674 A1 | 11/2007 | Nelson et al. |
| 2007/0260892 A1 | 11/2007 | Paul et al. |
| 2007/0263119 A1 | 11/2007 | Shum et al. |
| 2007/0274094 A1 | 11/2007 | Schultz et al. |
| 2007/0274095 A1 | 11/2007 | Destain |
| 2007/0274099 A1 | 11/2007 | Tai et al. |
| 2007/0283179 A1 | 12/2007 | Burnett et al. |
| 2007/0296709 A1 | 12/2007 | Guanghai |
| 2007/0297625 A1 | 12/2007 | Hjort et al. |
| 2008/0002350 A1 | 1/2008 | Farrugia |
| 2008/0005423 A1 | 1/2008 | Jacobs et al. |
| 2008/0013809 A1 | 1/2008 | Zhu et al. |
| 2008/0019150 A1 | 1/2008 | Park et al. |
| 2008/0019684 A1 | 1/2008 | Shyu et al. |
| 2008/0030937 A1 | 2/2008 | Russo et al. |
| 2008/0037284 A1 | 2/2008 | Rudisill |
| 2008/0053222 A1 | 3/2008 | Ehrensvard et al. |
| 2008/0059888 A1 | 3/2008 | Dunko |
| 2008/0068451 A1 | 3/2008 | Hyatt |
| 2008/0074398 A1 | 3/2008 | Wright |
| 2008/0084499 A1 | 4/2008 | Kisacanin et al. |
| 2008/0088593 A1 | 4/2008 | Smoot |
| 2008/0090626 A1 | 4/2008 | Griffin et al. |
| 2008/0104437 A1 | 5/2008 | Lee |
| 2008/0106592 A1 | 5/2008 | Mikami |
| 2008/0111518 A1 | 5/2008 | Toya |
| 2008/0122803 A1 | 5/2008 | Izadi et al. |
| 2008/0129520 A1 | 6/2008 | Lee |
| 2008/0150913 A1 | 6/2008 | Bell et al. |
| 2008/0151478 A1 | 6/2008 | Chern, Jr. |
| 2008/0158185 A1 | 7/2008 | Westerman |
| 2008/0167832 A1 | 7/2008 | Soss |
| 2008/0174570 A1 | 7/2008 | Jobs et al. |
| 2008/0177185 A1 | 7/2008 | Nakao et al. |
| 2008/0179507 A2 | 7/2008 | Han |
| 2008/0180411 A1 | 7/2008 | Solomon et al. |
| 2008/0182622 A1 | 7/2008 | Makarowski et al. |
| 2008/0186660 A1 | 8/2008 | Yang |
| 2008/0203277 A1 | 8/2008 | Warszauer et al. |
| 2008/0211787 A1 | 9/2008 | Nakao et al. |
| 2008/0219025 A1 | 9/2008 | Spitzer et al. |
| 2008/0225205 A1 | 9/2008 | Travis |
| 2008/0228969 A1 | 9/2008 | Cheah et al. |
| 2008/0232061 A1 | 9/2008 | Wang et al. |
| 2008/0233326 A1 | 9/2008 | Hegemier et al. |
| 2008/0238884 A1 | 10/2008 | Harish |
| 2008/0253822 A1 | 10/2008 | Matias |
| 2008/0258679 A1 | 10/2008 | Manico et al. |
| 2008/0297878 A1 | 12/2008 | Brown et al. |
| 2008/0303479 A1 | 12/2008 | Park et al. |
| 2008/0307242 A1 | 12/2008 | Qu |
| 2008/0309636 A1 | 12/2008 | Feng et al. |
| 2008/0316002 A1 | 12/2008 | Brunet et al. |
| 2008/0316183 A1 | 12/2008 | Westerman et al. |
| 2008/0316768 A1 | 12/2008 | Travis |
| 2008/0320190 A1 | 12/2008 | Lydon et al. |
| 2009/0007001 A1 | 1/2009 | Morin et al. |
| 2009/0009476 A1 | 1/2009 | Daley, III |
| 2009/0033623 A1 | 2/2009 | Lin |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0083562 A1 | 3/2009 | Park et al. |
| 2009/0089600 A1 | 4/2009 | Nousiainen |
| 2009/0096738 A1 | 4/2009 | Chen et al. |
| 2009/0096756 A1 | 4/2009 | Lube |
| 2009/0102419 A1 | 4/2009 | Gwon et al. |
| 2009/0102805 A1 | 4/2009 | Meijer et al. |
| 2009/0127005 A1 | 5/2009 | Zachut et al. |
| 2009/0131134 A1 | 5/2009 | Baerlocher et al. |
| 2009/0134838 A1 | 5/2009 | Raghuprasad |
| 2009/0140985 A1 | 6/2009 | Liu |
| 2009/0142020 A1 | 6/2009 | Van Ostrand et al. |
| 2009/0146992 A1 | 6/2009 | Fukunaga et al. |
| 2009/0147102 A1 | 6/2009 | Kakinuma et al. |
| 2009/0158221 A1 | 6/2009 | Nielsen et al. |
| 2009/0160944 A1 | 6/2009 | Trevelyan et al. |
| 2009/0161385 A1 | 6/2009 | Parker et al. |
| 2009/0163147 A1 | 6/2009 | Steigerwald et al. |
| 2009/0167728 A1 | 7/2009 | Geaghan et al. |
| 2009/0167930 A1 | 7/2009 | Safaee-Rad et al. |
| 2009/0174687 A1 | 7/2009 | Ciesla et al. |
| 2009/0174759 A1 | 7/2009 | Yeh et al. |
| 2009/0189873 A1 | 7/2009 | Peterson |
| 2009/0189974 A1 | 7/2009 | Deering |
| 2009/0195497 A1 | 8/2009 | Fitzgerald et al. |
| 2009/0195518 A1 | 8/2009 | Mattice et al. |
| 2009/0200384 A1 | 8/2009 | Masalkar |
| 2009/0207144 A1 | 8/2009 | Bridger |
| 2009/0231275 A1 | 9/2009 | Odgers |
| 2009/0231465 A1 | 9/2009 | Senba |
| 2009/0239586 A1 | 9/2009 | Boeve et al. |
| 2009/0244832 A1 | 10/2009 | Behar et al. |
| 2009/0244872 A1 | 10/2009 | Yan |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0284613 A1 | 11/2009 | Kim |
| 2009/0285491 A1 | 11/2009 | Ravenscroft et al. |
| 2009/0296331 A1 | 12/2009 | Choy |
| 2009/0303137 A1 | 12/2009 | Kusaka et al. |
| 2009/0303204 A1 | 12/2009 | Nasiri et al. |
| 2009/0315830 A1 | 12/2009 | Westerman |
| 2009/0316072 A1 | 12/2009 | Okumura et al. |
| 2009/0320244 A1 | 12/2009 | Lin |
| 2009/0321490 A1 | 12/2009 | Groene et al. |
| 2009/0322278 A1 | 12/2009 | Franks et al. |
| 2010/0001963 A1 | 1/2010 | Doray et al. |
| 2010/0013319 A1 | 1/2010 | Kamiyama et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045540 A1 | 2/2010 | Lai et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0053771 A1 | 3/2010 | Travis et al. |
| 2010/0054435 A1 | 3/2010 | Louch et al. |
| 2010/0056130 A1 | 3/2010 | Louch et al. |
| 2010/0072351 A1 | 3/2010 | Mahowald |
| 2010/0073329 A1 | 3/2010 | Raman et al. |
| 2010/0077237 A1 | 3/2010 | Sawyers |
| 2010/0079379 A1 | 4/2010 | Demuynck et al. |
| 2010/0081377 A1 | 4/2010 | Chatterjee et al. |
| 2010/0083108 A1 | 4/2010 | Rider et al. |
| 2010/0085321 A1 | 4/2010 | Pundsack |
| 2010/0102182 A1 | 4/2010 | Lin |
| 2010/0102206 A1 | 4/2010 | Cazaux et al. |
| 2010/0103112 A1 | 4/2010 | Yoo et al. |
| 2010/0103332 A1 | 4/2010 | Li et al. |
| 2010/0105443 A1 | 4/2010 | Vaisanen |
| 2010/0106983 A1 | 4/2010 | Kasprzak et al. |
| 2010/0115309 A1 | 5/2010 | Carvalho et al. |
| 2010/0117993 A1 | 5/2010 | Kent |
| 2010/0123686 A1 | 5/2010 | Klinghult et al. |
| 2010/0133398 A1 | 6/2010 | Chiu et al. |
| 2010/0135036 A1 | 6/2010 | Matsuba et al. |
| 2010/0142130 A1 | 6/2010 | Wang et al. |
| 2010/0148995 A1 | 6/2010 | Elias |
| 2010/0148999 A1 | 6/2010 | Casparian et al. |
| 2010/0149073 A1 | 6/2010 | Chaum et al. |
| 2010/0149104 A1 | 6/2010 | Sim et al. |
| 2010/0149111 A1 | 6/2010 | Olien |
| 2010/0149117 A1 | 6/2010 | Chien et al. |
| 2010/0149134 A1 | 6/2010 | Westerman et al. |
| 2010/0149377 A1 | 6/2010 | Shintani et al. |
| 2010/0154171 A1 | 6/2010 | Lombardi et al. |

(56) References Cited

U.S. PATENT DOCUMENTS

| | | |
|---|---|---|
| 2010/0156798 A1 | 6/2010 | Archer |
| 2010/0156913 A1 | 6/2010 | Ortega et al. |
| 2010/0157085 A1 | 6/2010 | Sasaki |
| 2010/0161522 A1 | 6/2010 | Tirpak et al. |
| 2010/0164857 A1 | 7/2010 | Liu et al. |
| 2010/0164897 A1 | 7/2010 | Morin et al. |
| 2010/0171891 A1 | 7/2010 | Kaji et al. |
| 2010/0174421 A1 | 7/2010 | Tsai et al. |
| 2010/0177388 A1 | 7/2010 | Cohen et al. |
| 2010/0180063 A1 | 7/2010 | Ananny et al. |
| 2010/0188299 A1 | 7/2010 | Rinehart et al. |
| 2010/0188338 A1 | 7/2010 | Longe |
| 2010/0205472 A1 | 8/2010 | Tupman et al. |
| 2010/0206614 A1 | 8/2010 | Park et al. |
| 2010/0206644 A1 | 8/2010 | Yeh |
| 2010/0214214 A1 | 8/2010 | Corson et al. |
| 2010/0214257 A1 | 8/2010 | Wussler et al. |
| 2010/0222110 A1 | 9/2010 | Kim et al. |
| 2010/0231498 A1 | 9/2010 | Large et al. |
| 2010/0231510 A1 | 9/2010 | Sampsell et al. |
| 2010/0231522 A1 | 9/2010 | Li |
| 2010/0231556 A1 | 9/2010 | Mines et al. |
| 2010/0235546 A1 | 9/2010 | Terlizzi et al. |
| 2010/0237970 A1 | 9/2010 | Liu |
| 2010/0238075 A1 | 9/2010 | Pourseyed |
| 2010/0238138 A1 | 9/2010 | Goertz et al. |
| 2010/0238320 A1 | 9/2010 | Washisu |
| 2010/0238620 A1 | 9/2010 | Fish |
| 2010/0245221 A1 | 9/2010 | Khan |
| 2010/0245289 A1 | 9/2010 | Svajda |
| 2010/0250988 A1 | 9/2010 | Okuda et al. |
| 2010/0259482 A1 | 10/2010 | Ball |
| 2010/0259876 A1 | 10/2010 | Kim |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0282953 A1 | 11/2010 | Tam |
| 2010/0289457 A1 | 11/2010 | Onnerud et al. |
| 2010/0291331 A1 | 11/2010 | Schaefer |
| 2010/0295812 A1 | 11/2010 | Burns et al. |
| 2010/0296163 A1 | 11/2010 | Saarikko |
| 2010/0299642 A1 | 11/2010 | Merrell et al. |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1 | 12/2010 | Wang et al. |
| 2010/0313680 A1 | 12/2010 | Joung et al. |
| 2010/0315348 A1 | 12/2010 | Jellicoe et al. |
| 2010/0315373 A1 | 12/2010 | Steinhauser et al. |
| 2010/0315774 A1 | 12/2010 | Walker et al. |
| 2010/0321339 A1 | 12/2010 | Kimmel |
| 2010/0321877 A1 | 12/2010 | Moser |
| 2010/0324457 A1 | 12/2010 | Bean et al. |
| 2010/0325155 A1 | 12/2010 | Skinner et al. |
| 2010/0331059 A1 | 12/2010 | Apgar et al. |
| 2011/0002577 A1 | 1/2011 | Van Ostrand |
| 2011/0007047 A1 | 1/2011 | Fujioka et al. |
| 2011/0012866 A1 | 1/2011 | Keam |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0032127 A1 | 2/2011 | Roush |
| 2011/0032215 A1 | 2/2011 | Sirotich et al. |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0044582 A1 | 2/2011 | Travis et al. |
| 2011/0050576 A1 | 3/2011 | Forutanpour et al. |
| 2011/0050626 A1 | 3/2011 | Porter et al. |
| 2011/0050946 A1 | 3/2011 | Lee et al. |
| 2011/0055407 A1 | 3/2011 | Lydon et al. |
| 2011/0057724 A1 | 3/2011 | Pabon |
| 2011/0060926 A1 | 3/2011 | Brooks et al. |
| 2011/0069148 A1 | 3/2011 | Jones et al. |
| 2011/0072391 A1 | 3/2011 | Hanggie et al. |
| 2011/0074688 A1 | 3/2011 | Hull et al. |
| 2011/0081946 A1 | 4/2011 | Singh et al. |
| 2011/0096035 A1 | 4/2011 | Shen |
| 2011/0102326 A1 | 5/2011 | Casparian et al. |
| 2011/0102356 A1 | 5/2011 | Kemppinen et al. |
| 2011/0102752 A1 | 5/2011 | Chen et al. |
| 2011/0107958 A1 | 5/2011 | Pance et al. |
| 2011/0113368 A1 | 5/2011 | Carvajal et al. |
| 2011/0115738 A1 | 5/2011 | Suzuki et al. |
| 2011/0115747 A1 | 5/2011 | Powell et al. |
| 2011/0117970 A1 | 5/2011 | Choi |
| 2011/0118025 A1 | 5/2011 | Lukas et al. |
| 2011/0122071 A1 | 5/2011 | Powell |
| 2011/0134032 A1 | 6/2011 | Chiu et al. |
| 2011/0134043 A1 | 6/2011 | Chen |
| 2011/0134112 A1 | 6/2011 | Koh et al. |
| 2011/0157046 A1 | 6/2011 | Lee et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0169762 A1 | 7/2011 | Weiss |
| 2011/0169778 A1 | 7/2011 | Nungester et al. |
| 2011/0170289 A1 | 7/2011 | Allen et al. |
| 2011/0176035 A1 | 7/2011 | Poulsen |
| 2011/0179864 A1 | 7/2011 | Raasch et al. |
| 2011/0181754 A1 | 7/2011 | Iwasaki |
| 2011/0183120 A1 | 7/2011 | Sharygin et al. |
| 2011/0184646 A1 | 7/2011 | Wong et al. |
| 2011/0184824 A1 | 7/2011 | George et al. |
| 2011/0188199 A1 | 8/2011 | Pan |
| 2011/0191480 A1 | 8/2011 | Kobayashi |
| 2011/0193787 A1 | 8/2011 | Morishige et al. |
| 2011/0193938 A1 | 8/2011 | Oderwald et al. |
| 2011/0197156 A1 | 8/2011 | Strait et al. |
| 2011/0199389 A1 | 8/2011 | Lu et al. |
| 2011/0202878 A1 | 8/2011 | Park et al. |
| 2011/0205372 A1 | 8/2011 | Miramontes |
| 2011/0216266 A1 | 9/2011 | Travis |
| 2011/0221659 A1 | 9/2011 | King et al. |
| 2011/0221678 A1 | 9/2011 | Davydov |
| 2011/0227913 A1 | 9/2011 | Hyndman |
| 2011/0228462 A1 | 9/2011 | Dang |
| 2011/0231682 A1 | 9/2011 | Kakish et al. |
| 2011/0234502 A1 | 9/2011 | Yun et al. |
| 2011/0234535 A1 | 9/2011 | Hung et al. |
| 2011/0234881 A1 | 9/2011 | Wakabayashi et al. |
| 2011/0235179 A1 | 9/2011 | Simmonds |
| 2011/0242138 A1 | 10/2011 | Tribble |
| 2011/0242298 A1 | 10/2011 | Bathiche et al. |
| 2011/0242440 A1 | 10/2011 | Noma et al. |
| 2011/0242670 A1 | 10/2011 | Simmonds |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0261083 A1 | 10/2011 | Wilson |
| 2011/0265287 A1 | 11/2011 | Li et al. |
| 2011/0266672 A1 | 11/2011 | Sylvester |
| 2011/0267272 A1 | 11/2011 | Meyer et al. |
| 2011/0273475 A1 | 11/2011 | Herz et al. |
| 2011/0290686 A1 | 12/2011 | Huang |
| 2011/0291993 A1 | 12/2011 | Miyazaki |
| 2011/0295697 A1 | 12/2011 | Boston et al. |
| 2011/0297566 A1 | 12/2011 | Gallagher et al. |
| 2011/0298919 A1 | 12/2011 | Maglaque |
| 2011/0302518 A1 | 12/2011 | Zhang |
| 2011/0304577 A1 | 12/2011 | Brown |
| 2011/0304815 A1 | 12/2011 | Newell |
| 2011/0305875 A1 | 12/2011 | Sanford et al. |
| 2011/0306424 A1 | 12/2011 | Kazama et al. |
| 2011/0316807 A1 | 12/2011 | Corrion |
| 2011/0320204 A1 | 12/2011 | Locker et al. |

(56) References Cited

U.S. PATENT DOCUMENTS

| | | |
|---|---|---|
| 2012/0002052 A1 | 1/2012 | Muramatsu et al. |
| 2012/0002820 A1 | 1/2012 | Leichter |
| 2012/0007821 A1 | 1/2012 | Zaliva |
| 2012/0008015 A1 | 1/2012 | Manabe |
| 2012/0011462 A1 | 1/2012 | Westerman et al. |
| 2012/0013519 A1 | 1/2012 | Hakansson et al. |
| 2012/0019165 A1 | 1/2012 | Igaki et al. |
| 2012/0019686 A1 | 1/2012 | Manabe |
| 2012/0020112 A1 | 1/2012 | Fisher et al. |
| 2012/0020490 A1 | 1/2012 | Leichter |
| 2012/0020556 A1 | 1/2012 | Manabe |
| 2012/0021618 A1 | 1/2012 | Schultz |
| 2012/0023401 A1 | 1/2012 | Arscott et al. |
| 2012/0023459 A1 | 1/2012 | Westerman |
| 2012/0024682 A1 | 2/2012 | Huang et al. |
| 2012/0026048 A1 | 2/2012 | Vazquez et al. |
| 2012/0026096 A1 | 2/2012 | Ku |
| 2012/0032887 A1 | 2/2012 | Chiu et al. |
| 2012/0032891 A1 | 2/2012 | Parivar |
| 2012/0032901 A1 | 2/2012 | Kwon |
| 2012/0033369 A1 | 2/2012 | Wu et al. |
| 2012/0038495 A1 | 2/2012 | Ishikawa |
| 2012/0044179 A1 | 2/2012 | Hudson |
| 2012/0044379 A1 | 2/2012 | Manabe |
| 2012/0047368 A1 | 2/2012 | Chinn et al. |
| 2012/0050975 A1 | 3/2012 | Garelli et al. |
| 2012/0062564 A1 | 3/2012 | Miyashita |
| 2012/0062850 A1 | 3/2012 | Travis |
| 2012/0068919 A1 | 3/2012 | Lauder et al. |
| 2012/0069540 A1 | 3/2012 | Lauder et al. |
| 2012/0071008 A1 | 3/2012 | Sessford |
| 2012/0075249 A1 | 3/2012 | Hoch |
| 2012/0077384 A1 | 3/2012 | Bar-Niv et al. |
| 2012/0081316 A1 | 4/2012 | Sirpal et al. |
| 2012/0087078 A1 | 4/2012 | Medica et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0102438 A1 | 4/2012 | Robinson et al. |
| 2012/0103778 A1 | 5/2012 | Obata et al. |
| 2012/0106082 A1 | 5/2012 | Wu et al. |
| 2012/0113137 A1 | 5/2012 | Nomoto |
| 2012/0113223 A1 | 5/2012 | Hilliges et al. |
| 2012/0113579 A1 | 5/2012 | Agata et al. |
| 2012/0115553 A1 | 5/2012 | Mahe et al. |
| 2012/0117409 A1 | 5/2012 | Lee et al. |
| 2012/0127118 A1 | 5/2012 | Nolting et al. |
| 2012/0127126 A1 | 5/2012 | Mattice et al. |
| 2012/0133561 A1 | 5/2012 | Konanur et al. |
| 2012/0133797 A1 | 5/2012 | Sato et al. |
| 2012/0139727 A1 | 6/2012 | Houvener et al. |
| 2012/0140396 A1 | 6/2012 | Zeliff et al. |
| 2012/0145525 A1 | 6/2012 | Ishikawa |
| 2012/0161406 A1 | 6/2012 | Mersky |
| 2012/0162126 A1 | 6/2012 | Yuan et al. |
| 2012/0162693 A1 | 6/2012 | Ito |
| 2012/0170284 A1 | 7/2012 | Shedletsky |
| 2012/0175487 A1 | 7/2012 | Goto |
| 2012/0182242 A1 | 7/2012 | Lindahl et al. |
| 2012/0182249 A1 | 7/2012 | Endo et al. |
| 2012/0182743 A1 | 7/2012 | Chou |
| 2012/0194393 A1 | 8/2012 | Uttermann et al. |
| 2012/0194448 A1 | 8/2012 | Rothkopf |
| 2012/0200532 A1 | 8/2012 | Powell et al. |
| 2012/0200802 A1 | 8/2012 | Large |
| 2012/0206937 A1 | 8/2012 | Travis et al. |
| 2012/0212438 A1 | 8/2012 | Vaisanen |
| 2012/0218194 A1 | 8/2012 | Silverman |
| 2012/0221877 A1 | 8/2012 | Prabu |
| 2012/0223866 A1 | 9/2012 | Ayala et al. |
| 2012/0224073 A1 | 9/2012 | Miyahara |
| 2012/0227259 A1 | 9/2012 | Badaye et al. |
| 2012/0229634 A1 | 9/2012 | Laett et al. |
| 2012/0235635 A1 | 9/2012 | Sato |
| 2012/0242584 A1 | 9/2012 | Tuli |
| 2012/0243165 A1 | 9/2012 | Chang et al. |
| 2012/0246377 A1 | 9/2012 | Bhesania |
| 2012/0249443 A1 | 10/2012 | Anderson et al. |
| 2012/0250873 A1 | 10/2012 | Bakalos et al. |
| 2012/0256959 A1 | 10/2012 | Ye et al. |
| 2012/0260177 A1 | 10/2012 | Sehrer |
| 2012/0274811 A1 | 11/2012 | Bakin |
| 2012/0298491 A1 | 11/2012 | Ozias et al. |
| 2012/0299872 A1 | 11/2012 | Nishikawa et al. |
| 2012/0300275 A1 | 11/2012 | Vilardell et al. |
| 2012/0312955 A1 | 12/2012 | Randolph |
| 2012/0326003 A1 | 12/2012 | Solow et al. |
| 2013/0009413 A1 | 1/2013 | Chiu et al. |
| 2013/0015311 A1 | 1/2013 | Kim |
| 2013/0016468 A1 | 1/2013 | Oh |
| 2013/0017696 A1 | 1/2013 | Alvarez Rivera |
| 2013/0021289 A1 | 1/2013 | Chen et al. |
| 2013/0027354 A1 | 1/2013 | Yabuta et al. |
| 2013/0027867 A1 | 1/2013 | Lauder et al. |
| 2013/0031353 A1 | 1/2013 | Noro |
| 2013/0038541 A1 | 2/2013 | Bakker |
| 2013/0044059 A1 | 2/2013 | Fu |
| 2013/0044074 A1 | 2/2013 | Park et al. |
| 2013/0046397 A1 | 2/2013 | Fadell et al. |
| 2013/0063873 A1 | 3/2013 | Wodrich et al. |
| 2013/0067126 A1 | 3/2013 | Casparian et al. |
| 2013/0073877 A1 | 3/2013 | Radke |
| 2013/0076617 A1 | 3/2013 | Csaszar et al. |
| 2013/0076635 A1 | 3/2013 | Lin |
| 2013/0082824 A1 | 4/2013 | Colley |
| 2013/0083466 A1 | 4/2013 | Becze et al. |
| 2013/0088431 A1 | 4/2013 | Ballagas et al. |
| 2013/0100082 A1 | 4/2013 | Bakin et al. |
| 2013/0106766 A1 | 5/2013 | Yilmaz et al. |
| 2013/0106813 A1 | 5/2013 | Hotelling et al. |
| 2013/0107144 A1 | 5/2013 | Marhefka et al. |
| 2013/0120466 A1 | 5/2013 | Chen et al. |
| 2013/0120760 A1 | 5/2013 | Raguin et al. |
| 2013/0128102 A1 | 5/2013 | Yano |
| 2013/0135214 A1 | 5/2013 | Li et al. |
| 2013/0159749 A1 | 6/2013 | Moeglein et al. |
| 2013/0162554 A1 | 6/2013 | Lauder et al. |
| 2013/0172906 A1 | 7/2013 | Olson et al. |
| 2013/0191741 A1 | 7/2013 | Dickinson et al. |
| 2013/0201094 A1 | 8/2013 | Travis |
| 2013/0207937 A1 | 8/2013 | Lutian et al. |
| 2013/0212483 A1 | 8/2013 | Brakensiek et al. |
| 2013/0217451 A1 | 8/2013 | Komiyama et al. |
| 2013/0222275 A1 | 8/2013 | Byrd et al. |
| 2013/0222353 A1 | 8/2013 | Large |
| 2013/0222681 A1 | 8/2013 | Wan |
| 2013/0226794 A1 | 8/2013 | Englebardt |
| 2013/0227836 A1 | 9/2013 | Whitt, III |
| 2013/0228023 A1 | 9/2013 | Drasnin |
| 2013/0228433 A1 | 9/2013 | Shaw |
| 2013/0228434 A1 | 9/2013 | Whitt, III |
| 2013/0228435 A1 | 9/2013 | Whitt, III |
| 2013/0228439 A1 | 9/2013 | Whitt, III |
| 2013/0229100 A1 | 9/2013 | Siddiqui |
| 2013/0229335 A1 | 9/2013 | Whitman |
| 2013/0229347 A1 | 9/2013 | Lutz, III |
| 2013/0229350 A1 | 9/2013 | Shaw et al. |
| 2013/0229351 A1 | 9/2013 | Whitt, III |
| 2013/0229354 A1 | 9/2013 | Whitt, III et al. |
| 2013/0229356 A1 | 9/2013 | Marwah |
| 2013/0229357 A1 | 9/2013 | Powell |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229568 A1 | 9/2013 | Belesiu |
| 2013/0229570 A1 | 9/2013 | Beck et al. |
| 2013/0229756 A1 | 9/2013 | Whitt, III |
| 2013/0229757 A1 | 9/2013 | Whitt, III et al. |
| 2013/0229758 A1 | 9/2013 | Belesiu |
| 2013/0229759 A1 | 9/2013 | Whitt, III |
| 2013/0229760 A1 | 9/2013 | Whitt, III |
| 2013/0229761 A1 | 9/2013 | Shaw |

(56) References Cited

U.S. PATENT DOCUMENTS

| | | |
|---|---|---|
| 2013/0229762 A1 | 9/2013 | Whitt, III |
| 2013/0229773 A1 | 9/2013 | Siddiqui et al. |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0241860 A1 | 9/2013 | Ciesla et al. |
| 2013/0242495 A1 | 9/2013 | Bathiche et al. |
| 2013/0262886 A1 | 10/2013 | Nishimura |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0304944 A1 | 11/2013 | Young |
| 2013/0321992 A1 | 12/2013 | Liu et al. |
| 2013/0322000 A1 | 12/2013 | Whitt |
| 2013/0322001 A1 | 12/2013 | Whitt |
| 2013/0328761 A1 | 12/2013 | Boulanger |
| 2013/0329301 A1 | 12/2013 | Travis |
| 2013/0329360 A1 | 12/2013 | Aldana |
| 2013/0332628 A1 | 12/2013 | Panay |
| 2013/0335330 A1 | 12/2013 | Lane |
| 2013/0335387 A1 | 12/2013 | Emerton |
| 2013/0335902 A1 | 12/2013 | Campbell |
| 2013/0335903 A1 | 12/2013 | Raken |
| 2013/0339757 A1 | 12/2013 | Reddy |
| 2013/0342465 A1 | 12/2013 | Bathiche |
| 2013/0342976 A1 | 12/2013 | Chung |
| 2013/0346636 A1 | 12/2013 | Bathiche |
| 2014/0012401 A1 | 1/2014 | Perek |
| 2014/0022629 A1 | 1/2014 | Powell |
| 2014/0043275 A1 | 2/2014 | Whitman |
| 2014/0048399 A1 | 2/2014 | Whitt, III |
| 2014/0049894 A1 | 2/2014 | Rihn |
| 2014/0055624 A1 | 2/2014 | Gaines |
| 2014/0085814 A1 | 3/2014 | Kielland |
| 2014/0119802 A1 | 5/2014 | Shaw |
| 2014/0132550 A1 | 5/2014 | McCracken et al. |
| 2014/0167585 A1 | 6/2014 | Kuan et al. |
| 2014/0185215 A1 | 7/2014 | Whitt |
| 2014/0185220 A1 | 7/2014 | Whitt |
| 2014/0204514 A1 | 7/2014 | Whitt |
| 2014/0247546 A1 | 9/2014 | Whitt |
| 2014/0291134 A1 | 10/2014 | Whitt |
| 2014/0293534 A1 | 10/2014 | Siddiqui |
| 2014/0362506 A1 | 12/2014 | Whitt, III et al. |
| 2014/0372914 A1 | 12/2014 | Byrd et al. |
| 2014/0374230 A1 | 12/2014 | Shaw et al. |
| 2014/0379942 A1 | 12/2014 | Perek et al. |
| 2015/0005953 A1 | 1/2015 | Fadell et al. |
| 2015/0036274 A1 | 2/2015 | Belesiu et al. |
| 2015/0227212 A1 | 8/2015 | Whitt, III et al. |
| 2015/0234478 A1 | 8/2015 | Belesiu et al. |

FOREIGN PATENT DOCUMENTS

| | | |
|---|---|---|
| CN | 1352767 | 6/2002 |
| CN | 1440513 | 9/2003 |
| CN | 1537223 | 10/2004 |
| CN | 101452334 | 6/2009 |
| CN | 101675406 | 3/2010 |
| CN | 101681189 | 3/2010 |
| CN | 102147643 | 8/2011 |
| CN | 202441167 | 9/2012 |
| CN | 103455097 | 12/2013 |
| CN | 103455149 | 12/2013 |
| EP | 645726 | 3/1995 |
| EP | 1003188 | 5/2000 |
| EP | 1223722 | 7/2002 |
| EP | 1425763 | 6/2004 |
| EP | 1480029 | 11/2004 |
| EP | 1591891 | 11/2005 |
| EP | 2026178 | 2/2009 |
| EP | 2353978 | 8/2011 |
| EP | 2378607 | 10/2011 |
| EP | 2381290 | 10/2011 |
| GB | 2123213 | 1/1984 |
| GB | 2178570 | 2/1987 |
| JP | 52107722 | 9/1977 |
| JP | 56108127 | 8/1981 |
| JP | H104540 | 1/1998 |
| JP | H10234057 | 9/1998 |
| JP | 10301055 | 11/1998 |
| JP | 10326124 | 12/1998 |
| JP | 1173239 | 3/1999 |
| JP | 11338575 | 12/1999 |
| JP | 2000010654 | 1/2000 |
| JP | 2000106021 | 4/2000 |
| JP | 2001142564 | 5/2001 |
| JP | 2001174746 | 6/2001 |
| JP | 2002162912 | 6/2002 |
| JP | 2002300438 | 10/2002 |
| JP | 2004038950 | 2/2004 |
| JP | 3602207 | 12/2004 |
| JP | 2005331565 | 12/2005 |
| JP | 2006160155 | 6/2006 |
| JP | 2006163459 | 6/2006 |
| JP | 2006294361 | 10/2006 |
| JP | 2009122551 | 6/2009 |
| JP | 2010244514 | 10/2010 |
| KR | 20010039013 | 5/2001 |
| KR | 20010107055 | 12/2001 |
| KR | 20040066647 | 7/2004 |
| KR | 20050014299 | 2/2005 |
| KR | 20060003093 | 1/2006 |
| KR | 20080006404 | 1/2008 |
| KR | 20080009490 | 1/2008 |
| KR | 20080055051 | 6/2008 |
| KR | 20090029411 | 3/2009 |
| KR | 20100022059 | 2/2010 |
| KR | 20100067366 | 6/2010 |
| KR | 20100115675 | 10/2010 |
| KR | 20110064265 | 6/2011 |
| KR | 1020110087178 | 8/2011 |
| KR | 20110109791 | 10/2011 |
| KR | 20110120002 | 11/2011 |
| KR | 20110122333 | 11/2011 |
| KR | 101113530 | 2/2012 |
| NL | 1038411 | 5/2012 |
| WO | WO-9108915 | 6/1991 |
| WO | WO-9919995 | 4/1999 |
| WO | WO-9964784 | 12/1999 |
| WO | WO-0079327 | 12/2000 |
| WO | WO-0128309 | 4/2001 |
| WO | WO-03106134 | 12/2003 |
| WO | WO-2005027696 | 3/2005 |
| WO | WO-2005059874 | 6/2005 |
| WO | WO-2006044818 | 4/2006 |
| WO | WO-2007112172 | 10/2007 |
| WO | WO-2008055039 | 5/2008 |
| WO | WO-2009034484 | 3/2009 |
| WO | WO-2010011983 | 1/2010 |
| WO | WO-2010105272 | 9/2010 |
| WO | WO-2010147609 | 12/2010 |
| WO | WO-2011016200 | 2/2011 |
| WO | WO-2011049609 | 4/2011 |
| WO | WO-2013012699 | 1/2013 |
| WO | WO-2013033067 | 3/2013 |
| WO | WO-2014084872 | 6/2014 |
| WO | WO-2014209818 | 12/2014 |

OTHER PUBLICATIONS

"ACPI Docking for Windows Operating Systems", Retrieved from: <http://www.scritube.com/limba/engleza/software/ACPI-Docking-for-Windows-Opera331824193.php> on Jul. 6, 2012, 10 pages.

(56) References Cited

OTHER PUBLICATIONS

"Advanced Configuration and Power Management Specification", Intel Corporation, Microsoft Corporation, Toshiba Corp. Revision 1, Dec. 22, 1996, 364 pages.
"Advisory Action", U.S. Appl. No. 13/939,032, Feb. 24, 2014, 2 pages.
"Advisory Action", U.S. Appl. No. 14/199,924, May 28, 2014, 2 pages.
"Apple®—45W MagSafe 2 Power Adapter with Magnetic DC Connector-", Retrieved from <http://www.bestbuy.com/site/Apple%26%23174%3B---45W-MagSafe-2-Power-Adapter-with-Magnetic-DC-Connector/5856526.p?id=1218696408860&skuId=5856526#tab=overview> on May 14, 2013, 4 Pages.
"Basic Cam Motion Curves", Retrieved From: <http://ocw.metu.edu.tr/pluginfile.php/6886/mod_resource/content/1/ch8/8-3.htm> Nov. 22, 2013, Middle East Technical University,1999, 14 Pages.
"Cholesteric Liquid Crystal", Retrieved from: <http://en.wikipedia.org/wiki/Cholesteric_liquid_crystal> on Aug. 6, 2012, Jun. 10, 2012, 2 pages.
"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, Jan. 2013, 1 page.
"Corrected Notice of Allowance", U.S. Appl. No. 13/470,633, Apr. 9, 2013, 2 pages.
"Corrected Notice of Allowance", U.S. Appl. No. 13/470,633, Jul. 2, 2013, 2 pages.
"Corrected Notice of Allowance", U.S. Appl. No. 13/563,435, Jan. 14, 2014, 2 pages.
"Corrected Notice of Allowance", U.S. Appl. No. 13/563,435, Mar. 20, 2014, 2 pages.
"Corrected Notice of Allowance", U.S. Appl. No. 13/563,435, Jan. 22, 2014, 2 pages.
"Corrected Notice of Allowance", U.S. Appl. No. 13/565,124, Apr. 3, 2014, 4 pages.
"Corrected Notice of Allowance", U.S. Appl. No. 13/565,124, Mar. 10, 2014, 2 pages.
"Corrected Notice of Allowance", U.S. Appl. No. 13/565,124, Apr. 14, 2014, 2 pages.
"Corrected Notice of Allowance", U.S. Appl. No. 13/651,327, Sep. 12, 2013, 2 pages.
"Corrected Notice of Allowance", U.S. Appl. No. 13/651,327, Sep. 23, 2013, 2 pages.
"Corrected Notice of Allowance", U.S. Appl. No. 13/651,726, Sep. 17, 2013, 2 pages.
"Corrected Notice of Allowance", U.S. Appl. No. 13/656,520, Jan. 16, 2014, 3 pages.
"Corrected Notice of Allowance", U.S. Appl. No. 13/938,930, May 6, 2014, 2 pages.
"Corrected Notice of Allowance", U.S. Appl. No. 13/939,002, May 22, 2014, 2 pages.
"Corrected Notice of Allowance", U.S. Appl. No. 13/939,002, May 5, 2014, 2 pages.
"Developing Next-Generation Human Interfaces using Capacitive and Infrared Proximity Sensing", Silicon Laboratories, Inc., Available at <http://www.silabs.com/pages/DownloadDoc.aspx?FILEURL=support%20documents/technicaldocs/capacitive%20and%20proximity%20sensing_wp.pdf&src=SearchResults>,Aug. 30, 2010, pp. 1-10.
"Directional Backlighting for Display Panels", U.S. Appl. No. 13/021,448, Feb. 4, 2011, 38 pages.
"DR2PA", retrieved from <http://www.architainment.co.uk/wp-content/uploads/2012/08/DR2PA-AU-US-size-Data-Sheet-Rev-H_LOGO.pdf> on Sep. 17, 2012, Jan. 2012, 4 pages.
"Edwards 1508 Series Surface Wall Mount Electromagnetic Door Holder", Edwards Signaling, retrieved from <http://www.thesignalsource.com/documents/1508.pdf>, 2000, 1 page.
"Final Office Action", U.S. Appl. No. 12/163,614, Nov. 8, 2012, 15 pages.
"Final Office Action", U.S. Appl. No. 12/163,614, Aug. 19, 2011, 15 pages.
"Final Office Action", U.S. Appl. No. 13/021,448, Jan. 16, 2014, 33 Pages.
"Final Office Action", U.S. Appl. No. 13/471,001, Jul. 25, 2013, 20 pages.
"Final Office Action", U.S. Appl. No. 13/471,139, Sep. 16, 2013, 13 pages.
"Final Office Action", U.S. Appl. No. 13/471,336, Aug. 28, 2013, 18 pages.
"Final Office Action", U.S. Appl. No. 13/564,520, Jan. 15, 2014, 7 pages.
"Final Office Action", U.S. Appl. No. 13/651,195, Apr. 18, 2013, 13 pages.
"Final Office Action", U.S. Appl. No. 13/651,232, May 21, 2013, 21 pages.
"Final Office Action", U.S. Appl. No. 13/651,287, May 3, 2013, 16 pages.
"Final Office Action", U.S. Appl. No. 13/651,976, Jul. 25, 2013, 21 pages.
"Final Office Action", U.S. Appl. No. 13/653,321, Aug. 2, 2013, 17 pages.
"Final Office Action", U.S. Appl. No. 13/653,682, Oct. 18, 2013, 16 pages.
"Final Office Action", U.S. Appl. No. 13/656,055, Oct. 23, 2013, 14 pages.
"Final Office Action", U.S. Appl. No. 13/938,930, Nov. 8, 2013, 10 pages.
"Final Office Action", U.S. Appl. No. 13/939,002, Nov. 8, 2013, 7 pages.
"Final Office Action", U.S. Appl. No. 13/939,032, Dec. 20, 2013, 5 pages.
"Final Office Action", U.S. Appl. No. 14/063,912, Apr. 29, 2014, 10 pages.
"Final Office Action", U.S. Appl. No. 14/199,924, May 6, 2014, 5 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"First One Handed Fabric Keyboard with Bluetooth Wireless Technology", Retrieved from: <http://press.xtvworld.com/article3817.html> on May 8, 2012, Jan. 6, 2005, 2 pages.
"For Any Kind of Proceeding 2011 Springtime as Well as Coil Nailers as Well as Hotter Summer Season", Lady Shoe Worlds, retrieved from <http://www.ladyshoesworld.com/2011/09/18/for-any-kind-of-proceeding-2011-springtime-as-well-as-coil-nailers-as-well-as-hotter-summer-season/> on Nov. 3, 2011,Sep. 8, 2011, 2 pages.
"Force and Position Sensing Resistors: An Emerging Technology", Interlink Electronics, Available at <http://staff.science.uva.nl/~vlaander/docu/FSR/An_Exploring_Technology.pdf>,Feb. 1990, pp. 1-6.
"Foreign Office Action", CN Application No. 201110272868.3, Apr. 1, 2013, 10 pages.
"Foreign Office Action", CN Application No. 201320097066.8, Oct. 24, 2013, 5 Pages.
"Foreign Office Action", CN Application No. 201320328022.1, Feb. 17, 2014, 4 Pages.
"Foreign Office Action", CN Application No. 201320328022.1, Oct. 18, 2013, 3 Pages.
"Frogpad Introduces Weareable Fabric Keyboard with Bluetooth Technology", Retrieved from: <http://www.geekzone.co.nz/contentasp?contentid=3898> on May 7, 2012, Jan. 7, 2005, 3 pages.
"How to Use the iPad's Onscreen Keyboard", Retrieved from <http://www.dummies.com/how-to/content/how-to-use-the-ipads-onscreen-keyboard.html> on Aug. 28, 2012, 3 pages.
"iControlPad 2—The open source controller", Retrieved from <http://www.kickstarter.com/projects/1703567677/icontrolpad-2-the-open-source-controller> on Nov. 20, 2012, 15 pages.
"i-Interactor electronic pen", Retrieved from: <http://www.alibaba.com/product-gs/331004878/i_Interactor_electronic_pen.html> on Jun. 19, 2012, 5 pages.

(56) References Cited

OTHER PUBLICATIONS

"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.
"International Search Report and Written Opinion", Application No. PCT/US2013/028479, Jun. 17, 2013, 10 pages.
"International Search Report and Written Opinion", Application No. PCT/US2013/051421, Dec. 6, 2013, 10 pages.
"International Search Report and Written Opinion", Application No. PCT/US2013/065154, Feb. 5, 2014, 10 pages.
"International Search Report and Written Opinion", Application No. PCT/US2013/043961, Oct. 17, 2013, 11 pages.
"International Search Report and Written Opinion", Application No. PCT/US2013/053683, Nov. 28, 2013, 11 pages.
"International Search Report and Written Opinion", Application No. PCT/US2013/028948, Jun. 21, 2013, 11 pages.
"International Search Report and Written Opinion", Application No. PCT/US2013/029461, Jun. 21, 2013, 11 pages.
"International Search Report and Written Opinion", Application No. PCT/US2013/067912, Feb. 13, 2014, 12 pages.
"International Search Report and Written Opinion", Application No. PCT/US2013/044871, Aug. 14, 2013, 12 pages.
"International Search Report and Written Opinion", Application No. PCT/US2013/040968, Sep. 5, 2013, 12 pages.
"International Search Report and Written Opinion", Application No. PCT/US2013/042550, Sep. 24, 2013, 14 pages.
"International Search Report and Written Opinion", Application No. PCT/US2014/013928, May 12, 2014, 17 pages.
"International Search Report and Written Opinion", Application No. PCT/US2013/055679, Nov. 18, 2013, 8 pages.
"International Search Report and Written Opinion", Application No. PCT/US2011/050471, Apr. 9, 2012, 8 pages.
"International Search Report and Written Opinion", Application No. PCT/US2013/044873, Nov. 22, 2013, 9 pages.
"International Search Report and Written Opinion", Application No. PCT/US2013/063156, Dec. 5, 2013, 9 pages.
"International Search Report and Written Opinion", Application No. PCT/US2013/042790, Aug. 8, 2013, 9 pages.
"International Search Report and Written Opinion", Application No. PCT/US2013/045049, Sep. 16, 2013, 9 pages.
"International Search Report", Application No. PCT/US2010/045676, Apr. 28, 2011, 2 Pages.
"International Search Report", Application No. PCT/US2010/046129, Mar. 2, 2011, 3 Pages.
"Magnetic Cell Phone Holder", Extreme Computing, retrieved from <http://www.extremecomputing.com/magnetholder.html> on May 7, 2008, 1 page.
"Membrane Keyboards & Membrane Keypads", Retrieved from: <http://www.pannam.com/> on May 9, 2012, Mar. 4, 2009, 2 pages.
"Microsoft Develops Glasses-Free Eye-Tracking 3D Display", Tech-FAQ—retrieved from <http://www.tech-faq.com/microsoft-develops-glasses-free-eye-tracking-3d-display.html> on Nov. 2, 2011, Nov. 2, 2011, 3 pages.
"Microsoft Reveals Futuristic 3D Virtual HoloDesk Patent", Retrieved from <http://www.patentbolt.com/2012/05/microsoft-reveals-futuristic-3d-virtual-holodesk-patent.htmlt> on May 28, 2012, May 23, 2012, 9 pages.
"Molex:PCI Express Mini Card Connector, Right Angle, Low-Profile, Mid-Mount 0.80mm (.031") Pitch", Retrieved from <http://rhu004.sma-promail.com/SQLImages/kelmscott/Molex/PDF__Images/987650-4441.PDF> on Feb. 6, 2013, 2010, 3 pages.
"Motion Sensors", Android Developers—retrieved from <http://developer.android.com/guide/topics/sensors/sensors_motion.html> on May 25, 2012, 7 pages.
"MPC Fly Music Production Controller", AKAI Professional, Retrieved from: <http://www.akaiprompc.com/mpc-fly> on Jul. 9, 2012, 4 pages.
"NI Releases New Maschine & Maschine Mikro", Retrieved from <http://www.djbooth.net/index/dj-equipment/entry/ni-releases-new-maschine-mikro/> on Sep. 17, 2012, 19 pages.

"Non-Final Office Action", U.S. Appl. No. 13/409,967, Dec. 10, 2013, 5 pages.
"Non-Final Office Action", U.S. Appl. No. 13/599,635, Feb. 25, 2014, 13 pages.
"Non-Final Office Action", U.S. Appl. No. 12/163,614, Apr. 27, 2011, 15 pages.
"Non-Final Office Action", U.S. Appl. No. 12/163,614, May 24, 2012, 15 pages.
"Non-Final Office Action", U.S. Appl. No. 12/882,994, Feb. 1, 2013, 17 pages.
"Non-Final Office Action", U.S. Appl. No. 13/021,448, Dec. 13, 2012, 9 pages.
"Non-Final Office Action", U.S. Appl. No. 13/021,448, Aug. 16, 2013, 25 pages.
"Non-Final Office Action", U.S. Appl. No. 13/371,725, Nov. 7, 2013, 19 pages.
"Non-Final Office Action", U.S. Appl. No. 13/408,257, Dec. 5, 2013, 13 pages.
"Non-Final Office Action", U.S. Appl. No. 13/468,918, Dec. 26, 2013, 18 pages.
"Non-Final Office Action", U.S. Appl. No. 13/471,001, Feb. 19, 2013, 15 pages.
"Non-Final Office Action", U.S. Appl. No. 13/471,030, May 15, 2014, 10 pages.
"Non-Final Office Action", U.S. Appl. No. 13/471,139, Mar. 21, 2013, 12 pages.
"Non-Final Office Action", U.S. Appl. No. 13/471,186, Feb. 27, 2014, 8 pages.
"Non-Final Office Action", U.S. Appl. No. 13/471,202, Feb. 11, 2013, 10 pages.
"Non-Final Office Action", U.S. Appl. No. 13/471,237, Mar. 24, 2014, 7 pages.
"Non-Final Office Action", U.S. Appl. No. 13/471,336, Jan. 18, 2013, 14 pages.
"Non-Final Office Action", U.S. Appl. No. 13/471,336, May 7, 2014, 17 pages.
"Non-Final Office Action", U.S. Appl. No. 13/471,376, Apr. 2, 2014, 17 pages.
"Non-Final Office Action", U.S. Appl. No. 13/471,405, Feb. 20, 2014, 37 pages.
"Non-Final Office Action", U.S. Appl. No. 13/492,232, Apr. 30, 2014, 9 pages.
"Non-Final Office Action", U.S. Appl. No. 13/494,651, Feb. 4, 2014, 15 pages.
"Non-Final Office Action", U.S. Appl. No. 13/525,070, Jan. 17, 2014, 19 pages.
"Non-Final Office Action", U.S. Appl. No. 13/527,263, Apr. 3, 2014, 6 pages.
"Non-Final Office Action", U.S. Appl. No. 13/527,263, Jul. 19, 2013, 5 pages.
"Non-Final Office Action", U.S. Appl. No. 13/563,435, Jun. 14, 2013, 6 pages.
"Non-Final Office Action", U.S. Appl. No. 13/564,520, Feb. 14, 2014, 5 pages.
"Non-Final Office Action", U.S. Appl. No. 13/564,520, Jun. 19, 2013, 8 pages.
"Non-Final Office Action", U.S. Appl. No. 13/565,124, Jun. 17, 2013, 5 pages.
"Non-Final Office Action", U.S. Appl. No. 13/603,918, Dec. 19, 2013, 12 pages.
"Non-Final Office Action", U.S. Appl. No. 13/645,405, Jan. 31, 2014, 6 pages.
"Non-Final Office Action", U.S. Appl. No. 13/651,195, Jan. 2, 2013, 14 pages.
"Non-Final Office Action", U.S. Appl. No. 13/651,232, Jan. 17, 2013, 15 pages.
"Non-Final Office Action", U.S. Appl. No. 13/651,232, Dec. 5, 2013, 15 pages.
"Non-Final Office Action", U.S. Appl. No. 13/651,272, Feb. 12, 2013, 10 pages.
"Non-Final Office Action", U.S. Appl. No. 13/651,287, Jan. 29, 2013, 13 pages.

(56) References Cited

OTHER PUBLICATIONS

"Non-Final Office Action", U.S. Appl. No. 13/651,304, Mar. 22, 2013, 9 pages.
"Non-Final Office Action", U.S. Appl. No. 13/651,327, Mar. 22, 2013, 6 pages.
"Non-Final Office Action", U.S. Appl. No. 13/651,726, Apr. 15, 2013, 6 pages.
"Non-Final Office Action", U.S. Appl. No. 13/651,871, Mar. 18, 2013, 14 pages.
"Non-Final Office Action", U.S. Appl. No. 13/651,871, Jul. 1, 2013, 5 pages.
"Non-Final Office Action", U.S. Appl. No. 13/651,976, Feb. 22, 2013, 16 pages.
"Non-Final Office Action", U.S. Appl. No. 13/653,321, Feb. 1, 2013, 13 pages.
"Non-Final Office Action", U.S. Appl. No. 13/653,682, Feb. 7, 2013, 11 pages.
"Non-Final Office Action", U.S. Appl. No. 13/653,682, Feb. 26, 2014, 10 pages.
"Non-Final Office Action", U.S. Appl. No. 13/653,682, Jun. 3, 2013, 14 pages.
"Non-Final Office Action", U.S. Appl. No. 13/656,055, Mar. 12, 2014, 17 pages.
"Non-Final Office Action", U.S. Appl. No. 13/656,055, Apr. 23, 2013, 11 pages.
"Non-Final Office Action", U.S. Appl. No. 13/656,520, Feb. 1, 2013, 15 pages.
"Non-Final Office Action", U.S. Appl. No. 13/656,520, Jun. 5, 2013, 8 pages.
"Non-Final Office Action", U.S. Appl. No. 13/780,228, Oct. 30, 2013, 12 pages.
"Non-Final Office Action", U.S. Appl. No. 13/938,930, Aug. 29, 2013, 9 pages.
"Non-Final Office Action", U.S. Appl. No. 13/939,002, Aug. 28, 2013, 6 pages.
"Non-Final Office Action", U.S. Appl. No. 13/939,002, Dec. 20, 2013, 5 pages.
"Non-Final Office Action", U.S. Appl. No. 13/939,032, Aug. 29, 2013, 7 pages.
"Non-Final Office Action", U.S. Appl. No. 14/063,912, Jan. 2, 2014, 10 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Notice of Allowance", U.S. Appl. No. 12/163,614, Apr. 3, 2013, 9 pages.
"Notice of Allowance", U.S. Appl. No. 12/882,994, Jul. 12, 2013, 9 pages.
"Notice of Allowance", U.S. Appl. No. 13/409,967, Feb. 14, 2014, 4 pages.
"Notice of Allowance", U.S. Appl. No. 13/470,633, Mar. 22, 2013, 7 pages.
"Notice of Allowance", U.S. Appl. No. 13/471,139, Mar. 17, 2014, 4 pages.
"Notice of Allowance", U.S. Appl. No. 13/471,202, May 28, 2013, 7 pages.
"Notice of Allowance", U.S. Appl. No. 13/471,237, May 12, 2014, 8 pages.
"Notice of Allowance", U.S. Appl. No. 13/563,435, Nov. 12, 2013, 5 pages.
"Notice of Allowance", U.S. Appl. No. 13/565,124, Dec. 24, 2013, 6 pages.
"Notice of Allowance", U.S. Appl. No. 13/651,195, Jul. 8, 2013, 9 pages.
"Notice of Allowance", U.S. Appl. No. 13/651,232, Apr. 25, 2014, 9 pages.
"Notice of Allowance", U.S. Appl. No. 13/651,272, May 2, 2013, 7 pages.
"Notice of Allowance", U.S. Appl. No. 13/651,287, May 2, 2014, 6 pages.
"Notice of Allowance", U.S. Appl. No. 13/651,304, Jul. 1, 2013, 5 pages.
"Notice of Allowance", U.S. Appl. No. 13/651,327, Jun. 11, 2013, 7 pages.
"Notice of Allowance", U.S. Appl. No. 13/651,726, May 31, 2013, 5 pages.
"Notice of Allowance", U.S. Appl. No. 13/651,871, Oct. 2, 2013, 7 pages.
"Notice of Allowance", U.S. Appl. No. 13/653,321, Dec. 18, 2013, 4 pages.
"Notice of Allowance", U.S. Appl. No. 13/656,520, Oct. 2, 2013, 5 pages.
"Notice of Allowance", U.S. Appl. No. 13/667,408, Mar. 13, 2014, 11 pages.
"Notice of Allowance", U.S. Appl. No. 13/715,133, Jan. 6, 2014, 7 pages.
"Notice of Allowance", U.S. Appl. No. 13/938,930, Feb. 20, 2014, 4 pages.
"Notice of Allowance", U.S. Appl. No. 13/939,002, Mar. 3, 2014, 4 pages.
"Notice of Allowance", U.S. Appl. No. 13/939,032, Apr. 3, 2014, 4 pages.
"Notice of Allowance", U.S. Appl. No. 14/018,286, May 23, 2014, 8 pages.
"Notice to Grant", CN Application No. 201320097089.9, Sep. 29, 2013, 2 Pages.
"Notice to Grant", CN Application No. 201320097124.7, Oct. 8, 2013, 2 pages.
"On-Screen Keyboard for Windows 7, Vista, XP with Touchscreen", Retrieved from <www.comfort-software.com/on-screen-keyboard.html> on Aug. 28, 2012, Feb. 2, 2011, 3 pages.
"Optical Sensors in Smart Mobile Devices", on Semiconductor, TND415/D, Available at <http://www.onsemi.jp/pub_link/Collateral/TND415-D.PDF>,Nov. 2010, pp. 1-13.
"Optics for Displays: Waveguide-based Wedge Creates Collimated Display Backlight", OptoIQ, retrieved from <http://www.optoiq.com/index/photonics-technologies-applications/lfw-display/lfw-article-display.articles.laser-focus-world.volume-46.issue-1.worldnews.optics-for_displays.html> on Nov. 2, 2010,Jan. 1, 2010, 3 pages.
"PCI Express® SMT Connector | FCI", Retrieved from <http://www.ttiinc.com/object/fp_fci_PCISMT> on Feb. 6, 2013, Feb. 2013, 1 page.
"Position Sensors", Android Developers—retrieved from <http://developer.android.com/guide/topics/sensors/sensors_position.html> on May 25, 2012, 5 pages.
"Real-Time Television Content Platform", retrieved from <http://www.accenture.com/us-en/pages/insight-real-time-television-platform.aspx> on Mar. 10, 2011, May 28, 2002, 3 pages.
"Reflex LCD Writing Tablets", retrieved from <http://www.kentdisplays.com/products/lcdwritingtablets.html> on Jun. 27, 2012, 3 pages.
"Restriction Requirement", U.S. Appl. No. 13/468,918, Nov. 29, 2013, 6 pages.
"Restriction Requirement", U.S. Appl. No. 13/603,918, Nov. 27, 2013, 8 pages.
"Restriction Requirement", U.S. Appl. No. 13/715,133, Oct. 28, 2013, 6 pages.
"Restriction Requirement", U.S. Appl. No. 13/367,812, Mar. 11, 2014, 6 pages.
"Restriction Requirement", U.S. Appl. No. 13/471,139, Jan. 17, 2013, 7 pages.
"Restriction Requirement", U.S. Appl. No. 13/494,722, Dec. 20, 2013, 6 pages.
"Restriction Requirement", U.S. Appl. No. 13/595,700, May 28, 2014, 6 pages.
"Restriction Requirement", U.S. Appl. No. 13/651,304, Jan. 18, 2013, 7 pages.
"Restriction Requirement", U.S. Appl. No. 13/651,726, Feb. 22, 2013, 6 pages.

(56) References Cited

OTHER PUBLICATIONS

"Restriction Requirement", U.S. Appl. No. 13/651,871, Feb. 7, 2013, 6 pages.
"Restriction Requirement", U.S. Appl. No. 13/715,133, Dec. 3, 2013, 6 pages.
"Restriction Requirement", U.S. Appl. No. 13/715,229, Aug. 13, 2013, 7 pages.
"RoPD® Connectors", Retrieved from <http://www.rosenberger.de/documents/headquarters_de_en/ba_automotive/AUTO_RoPD_Flyer_2012.pdf> on May 14, 2013, Jun. 2012, 6 pages.
"Smart Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>, 2009, 2 pages.
"SoIRxTM E-Series Multidirectional Phototherapy ExpandableTM 2-Bulb Full Body Panel System", Retrieved from: < http://www.solarcsystems.com/us_multidirectional_uv_light_therapy_1_intro.html > on Jul. 25, 2012, 2011, 4 pages.
"Supplemental Notice of Allowance", U.S. Appl. No. 13/653,321, Mar. 28, 2014, 4 pages.
"Surface", Retrieved from <http://www.microsoft.com/surface/en-us/support/hardwareand-drivers/type-cover> on Dec. 24, 2013, 6 pages.
"Teach Me Simply", Retrieved From: <http://techmesimply.blogspot.in/2013/05/yugatech_3.html> on Nov. 22, 2013, May 3, 2013, pp. 1-6.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, Jun. 2012, 2 pages.
"Tilt Shift Lenses: Perspective Control", retrieved from http://www.cambridgeincolour.com/tutorials/tilt-shift-lenses1.htm, Mar. 28, 2008, 11 Pages.
"Virtualization Getting Started Guide", Red Hat Enterprise Linux 6, Edition 0.2—retrieved from <http://docs.redhat.com/docs/en-US/Red_Hat_Enterprise_Linux/6/html-single/Virtualization_Getting_Started_Guide/index.html> on Jun. 13, 2012, 24 pages.
"Welcome to Windows 7", Retrieved from: <http://www.microsoft.com/en-us/download/confirmation.aspx?id=4984> on Aug. 1, 2013, Sep. 16, 2009, 3 pages.
"What is Active Alignment?", http://www.kasalis.com/active_alignment.html, retrieved on Nov. 22, 2012, 2 Pages.
"What is the PD-Net Project About?", retrieved from <http://pd-net.org/about/> on Mar. 10, 2011, 3 pages.
"Write & Learn Spellboard Advanced", Available at <http://somemanuals.com/VTECH,WRITE%2526LEARN--SPELLBOARD--ADV--71000,JIDFHE.PDF>, 2006, 22 pages.
Bathiche, et al.,' "Input Device with Interchangeable Surface", U.S. Appl. No. 13/974,749, filed Aug. 23, 2013, 51 pages.
Bert, et al.,' "Passive Matrix Addressing of Electrophoretic Image Display", Conference on International Display Research Conference, Retrieved from <http://www.cmst.be/publi/eurodisplay2002_s14-1.pdf>,Oct. 1, 2002, 4 pages.
Block, et al.,' "DeviceOrientation Event Specification", W3C, Editor's Draft, retrieved from <https://developer.palm.com/content/api/dev-guide/pdk/accessing-device-sensors.html> on May 25, 2012,Jul. 12, 2011, 14 pages.
Breath, "ThinkSafe: A Magnetic Power Connector for Thinkpads", Retrieved from <http://www.instructables.com/id/ThinkSafe%3A-A-Magnetic-Power-Connector-for-Thinkpad/> on May 14, 2013, Oct. 26, 2006, 9 pages.
Brown, "Microsoft Shows Off Pressure-Sensitive Keyboard", retrieved from <http://news.cnet.com/8301-17938_105-10304792-1.html> on May 7, 2012, Aug. 6, 2009, 2 pages.
Burge, et al.,' "Determination of off-axis aberrations of imaging systems using on-axis measurements", SPIE Proceeding, Retrieved from <http://www.loft.optics.arizona.edu/documents/journal_articles/Jim_Burge_Determination_of_off-axis_aberrations_of_imaging_systems_using_on-axis_measurements.pdf>,Sep. 21, 2011, 10 pages.
Butler et al.,' "SideSight: Multi-"touch" Interaction around Small Devices", In the proceedings of the 21st annual ACM symposium on User interface software and technology., retrieved from <http://research.microsoft.com/pubs/132534/sidesight_crv3.pdf> on May 29, 2012,Oct. 19, 2008, 4 pages.
Chang, et al.,' "Optical Design and Analysis of LCD Backlight Units Using ASAP", Optical Engineering, Available at <http://www.opticsvalley.com/resources/kbasePDF/ma_oe_001_optical_design.pdf>,Jun. 2003, 15 pages.
Chavan, et al.,' "Synthesis, Design and Analysis of a Novel Variable Lift Cam Follower System", In Proceedings: International Journal of Desingn Engineering, vol. 3, Issue 4 Inderscience Publishers,Jun. 3, 2010, 1 Page.
Crider, "Sony Slate Concept Tablet "Grows" a Kickstand", Retrieved from: <http://androidcommunity.com/sony-slate-concept-tablet-grows-a-kickstand-20120116/> on May 4, 2012, Jan. 16, 2012, 9 pages.
Das, et al.,' "Study of Heat Transfer through Multilayer Clothing Assemblies: A Theoretical Prediction", Retrieved from <http://www.autexrj.com/cms/zalaczone_pliki/5_013_11.pdf>, Jun. 2011, 7 pages.
Dietz, et al.,' "A Practical Pressure Sensitive Computer Keyboard", In Proceedings of UIST 2009, Oct. 2009, 4 pages.
Diverdi, et al.,' "An Immaterial Pseudo-3D Display with 3D Interaction", In the proceedings of Three-Dimensional Television: Capture, Transmission, and Display, Springer, Retrieved from <http://www.cs.ucsb.edu/~holl/pubs/DiVerdi-2007-3DTV.pdf>,Feb. 6, 2007, 26 pages.
Gaver, et al.,' "A Virtual Window on Media Space", retrieved from <http://www.gold.ac.uk/media/15gaver-smets-overbeeke.MediaSpaceWindow.chi95.pdf> on Jun. 1, 2012, retrieved from <http://www.gold.ac.uk/media/15gaver-smets-overbeeke.MediaSpaceWindow.chi95.pdf> on Jun. 1, 2012,May 7, 1995, 9 pages.
Glatt, "Channel and Key Pressure (Aftertouch).", Retrieved from: <http://home.roadrunner.com/~jgglatt/tutr/touch.htm> on Jun. 11, 2012, 2012, 2 pages.
Grossman, et al.,' "Multi-Finger Gestural Interaction with 3D Volumetric Displays", In the proceedings of the 17th annual ACM symposium on User interface software and technology, Retrieved from <http://www.dgp.toronto.edu/papers/tgrossman_UIST2004.pdf>,Oct. 24, 2004, 61-70.
Hanlon, "ElekTex Smart Fabric Keyboard Goes Wireless", Retrieved from: <http://www.gizmag.com/go/5048/ > on May 7, 2012, Jan. 15, 2006, 5 pages.
Harada, et al.,' "VoiceDraw: A Hands-Free Voice-Driven Drawing Application for People With Motor Impairments", In Proceedings of Ninth International ACM SIGACCESS Conference on Computers and Accessibility, retrieved from <http://citeseerx.ist.psu.edu/viewdoc/download?doi=10.1.1.113.7211&rep=rep1&type=pdf> on Jun. 1, 2012,Oct. 15, 2007, 8 pages.
Hinckley, et al.,' "Codex: A Dual Screen Tablet Computer", Conference on Human Factors in Computing Systems, Apr. 9, 2009, 10 pages.
Iwase, "Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> Proceedings: Journal of Microelectromechanical Systems, Dec. 2005, 7 pages.
Izadi, et al.,' "ThinSight: A Thin Form-Factor Interactive Surface Technology", Communications of the ACM, vol. 52, No. 12, retrieved from <http://research.microsoft.com/pubs/132532/p90-izadi.pdf> on Jan. 5, 2012,Dec. 2009, pp. 90-98.
Jacobs, et al.,' "2D/3D Switchable Displays", In the proceedings of Sharp Technical Journal (4), Available at <https://cgi.sharp.co.jp/corporate/rd/journal-85/pdf/85-04.pdf>,Apr. 2003, pp. 15-18.
Justin, "Seidio Active with Kickstand for the Galaxy SIII", Retrieved From: <http://www.t3chniq.com/seidio-active-with-kickstand-gs3/> on Nov. 22, 2013, Jan. 3, 2013, 5 Pages.

(56) References Cited

OTHER PUBLICATIONS

Kaufmann, et al.,' "Hand Posture Recognition Using Real-time Artificial Evolution", EvoApplications'09, retrieved from <http://evelyne.lutton.free.fr/Papers/KaufmannEvolASP2010.pdf> on Jan. 5, 2012,Apr. 3, 2010, 10 pages.

Kaur, "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012, Jun. 21, 2010, 4 pages.

Khuntontong, et al.,' "Fabrication of Molded Interconnection Devices by Ultrasonic Hot Embossing on Thin Polymer Films", IEEE Transactions on Electronics Packaging Manufacturing, vol. 32, No. 3, Jul. 2009, pp. 152-156.

Kim, et al.,' "A Controllable Viewing Angle LCD with an Optically isotropic liquid crystal", Journal of Physics D: Applied Physics, vol. 43, No. 14, Mar. 23, 2010, 7 Pages.

Lahr, "Development of a Novel Cam-based Infinitely Variable Transmission", Proceedings: In Thesis of Master of Science in Mechanical Engineering, Virginia Polytechnic Institute and State University,Nov. 6, 2009, 91 pages.

Lambert, "Cam Design", In Proceedings: Kinematics and dynamics of Machine, University of Waterloo Department of Mechanical Engineering,Jul. 2, 2002, pp. 51-60.

Lance, et al.,' "Media Processing Input Device", U.S. Appl. No. 13/655,065, filed Oct. 18, 2012, 43 pages.

Lee, "Flat-Panel Autostereoscopic 3D Display", Optoelectronics, IET, Available at <http://ieeexplore.ieee.org/stamp/stamp.jsp?arnumber=04455550>,Feb. 2008, pp. 24-28.

Lee, "Flat-panel Backlight for View-sequential 3D Display", Optoelectronics, IEE Proceedings-.vol. 151. No. 6 IET, Dec. 2004, 4 pages.

Lee, et al.,' "Depth-Fused 3D Imagery on an Immaterial Display", In the proceedings of IEEE Transactions on Visualization and Computer Graphics, vol. 15, No. 1, Retrieved from <http://ieeexplore.ieee.org/stamp/stamp.jsp?arnumber=04540094>,Jan. 2009, 20-33.

Lee, et al.,' "LED Light Coupler Design for a Ultra Thin Light Guide", Journal of the Optical Society of Korea, vol. 11, Issue.3, Retrieved from <http://opticslab.kongju.ac.kr/pdf/06.pdf>,Sep. 2007, 5 pages.

Li, et al.,' "Characteristic Mode Based Tradeoff Analysis of Antenna-Chassis Interactions for Multiple Antenna Terminals", In IEEE Transactions on Antennas and Propagation, Retrieved from <http://ieeexplore.ieee.org/stamp/stamp.jsp?tp=&arnumber=6060882>,Feb. 2012, 13 pages.

Linderholm, "Logitech Shows Cloth Keyboard for PDAs", Retrieved from: <http://www.pcworld.com/article/89084/logitech_shows_cloth_keyboard_for_pdas.html> on May 7, 2012, Mar. 15, 2002, 5 pages.

Liu, et al.,' "Three-dimensional PC: toward novel forms of human-computer interaction", In the proceedings of Three-Dimensional Video and Display: Devices and Systems vol. CR76, Retrieved from <http://www.google.co.in/url?sa=t&rct=j&q=Three-dimensional+PC:+toward+novel+forms+of+human-computer+interaction&source=web&cd=1&ved=0CFoQFjAA&url=http%3A%2F%2Fciteseerx.ist.psu.edu%2Fviewdoc%2Fdownload%3Fdoi%3D10.1.1.32.9469%26rep%3Drep1%26,Nov. 5, 2000, 250-281.

Manresa-Yee, et al.,' "Experiences Using a Hands-Free Interface", In Proceedings of the 10th International ACM SIGACCESS Conference on Computers and Accessibility, retrieved from <http://dmi.uib.es/~cmanresay/Research/%5BMan08%5DAssets08.pdf> on Jun. 1, 2012,Oct. 13, 2008, pp. 261-262.

McLellan, "Eleksen Wireless Fabric Keyboard: a first look", Retrieved from: <http://www.zdnetasia.com/eleksen-wireless-fabric-keyboard-a-first-look-40278954.htm> on May 7, 2012, Jul. 17, 2006, 9 pages.

McLellan, "Microsoft Surface Review", Retrieved from <http://www.zdnet.com/microsoft-surface-review-7000006968/> on May 13, 2013, Nov. 6, 2012, 17 pages.

Miller, "MOGA gaming controller enhances the Android gaming experience", Retrieved from <http://www.zdnet.com/moga-gaming-controller-enhances-the-android-gaming-experience-7000007550/> on Nov. 20, 2012, Nov. 18, 2012, 9 pages.

Morookian, et al.,' "Ambient-Light-Canceling Camera Using Subtraction of Frames", NASA Tech Briefs, Retrieved from <http://ntrs.nasa.gov/archive/nasa/casi.ntrs.nasa.gov/20110016693_2011017808.pdf>,May 2004, 2 pages.

Nakanishi, et al.,' "Movable Cameras Enhance Social Telepresence in Media Spaces", In Proceedings of the 27th International Conference on Human Factors in Computing Systems, retrieved from <http://smg.ams.eng.osaka-u.ac.jp/~nakanishi/hnp_2009_chi.pdf> on Jun. 1, 2012,Apr. 6, 2009, 10 pages.

Peli, "Visual and Optometric Issues with Head-Mounted Displays", IS & T/OSA Optics & Imaging in the Information Age, The Society for Imaging Science and Technology, available at <http://www.u.arizona.edu/~zrui3/zhang_pHMPD_spie07.pdf>,1996, pp. 364-369.

Piltch, "ASUS Eee Pad Slider SL101 Review", Retrieved from <http://www.laptopmag.com/review/tablets/asus-eee-pad-slider-sl101.aspx>, Sep. 22, 2011, 5 pages.

Post, et al.,' "E-Broidery: Design and Fabrication of Textile-Based Computing", IBM Systems Journal, vol. 39, Issue 3 & 4, Jul. 2000, pp. 840-860.

Prospero, "Samsung Outs Series 5 Hybrid PC Tablet", Retrieved from: <http://blog.laptopmag.com/samsung-outs-series-5-hybrid-pc-tablet-running-windows-8> on Oct. 31, 2013, Jun. 4, 2012, 7 pages.

Purcher, "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012, Retrieved from: <http://www.patentlyapple.com/patently-apple/2012/01/apple-is-paving-the-way-for-a-new-3d-gui-for-ios-devices.html> on Jun. 4, 2012,Jan. 12, 2012, 15 pages.

Qin, et al.,' "pPen: Enabling Authenticated Pen and Touch Interaction on Tabletop Surfaces", In Proceedings of ITS 2010, Available at <http://www.dfki.de/its2010/papers/pdf/po172.pdf>,Nov. 2010, pp. 283-284.

Ramirez, "Applying Solventless Elastomeric Polyurethanes on Concrete in Wastewater Service", In Proceedings: Journal of Protective Coatings and Linings, May 1995, 13 pages.

Reilink, et al.,' "Endoscopic Camera Control by Head Movements for Thoracic Surgery", In Proceedings of 3rd IEEE RAS & EMBS International Conference of Biomedical Robotics and Biomechatronics, retrieved from <http://doc.utwente.nl/74929/1/biorob_online.pdf> on Jun. 1, 2012,Sep. 26, 2010, pp. 510-515.

Reisman, et al.,' "A Screen-Space Formulation for 2D and 3D Direct Manipulation", In the proceedings of the 22nd annual ACM symposium on User interface, Retrieved from <http://innovis.cpsc.ucalgary.ca/innovis/uploads/Courses/TableTopDetails2009/Reisman 2009.pdf>,Oct. 4, 2009, 69-78.

Sanap, et al.,' "Design and Analysis of Globoidal Cam Index Drive", Proceedings: In International Journal of Scientific Research Engineering & Technology, Jun. 2013, 6 Pages.

Schoning, et al.,' "Building Interactive Multi-Touch Surfaces", Journal of Graphics, GPU, and Game Tools, vol. 14, No. 3, available at <http://www.libavg.com/raw-attachment/wiki/Multitouch/Multitouchguide_draft.pdf>,Nov. 2009, pp. 35-55.

Siddiqui, "Hinge Mechanism for Rotatable Component Attachment", U.S. Appl. No. 13/852,848, Mar. 28, 2013, 51 pages.

Staff, "Gametel Android controller turns tablets, phones into portable gaming devices", Retrieved from <http://www.mobiletor.com/2011/11/18/gametel-android-controller-turns-tablets-phones-into-portable-gaming-devices/#> on Nov. 20, 2012, Nov. 18, 2011, 5 pages.

Sumimoto, "Touch & Write: Surface Computing With Touch and Pen Input", Retrieved from: <http://www.gottabemobile.com/2009/08/07/touch-write-surface-computing-with-touch-and-pen-input/> on Jun. 19, 2012, Aug. 7, 2009, 4 pages.

Sundstedt, "Gazing at Games: Using Eye Tracking to Control Virtual Characters", In ACM SIGGRAPH 2010 Courses, retrieved from <http://www.tobii.com/Global/Analysis/Training/EyeTrackAwards/veronica_sundstedt.pdf> on Jun. 1, 2012,Jul. 28, 2010, 85 pages.

(56) References Cited

OTHER PUBLICATIONS

Takamatsu, et al.,' "Flexible Fabric Keyboard with Conductive Polymer-Coated Fibers", In Proceedings of Sensors 2011, Oct. 28, 2011, 4 pages.
Travis, et al.,' "Collimated Light from a Waveguide for a Display Backlight", Optics Express, 19714, vol. 17, No. 22, retrieved from <http://download.microsoft.com/download/D/2/E/D2E425F8-CF3C-4C71-A4A2-70F9D4081007/OpticsExpressbacklightpaper.pdf> on Oct. 15, 2009, 6 pages.
Travis, et al.,' "Flat Projection for 3-D", In Proceedings of the IEEE, vol. 94 Issue: 3, Available at <http://ieeexplore.ieee.org/stamp/stamp.jsp?tp=&arnumber=1605201>,Mar. 13, 2006, pp. 539-549.
Travis, et al.,' "P-127: Linearity in Flat Panel Wedge Projection", SID 03 Digest, retrieved from <http://www2.eng.cam.ac.uk/~arlt1/Linearity%20in%20flat%20panel%20wedge%20projection.pdf>,May 12, 2005, pp. 716-719.
Travis, et al.,' "The Design of Backlights for View-Sequential 3D", retrieved from <http://download.microsoft.com/download/D/2/E425F8-CFC3-4C71-A4A2-70FD4081007/Blacklightforviewsequentialautostereo.docx> on Nov. 1, 2010, 4 pages.
Valli, "Notes on Natural Interaction", retrieved from <http://www.idemployee.id.tue.nl/g.w.m.rauterberg/lecturenotes/valli-2004.pdf> on Jan. 5, 2012, Sep. 2005, 80 pages.
Valliath, "Design of Hologram for Brightness Enhancement in Color LCDs", Retrieved from <http://www.loreti.it/Download/PDF/LCD/44_05.pdf> on Sep. 17, 2012, May 1998, 5 pages.
Vaucelle, "Scopemate, A Robotic Microscope!", Architectradure, retrieved from <http://architectradure.blogspot.com/2011/10/at-uist-this-monday-scopemate-robotic.html> on Jun. 6, 2012,Oct. 17, 2011, 2 pages.
Williams, "A Fourth Generation of LCD Backlight Technology", Retrieved from <http://cds.linear.com/docs/Application%20Note/an65f.pdf>, Nov. 1995, 124 pages.
Xu, et al.,' "Hand Gesture Recognition and Virtual Game Control Based on 3D Accelerometer and EMG Sensors", IUI'09, Feb. 8-11, 2009, retrieved from <http://sclab.yonsei.ac.kr/courses/10TPR/10TPR.files/Hand%20Gesture%20Recognition%20and%20Virtual%20Game%20Control%20based%20on%203d%20accelerometer%20and%20EMG%20sensors.pdf> on Jan. 5, 2012,Feb. 8, 2009, 5 pages.
Xu, et al.,' "Vision-based Detection of Dynamic Gesture", ICTM'09, Dec. 5-6, 2009, retrieved from <http://ieeexplore.ieee.org/stamp/stamp.jsp?tp=&arnumber=5412956> on Jan. 5, 2012,Dec. 5, 2009, pp. 223-226.
Yagi, "The Concept of "AdapTV"", Series: The Challenge of "AdapTV", Broadcast Technology, No. 28, 2006, pp. 16-17.
Yan, et al.,' "Edge-Lighting Light Guide Plate Based on Micro-Prism for Liquid Crystal Display", Journal of Display Technology, vol. 5, No. 9, Available at <http://ieeexplore.ieee.org/ielx5/9425/5196834/05196835.pdf?tp=&arnumber=5196835&isnumber=5196834>,Sep. 2009, pp. 355-357.
Yu, et al.,' "A New Driving Scheme for Reflective Bistable Cholesteric Liquid Crystal.Displays", Society for Information Display International Symposium Digest of Technical Papers, Retrieved from <http://www.ee.ust.hk/~eekwok/publications/1997/bcd_sid.pdf>,May 1997, 4 pages.
Zhang, "Design of Head Mounted Displays", Retrieved at <<http://www.optics.arizona.edu/optomech/student%20reports/2007/Design%20of%20mounteddisplays%20Zhang.pdf>>, Dec. 12, 2007, 6 pages.
Zhang, et al.,' "Model-Based Development of Dynamically Adaptive Software", In Proceedings of ICSE 2006, Available at <http://www.irisa.fr/lande/lande/icse-proceedings/icse/p371.pdf>,May 20, 2006, pp. 371-380.
Zhu, et al.,' "Keyboard before Head Tracking Depresses User Success in Remote Camera Control", In Proceedings of 12th IFIP TC 13 International Conference on Human-Computer Interaction, Part II, retrieved from <http://csiro.academia.edu/Departments/CSIRO_ICT_Centre/Papers?page=5> on Jun. 1, 2012,Aug. 24, 2009, 14 pages.
"Corrected Notice of Allowance", U.S. Appl. No. 13/651,232, Jul. 31, 2014, 2 pages.
"Corrected Notice of Allowance", U.S. Appl. No. 13/651,287, Aug. 21, 2014, 2 pages.
"Corrected Notice of Allowance", U.S. Appl. No. 13/938,930, Jun. 6, 2014, 2 pages.
"Corrected Notice of Allowance", U.S. Appl. No. 13/939,002, Jun. 19, 2014, 2 pages.
"Corrected Notice of Allowance", U.S. Appl. No. 13/939,032, Jun. 26, 2014, 2 pages.
"Corrected Notice of Allowance", U.S. Appl. No. 13/939,032, Jul. 15, 2014, 2 pages.
"Corrected Notice of Allowance", U.S. Appl. No. 14/199,924, Aug. 29, 2014, 2 pages.
"Final Office Action", U.S. Appl. No. 13/471,376, Aug. 18, 2014, 24 pages.
"Final Office Action", U.S. Appl. No. 13/595,700, Aug. 15, 2014, 6 pages.
"Final Office Action", U.S. Appl. No. 13/599,635, Aug. 8, 2014, 16 pages.
"Final Office Action", U.S. Appl. No. 13/653,682, Jun. 11, 2014, 11 pages.
"Foreign Notice of Allowance", CN Application No. 201320096755.7, Jan. 27, 2014, 2 pages.
"Foreign Office Action", CN Application No. 201320097065.3, Jun. 18, 2013, 2 pages.
"Foreign Office Action", CN Application No. 201320097079.5, Sep. 26, 2013, 4 pages.
"Interlink Electronics FSR (TM) Force Sensing Resistors (TM)", Retrieved at <<http://akizukidenshi.com/download/ds/interlinkelec/94-00004+Rev+B%20FSR%201ntegration%20Guide.pdf on Mar. 21, 2013, 36 pages.
"International Search Report and Written Opinion", Application No. PCT/US2014/031531, Jun. 20, 2014, 10 Pages.
"International Search Report and Written Opinion", Application No. PCT/US2013/028483, Jun. 24, 2014, 10 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.
"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2013/028481, Jun. 19, 2014, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/028768, Jun. 24, 2014, 12 pages.
"International Search Report and Written Opinion", Application No. PCT/US2013/028482, Jun. 20, 2014, 13 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.

(56) References Cited

OTHER PUBLICATIONS

"Non-Final Office Action", U.S. Appl. No. 13/468,882, Jul. 9, 2014, 9 pages.
"Non-Final Office Action", U.S. Appl. No. 13/468,949, Jun. 20, 2014, 10 pages.
"Non-Final Office Action", U.S. Appl. No. 13/470,951, Jul. 2, 2014, 19 pages.
"Non-Final Office Action", U.S. Appl. No. 13/471,001, Jun. 17, 2014, 23 pages.
"Non-Final Office Action", U.S. Appl. No. 13/471,054, Jun. 3, 2014, 15 pages.
"Non-Final Office Action", U.S. Appl. No. 13/471,282, Sep. 3, 2014, 13 pages.
"Non-Final Office Action", U.S. Appl. No. 13/471,412, Jul. 11, 2014, 22 pages.
"Non-Final Office Action", U.S. Appl. No. 13/564,520, Jun. 16, 2014, 5 pages.
"Non-Final Office Action", U.S. Appl. No. 13/595,700, Jun. 18, 2014, 8 pages.
"Non-Final Office Action", U.S. Appl. No. 13/645,405, Aug. 11, 2014, 5 pages.
"Non-Final Office Action", U.S. Appl. No. 13/647,479, Jul. 3, 2014, 10 pages.
"Non-Final Office Action", U.S. Appl. No. 13/651,976, Jun. 16, 2014, 23 pages.
"Non-Final Office Action", U.S. Appl. No. 14/063,912, Sep. 2, 2014, 11 pages.
"Non-Final Office Action", U.S. Appl. No. 14/225,250, Jun. 17, 2014, 5 pages.
"Non-Final Office Action", U.S. Appl. No. 14/277,240, Jun. 13, 2014, 6 pages.
"Notice of Allowance", U.S. Appl. No. 13/468,918, Jun. 17, 2014, 5 pages.
"Notice of Allowance", U.S. Appl. No. 13/471,186, Jul. 3, 2014, 7 pages.
"Notice of Allowance", U.S. Appl. No. 13/471,405, Jun. 24, 2014, 9 pages.
"Notice of Allowance", U.S. Appl. No. 14/199,924, Jun. 10, 2014, 4 pages.
"Supplemental Notice of Allowance", U.S. Appl. No. 13/471,405, Aug. 29, 2014, 5 pages.
"Supplemental Notice of Allowance", U.S. Appl. No. 14/018,286, Jun. 11, 2014, 5 pages.
"Corrected Notice of Allowance", U.S. Appl. No. 13/471,030, Sep. 30, 2014, 2 pages.
"Corrected Notice of Allowance", U.S. Appl. No. 14/199,924, Sep. 5, 2014, 2 pages.
"Corrected Notice of Allowance", U.S. Appl. No. 14/199,924, Sep. 19, 2014, 2 pages.
"Final Office Action", U.S. Appl. No. 13/468,949, Oct. 6, 2014, 11 pages.
"Final Office Action", U.S. Appl. No. 13/471,054, Oct. 23, 2014, 17 pages.
"Final Office Action", U.S. Appl. No. 13/471,336, Oct. 6, 2014, 13 pages.
"Final Office Action", U.S. Appl. No. 13/595,700, Oct. 9, 2014, 8 pages.
"Final Office Action", U.S. Appl. No. 13/656,055, Sep. 17, 2014, 10 pages.
"Foreign Notice of Allowance", CN Application No. 201320097065.3, Nov. 21, 2013, 2 pages.
"International Search Report and Written Opinion", PCT App PCT/US2014/043546, Oct. 9, 2014, 10 pages.
"Non-Final Office Action", U.S. Appl. No. 13/471,393, Oct. 20, 2014, 12 pages.
"Non-Final Office Action", U.S. Appl. No. 13/780,228, Sep. 15, 2014, 18 pages.
"Notice of Allowance", U.S. Appl. No. 13/471,030, Sep. 5, 2014, 6 pages.
"Notice of Allowance", U.S. Appl. No. 13/653,682, Sep. 24, 2014, 4 pages.
"Notice of Allowance", U.S. Appl. No. 14/277,240, Sep. 16, 2014, 4 pages.
"Restriction Requirement", U.S. Appl. No. 13/653,184, Sep. 5, 2014, 6 pages.
Harrison, "UIST 2009 Student Innovation Contest—Demo Video", Retrieved From: <https://www.youtube.com/watch?v=PDI8eYIASf0> Sep. 16, 2014, Jul. 23, 2009, 1 pages.
"Corrected Notice of Allowance", U.S. Appl. No. 14/277,240, Jan. 8, 2015, 2 pages.
"Final Office Action", U.S. Appl. No. 13/470,951, Jan. 12, 2015, 20 pages.
"Final Office Action", U.S. Appl. No. 13/471,412, Dec. 15, 2014, 11 pages.
"Final Office Action", U.S. Appl. No. 13/492,232, Nov. 17, 2014, 13 pages.
"Final Office Action", U.S. Appl. No. 13/647,479, Dec. 12, 2014, 12 pages.
"Final Office Action", U.S. Appl. No. 14/063,912, Jan. 12, 2015, 12 pages.
"Final Office Action", U.S. Appl. No. 14/200,595, Nov. 19, 2014, 5 pages.
"International Search Report and Written Opinion", U.S. Appl. No. PCT/US2014/013928, Oct. 22, 2014, 13 Pages.
"Non-Final Office Action", U.S. Appl. No. 13/471,030, Jan. 15, 2015, 7 pages.
"Non-Final Office Action", U.S. Appl. No. 13/525,614, Nov. 24, 2014, 19 pages.
"Non-Final Office Action", U.S. Appl. No. 13/653,184, Dec. 1, 2014, 7 pages.
"Restriction Requirement", U.S. Appl. No. 13/653,218, Nov. 7, 2014, 6 pages.
"Restriction Requirement", U.S. Appl. No. 14/147,252, Dec. 1, 2014, 6 pages.
"Supplemental Notice of Allowance", U.S. Appl. No. 13/471,405, Dec. 17, 2014, 5 pages.
"Final Office Action", U.S. Appl. No. 13/468,882, Feb. 12, 2015, 9 pages.
"Final Office Action", U.S. Appl. No. 13/527,263, Jan. 27, 2015, 7 pages.
"First Examination Report", NZ Application No. 628690, Nov. 27, 2014, 2 pages.
"Foreign Office Action", CN Application No. 201320097079.5, Jul. 28, 2014, 4 pages.
"Non-Final Office Action", U.S. Appl. No. 13/492,232, Feb. 24, 2015, 12 pages.
"Non-Final Office Action", U.S. Appl. No. 13/564,520, Jan. 26, 2015, 6 pages.
"Non-Final Office Action", U.S. Appl. No. 13/599,635, Feb. 12, 2015, 16 pages.
"Non-Final Office Action", U.S. Appl. No. 13/653,218, Mar. 4, 2015, 16 pages.
"Non-Final Office Action", U.S. Appl. No. 14/059,280, Mar. 3, 2015, 18 pages.
"Non-Final Office Action", U.S. Appl. No. 14/147,252, Feb. 23, 2015, 11 pages.
"Notice of Allowance", U.S. Appl. No. 13/595,700, Jan. 21, 2015, 4 pages.
"Notice of Allowance", U.S. Appl. No. 13/651,976, Jan. 21, 2015, 10 pages.
"Notice of Allowance", U.S. Appl. No. 13/653,184, Mar. 10, 2015, 6 pages.
"Notice of Allowance", U.S. Appl. No. 13/656,055, Mar. 4, 2015, 7 pages.
"Notice of Allowance", U.S. Appl. No. 14/200,595, Feb. 17, 2015, 2 pages.
"Notice of Allowance", U.S. Appl. No. 14/200,595, Feb. 25, 2015, 4 pages.
"Corrected Notice of Allowance", U.S. Appl. No. 13/651,232, Apr. 24, 2015, 2 pages.
"Corrected Notice of Allowance", U.S. Appl. No. 13/656,055, Apr. 13, 2015, 2 pages.

(56) References Cited

OTHER PUBLICATIONS

"Corrected Notice of Allowance", U.S. Appl. No. 14/200,595, Jun. 4, 2015, 3 pages.
"Final Office Action", U.S. Appl. No. 13/525,614, Apr. 29, 2015, 20 pages.
"Final Office Action", U.S. Appl. No. 13/780,228, Apr. 10, 2015, 19 pages.
"Final Office Action", U.S. Appl. No. 14/225,250, Mar. 13, 2015, 7 pages.
"Foreign Notice on Reexamination", CN Application No. 201320097066.8, Apr. 3, 2015, 7 Pages.
"Foreign Office Action", CN Application No. 201310067808.7, May 28, 2015, 14 Pages.
"Non-Final Office Action", U.S. Appl. No. 13/471,054, Mar. 13, 2015, 18 pages.
"Non-Final Office Action", U.S. Appl. No. 13/471,376, Mar. 27, 2015, 28 pages.
"Non-Final Office Action", U.S. Appl. No. 13/471,393, Mar. 26, 2015, 13 pages.
"Non-Final Office Action", U.S. Appl. No. 13/471,412, Jun. 1, 2015, 31 pages.
"Non-Final Office Action", U.S. Appl. No. 13/647,479, Apr. 28, 2015, 11 pages.
"Non-Final Office Action", U.S. Appl. No. 13/852,848, Mar. 26, 2015, 7 pages.
"Non-Final Office Action", U.S. Appl. No. 13/926,944, Apr. 23, 2015, 6 pages.
"Non-Final Office Action", U.S. Appl. No. 14/063,912, May 7, 2015, 12 pages.
"Notice of Allowance", U.S. Appl. No. 13/468,949, Apr. 24, 2015, 9 pages.
"Notice of Allowance", U.S. Appl. No. 13/468,918, Apr. 8, 2015, 7 pages.
"Notice of Allowance", U.S. Appl. No. 13/468,949, Apr. 24, 2015, 8 pages.
"Notice of Allowance", U.S. Appl. No. 13/471,030, Apr. 6, 2015, 6 pages.
"Notice of Allowance", U.S. Appl. No. 13/471,282, Apr. 30, 2015, 8 pages.
"Notice of Allowance", U.S. Appl. No. 13/564,520, May 8, 2015, 4 pages.
"Notice of Allowance", U.S. Appl. No. 13/645,405, Mar. 26, 2015, 6 pages.
"Notice of Allowance", U.S. Appl. No. 13/651,232, Mar. 30, 2015, 7 pages.
"Supplemental Notice of Allowance", U.S. Appl. No. 13/468,918, Jun. 4, 2015, 2 pages.
"Supplemental Notice of Allowance", U.S. Appl. No. 13/468,949, Jun. 5, 2015, 2 pages.
"Supplemental Notice of Allowance", U.S. Appl. No. 13/595,700, Apr. 10, 2015, 2 pages.
"Supplemental Notice of Allowance", U.S. Appl. No. 13/595,700, May 4, 2015, 2 pages.
"Supplemental Notice of Allowance", U.S. Appl. No. 13/595,700, May 22, 2015, 2 pages.
"Supplemental Notice of Allowance", U.S. Appl. No. 13/656,055, May 15, 2015, 2 pages.
"U.S. Application as Filed", U.S. Appl. No. 13/468,882, May 10, 2012, 43 pages.
"U.S. Application as Filed", U.S. Appl. No. 13/471,393, May 14, 2012, 100 pages.
Schafer, "Using Interactive Maps for Navigation and Collaboration", CHI '01 Extended Abstracts on Human Factors in Computing Systems, Mar. 31, 2001, 2 pages.
"Corrected Notice of Allowance", U.S. Appl. No. 13/471,030, Aug. 10, 2015, 2 pages.
"Corrected Notice of Allowance", U.S. Appl. No. 13/564,520, Aug. 14, 2015, 2 pages.
"Corrected Notice of Allowance", U.S. Appl. No. 13/645,405, Jul. 7, 2015, 2 pages.
"Corrected Notice of Allowance", U.S. Appl. No. 13/651,232, Jun. 10, 2015, 2 pages.
"Corrected Notice of Allowance", U.S. Appl. No. 13/651,232, Jul. 6, 2015, 2 pages.
"Corrected Notice of Allowance", U.S. Appl. No. 13/656,055, Jul. 1, 2015, 2 pages.
"Final Office Action", U.S. Appl. No. 13/471,376, Jul. 28, 2015, 35 pages.
"Final Office Action", U.S. Appl. No. 13/492,232, Jul. 10, 2015, 11 pages.
"Final Office Action", U.S. Appl. No. 13/599,635, Jul. 30, 2015, 23 pages.
"Final Office Action", U.S. Appl. No. 13/852,848, Jul. 20, 2015, 9 pages.
"Final Office Action", U.S. Appl. No. 14/059,280, Jul. 22, 2015, 25 pages.
"Final Office Action", U.S. Appl. No. 14/147,252, Jun. 25, 2015, 11 pages.
"Foreign Office Action", CN Application No. 201310067335.0, Jun. 12, 2015, 15 Pages.
"Foreign Office Action", CN Application No. 201310225788.1, Jun. 23, 2015, 14 Pages.
"International Preliminary Report on Patentability", Application No. PCT/US2014/031531, Jun. 9, 2015, 7 pages.
"International Preliminary Report on Patentability", Application No. PCT/US2014/043546, Jun. 12, 2015, 7 pages.
"Non-Final Office Action", U.S. Appl. No. 13/471,336, Jun. 24, 2015, 15 pages.
"Non-Final Office Action", U.S. Appl. No. 13/525,614, Jul. 31, 2015, 20 pages.
"Non-Final Office Action", U.S. Appl. No. 14/225,276, Aug. 19, 2015, 9 pages.
"Non-Final Office Action", U.S. Appl. No. 14/727,001, Jul. 10, 2015, 7 pages.
"Notice of Allowance", U.S. Appl. No. 14/457,881, Jul. 22, 2015, 7 pages.
"Supplemental Notice of Allowance", U.S. Appl. No. 13/468,918, Aug. 7, 2015, 4 pages.
"Supplemental Notice of Allowance", U.S. Appl. No. 13/653,184, Jun. 24, 2015, 2 pages.
"Supplemental Notice of Allowance", U.S. Appl. No. 13/656,055, Jun. 10, 2015, 2 pages.
Cunningham, "Software Infrastructure for Natural Language Processing", In Proceedings of the fifth conference on Applied natural language processing, Mar. 31, 1997, pp. 237-244.
"Corrected Notice of Allowance", U.S. Appl. No. 14/457,881, Aug. 20, 2015, 2 pages.
"Final Office Action", U.S. Appl. No. 13/926,944, Aug. 28, 2015, 8 pages.
"Final Office Action", U.S. Appl. No. 14/063,912, Sep. 3, 2015, 13 pages.
"Foreign Office Action", CN Application No. 201310067385.9, Aug. 6, 2015, 16 pages.
"Non-Final Office Action", U.S. Appl. No. 14/225,250, Aug. 19, 2015, 9 pages.

* cited by examiner

FLEXIBLE HINGE AND REMOVABLE ATTACHMENT

This application is a continuation of and claims priority to U.S. patent application Ser. No. 13/939,002, filed Jul. 10, 2013, entitled "Flexible Hinge and Removable Attachment" and further claims priority to U.S. patent application Ser. No. 13/470,633, filed May 14, 2012, entitled "Flexible Hinge and Removable Attachment" and further claims priority under 35 U.S.C. §119(e) to the following U.S. Provisional Patent Applications, the entire disclosures of each of these applications being incorporated by reference in their entirety:

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on.

Because mobile computing devices are configured to be mobile, however, the devices may be exposed to a wide variety of environments having varying degrees of safety for the computing device. Accordingly, devices were developed to help protect the mobile computing devices from their environment. However, conventional techniques to install and remove the devices from the computing device alternated between being difficult to remove but providing good protection or being relatively easy to remove but providing limited protection.

SUMMARY

Flexible hinge and removable attachment techniques are described. In one or more implementations, a flexible hinge is configured to communicatively and physically couple an input device to a computing device. The flexible hinge may be configured to support movement of the input device similar to a cover of a book, such that the input device may act as a cover. Flexibility of the hinge may be implemented using a variety of techniques, such as a support layer to add strength to the device to protect components from repeated connection and removal from the computing device, e.g., conductors used for communication.

The hinge may also be configured to provide a minimum bend radius to further protect these conductors and other components. A variety of different techniques may be employed, such as use of embossing, a mid-spine, material choice, and so on. Additionally, techniques may be leveraged to provide mechanical stiffness to a connection portion that is used to connect the input device to the computing device, such as to form a laminate structure through the use of pins.

The input device may also include functionality to promote a secure physical connection between the input device and the computing device. One example of this includes use of one or more protrusions that are configured to be removed from respective cavities of the computing device along a particular axis but mechanically bind along other axes. These protrusions may also be used for a variety of other purposes, such as to transmit power or communications between the devices.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Figure 1:
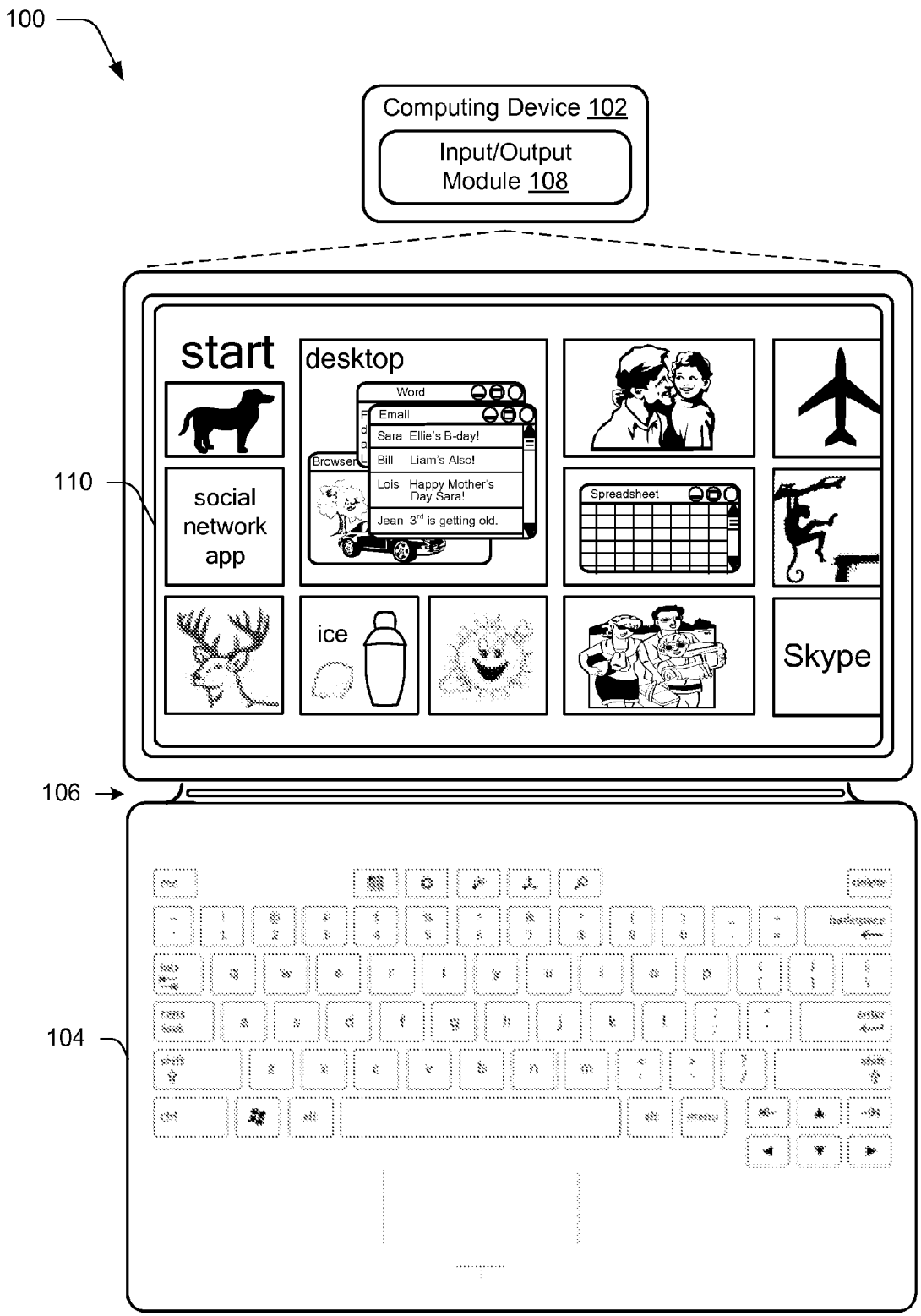
FIG. 1 is an illustration of an environment in an example implementation that is operable to employ the techniques described herein.

A variety of different devices may be physically attached to a mobile computing device to provide a variety of functionality. For example, a device may be configured to provide a cover for at least a display device of the computing device to protect it against harm. Other devices may also be physically attached to the mobile computing device, such as an input device (e.g., keyboard having a track pad) to provide inputs to the computing device. Further, functionality of these devices may be combined, such as to provide a combination cover and input device. However, conventional techniques that were utilized to attach devices to the computing device may alternate between significant protection and corresponding complications in installing and removing the device to limited protection but having relative ease of installation and removal.

Techniques are described herein to removably and/or flexibly connect an input device or other device (e.g., a cover) with a computing device. These techniques include use of a flexible hinge to promote rotational movement similar to that of a book. Techniques may also be employed to protect components of the input device during this movement, such as to support a minimum bend radius to protect conductors of the input device from the flexible movement. These techniques may include material selection, use of a mid-spine, a support layer, and so on.

Techniques are also described to promote a secure physical coupling between the input device and the computing device. This may include use of one or more protrusions that are configured to be engaged in respective cavities of the computing device, or vice versa. The protrusions are configured to mechanically bind within the cavities when the input device is "pulled away" from the computing device along one or more axes, but permit removal along a particular axis. In this way, the input device may have a secure connection through a wide range of movement yet still support ease of removal.

Techniques are also described to promote mechanical stiffness of a connection portion that is to be used to connect the input device to the computing device. The connection portion, for instance, may include a projection formed of plastic to be disposed within a channel of the computing device, or vice versa. A spine, such as a strip of metal (e.g., aluminum), may be secured to the projection to increase the mechanical stiffness. This securing may be performed through use a plurality of pins such that a combination of the pins, spine, and projection may form a laminate structure having increased stiffness along an axis of the spine. Further, the pins may be used to support a variety of other functionality, such as to attach the spine to the projection while an adhesive (e.g., an epoxy) sets, thereby supporting a fast production cycle time that is not limited by the amount of time used to have the adhesive set. Once set, a combination of the adhesive and the pins may further promote mechanical stiffness of the connection portion. Further discussion of these and other techniques may be found in relation to the following sections.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures. Further, although an input device is described, other devices are also contemplated that do not include input functionality, such as covers. For example, these techniques are equally applicable to passive devices, e.g., a cover having one or more materials (e.g., magnets, ferrous material, and so on) that are configured and positioned within the cover to be attracted to magnetic coupling devices of the computing device, use of protrusions and connecting portion, and so on as further described below.

Example Environment

FIG. 1 is an illustration of an environment 100 in an example implementation that is operable to employ the techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by the display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as having an input portion that includes a keyboard having a QWERTY arrangement of keys and track pad although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one or more directions (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of ways, further discussion of which may be found in relation to the following figure.

Figure 2:
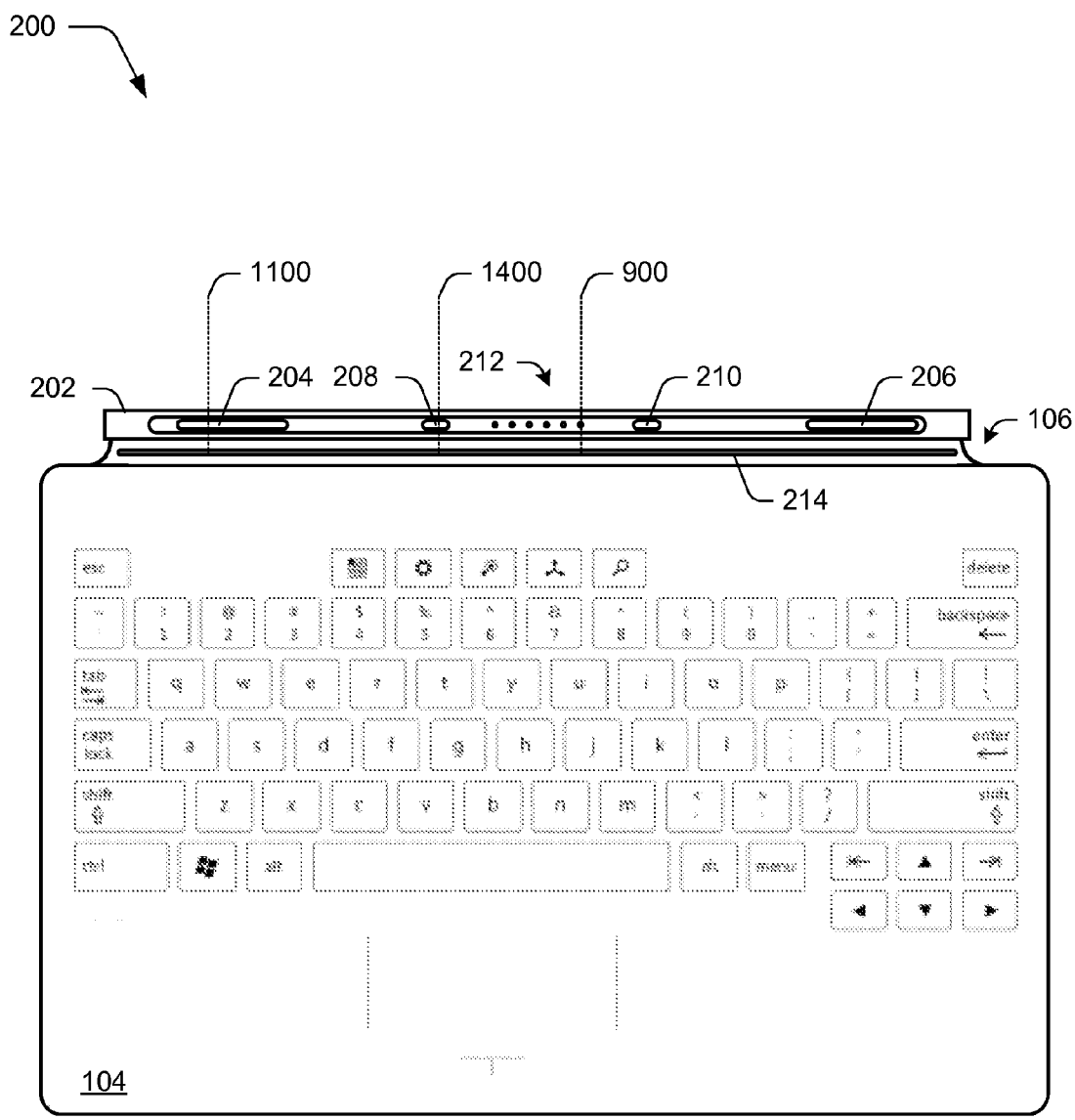
FIG. 2 depicts an example implementation of an input device of FIG. 1 as showing a flexible hinge in greater detail.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. The connection portion 202 as illustrated has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

Through this rotational movement, a variety of different orientations of the input device 104 in relation to the computing device 102 may be supported. For example, rotational movement may be supported by the flexible hinge 106 such that the input device 104 may be placed against the display device 110 of the computing device 102 and thereby act as a cover as shown in the example orientation 300 of FIG. 3. Thus, the input device 104 may act to protect the display device 110 of the computing device 102 from harm.

Figure 4:
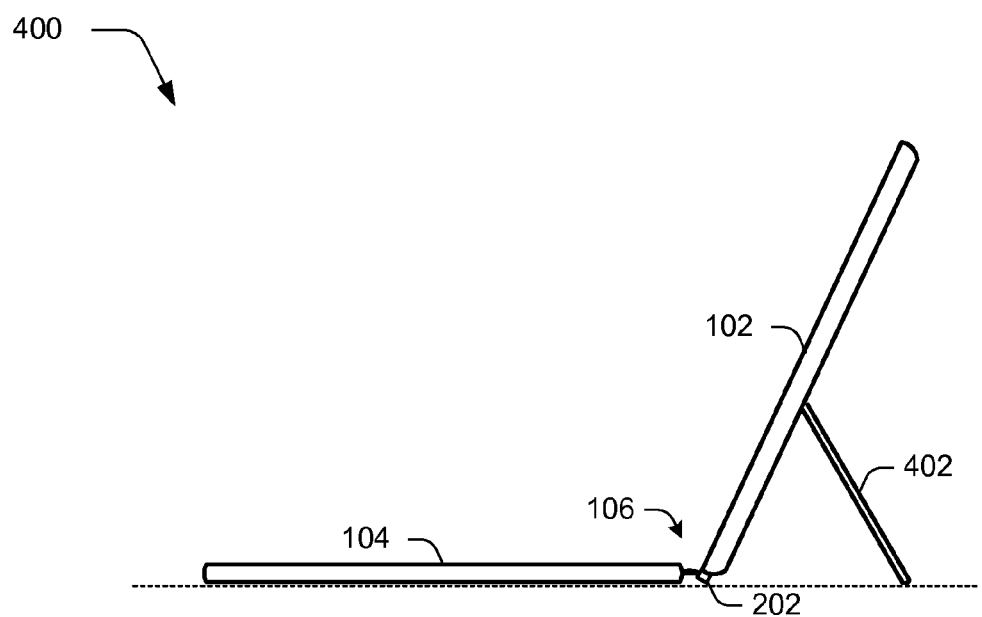
FIG. 4 depicts an example orientation of the input device in relation to the computing device as assuming a typing orientation.

As shown in the example orientation 400 of FIG. 4, a typing arrangement may be supported. In this orientation, the input device 104 is laid flat against a surface and the computing device 102 is disposed at an angle to permit viewing of the display device 110, e.g., such as through use of a kickstand 402 disposed on a rear surface of the computing device 102.

Figure 5:
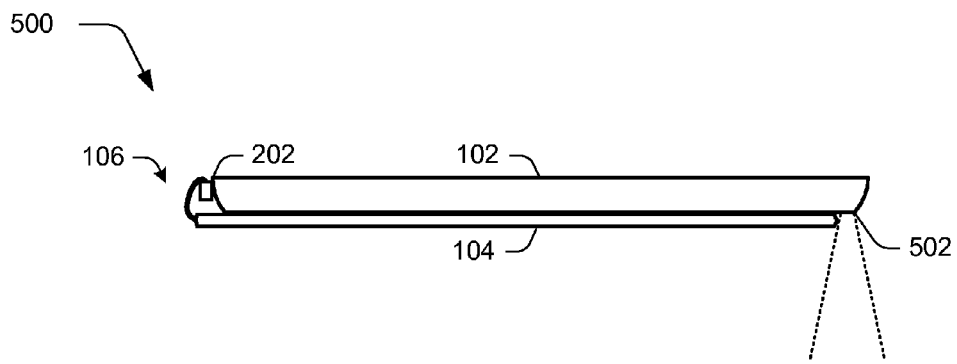
FIG. 5 depicts an example orientation of the input device in relation to the computing device as covering a rear housing of the computing device and exposing a display device of the computing device.

In the example orientation 500 of FIG. 5, the input device 104 may also be rotated so as to be disposed against a back of the computing device 102, e.g., against a rear housing of the computing device 102 that is disposed opposite the display device 110 on the computing device 102. In this example, through orientation of the connection portion 202 to the computing device 102, the flexible hinge 106 is caused to "wrap around" the connection portion 202 to position the input device 104 at the rear of the computing device 102.

This wrapping causes a portion of a rear of the computing device 102 to remain exposed. This may be leveraged for a variety of functionality, such as to permit a camera 502 positioned on the rear of the computing device 102 to be used even though a significant portion of the rear of the computing device 102 is covered by the input device 104 in this example orientation 500. Although configuration of the input device 104 to cover a single side of the computing device 102 at any one time was described above, other configurations are also contemplated.

Figure 6:
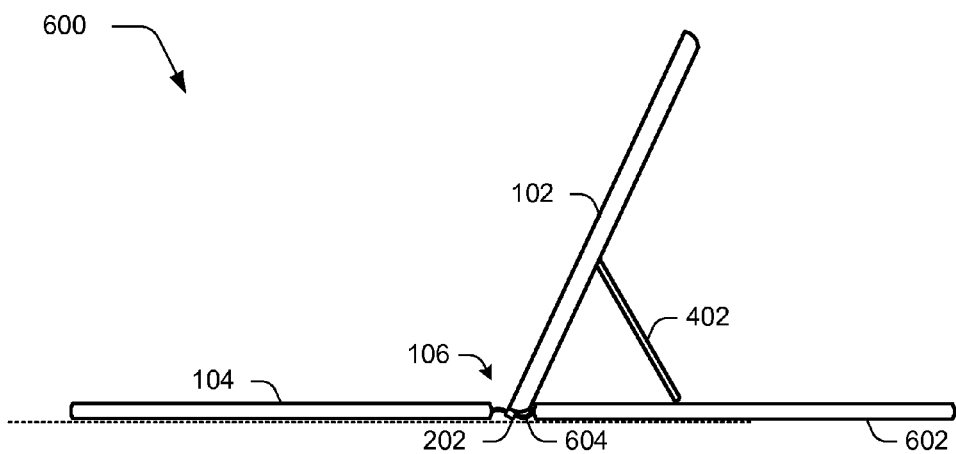
FIG. 6 depicts an example orientation of the input device as including a portion configured to cover a rear of the computing device, which in this instance is used to support a kickstand of the computing device.

In the example orientation 600 of FIG. 6, the input device 104 is illustrated as including a portion 602 configured to cover a rear of the computing device. This portion 602 is also connected to the connection portion 202 using a flexible hinge 604.

The example orientation 600 of FIG. 6 also illustrates a typing arrangement in which the input device 104 is laid flat against a surface and the computing device 102 is disposed at an angle to permit viewing of the display device 110. This is supported through use of a kickstand 402 disposed on a rear surface of the computing device 102 to contact the portion 602 in this example.

Figure 7:
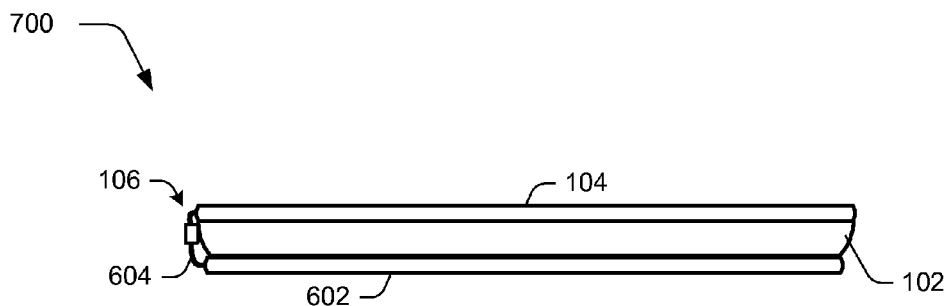
FIG. 7 depicts an example orientation in which the input device including the portion of FIG. 6 are used to cover both the front and back of the computing device.

FIG. 7 depicts an example orientation 700 in which the input device 104 including the portion 602 are used to cover both the front (e.g., display device 110) and back (e.g., opposing side of the housing from the display device) of the computing device 102. In one or more implementations, electrical and other connectors may also be disposed along the sides of the computing device 102 and/or the input device 104, e.g., to provide auxiliary power when closed.

Naturally, a variety of other orientations are also supported. For instance, the computing device 102 and input device 104 may assume an arrangement such that both are laid flat against a surface as shown in FIG. 1. Other instances are also contemplated, such as a tripod arrangement, meeting arrangement, presentation arrangement, and so forth.

Returning again to FIG. 2, the connection portion 202 is illustrated in this example as including magnetic coupling devices 204, 206, mechanical coupling protrusions 208, 210, and a plurality of communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connection portion 202 also includes mechanical coupling protrusions 208, 210 to form a mechanical physical connection between the input device 104 and the computing device 102. The mechanical coupling protrusions 208, 210 are shown in greater detail in relation to FIG. 8, which is discussed below.

Figure 8:
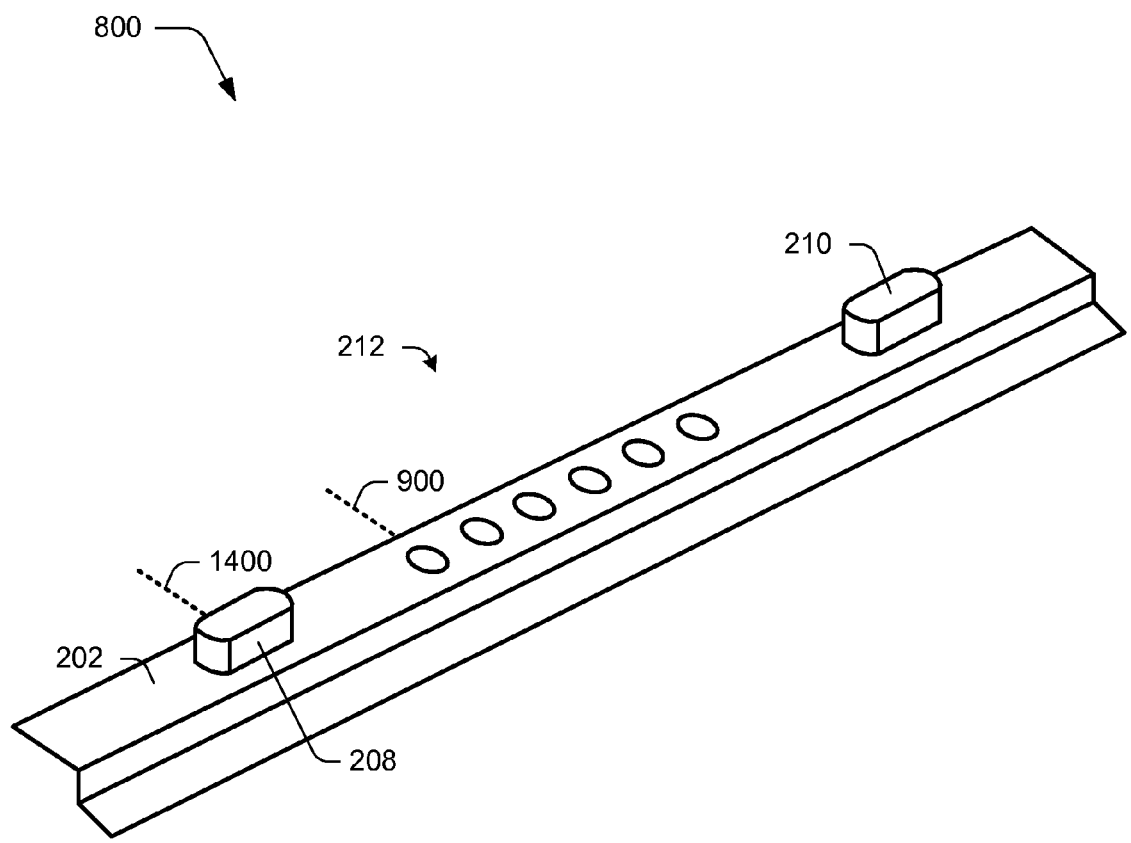
FIG. 8 depicts an example implementation showing a perspective view of a connection portion of FIG. 2 that includes mechanical coupling protrusions and a plurality of communication contacts.

FIG. 8 depicts an example implementation 800 showing a perspective view of the connection portion 202 of FIG. 2 that includes the mechanical coupling protrusions 208, 210 and the plurality of communication contacts 212. As illustrated, the mechanical coupling protrusions 208, 210 are configured to extend away from a surface of the connection portion 202, which in this case is perpendicular although other angles are also contemplated.

The mechanical coupling protrusions 208, 210 are configured to be received within complementary cavities within the channel of the computing device 102. When so received, the mechanical coupling protrusions 208, 210 promote a mechanical binding between the devices when forces are applied that are not aligned with an axis that is defined as correspond to the height of the protrusions and the depth of the cavity, further discussion of which may be found in relation to FIG. 14.

The connection portion 202 is also illustrated as including a plurality of communication contacts 212. The plurality of communication contacts 212 is configured to contact corresponding communication contacts of the computing device 102 to form a communicative coupling between the devices as shown and discussed in greater detail in relation to the following figure.

Figure 9:
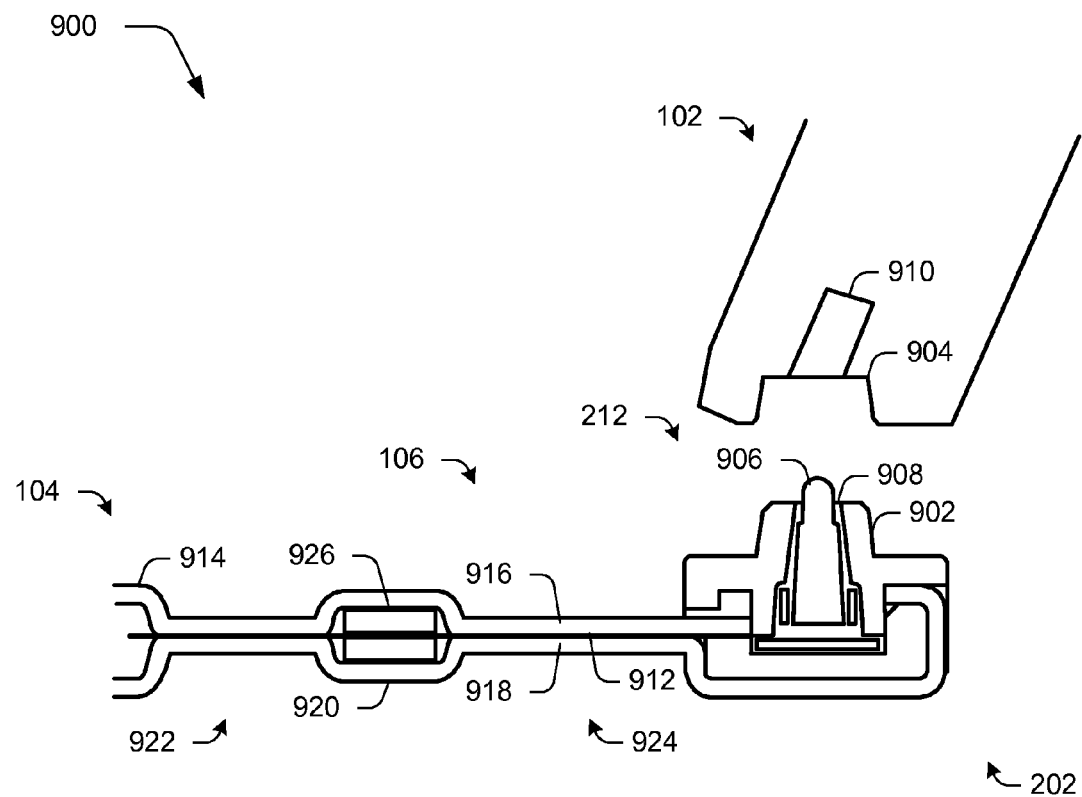
FIG. 9 depicts a cross section taken along an axis showing a communication contact as well as a cross section of a cavity of the computing device in greater detail.

FIG. 9 depicts a cross section taken along an axis 900 of FIGS. 2 and 8 showing one of the communication contacts 212 as well as a cross section of a cavity of the computing device 102 in greater detail. The connection portion 202 is illustrated as including a projection 902 that is configured to be complementary to a channel 904 of the computing device 102, e.g., having complementary shapes, such that movement of the projection 902 within the cavity 904 is limited.

The communication contacts 212 may be configured in a variety of ways. In the illustrated example, the communication contact 212 of the connection portion 202 is formed as a spring loaded pin 906 that is captured within a barrel 908 of the connection portion 202. The spring loaded pin 906 is biased outward from the barrel 908 to provide a consistent communication contact between the input device 104 and the computing device 102, such as to a contact 910 of the computing device 102. Therefore, contact and therefore communication may be maintained during movement or jostling of the devices. A variety of other examples are also contemplated, including placement of the pins on the computing device 102 and contacts on the input device 104.

The flexible hinge 106 is also shown in greater detail in the example of FIG. 9. The flexible hinge 106 in this cross section includes a conductor 912 that is configured to communicatively coupled the communication contact 212 of the connection portion 202 with an input portion 914 of the input device 104, e.g., one or more keys, a track pad, and so forth. The conductor 912 may be formed in a variety of ways, such as a copper trace that has an operational flexibility to permit operation as part of the flexible hinge, e.g., to support repeated flexing of the hinge 106. Flexibility of the conductor 912, however, may be limited, e.g., may remain operational to conduct signals for flexing that is performed above a minimum bend radius.

Accordingly, the flexible hinge 106 may be configured to support a minimum bend radius based on the operational flexibility of the conductor 912 such that the flexible hinge 106 resists flexing below that radius. A variety of different techniques may be employed. The flexible hinge 106, for instance, may be configured to include first and second outer layers 916, 918, which may be formed from a fabric, microfiber cloth, and so on. Flexibility of material used to form the first and/or second outer layers 916, 918 may be configured to support flexibility as described above such that the conductor 912 is not broken or otherwise rendered inoperable during movement of the input portion 914 in relation to the connection portion 202.

In another instance, the flexible hinge 106 may include a mid-spine 920 located between the connection portion 202 and the input portion 914. The mid-spine 920, for example, includes a first flexible portion 922 that flexible connects the input portion 904 to the mid-spine 920 and a second flexible portion 924 that flexible connects the mid-spine 920 to the connection portion 920.

In the illustrated example, the first and second outer layers 916, 918 extend from the input portion 914 (and act as a cover thereof) through the first and second flexible portions 922, 924 of the flexible hinge 106 and are secured to the connection portion 202, e.g., via clamping, adhesive, and so on. The conductor 912 is disposed between the first and second outer layers 916, 918. The mid-spine 920 may be configured to provide mechanical stiffness 926 to a particular location of the flexible hinge 106 to support a desired minimum bend radius, further discussion of which may be found in relation to the following figure.

Figure 3:
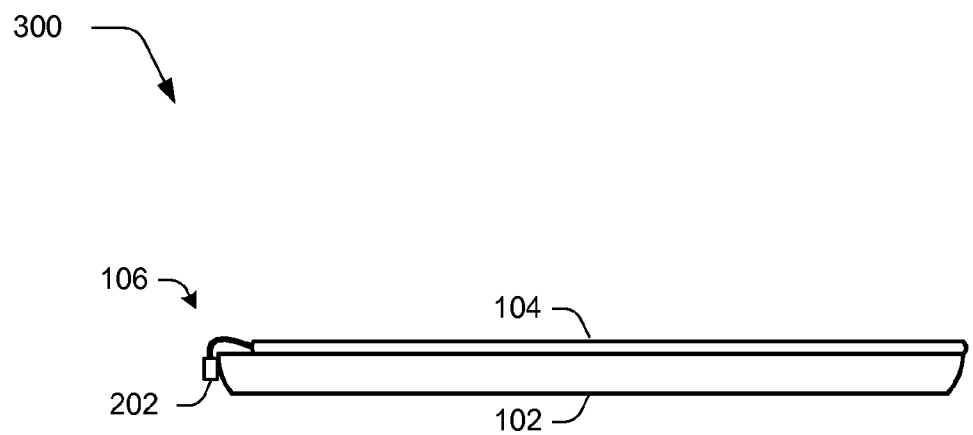
FIG. 3 depicts an example orientation of the input device in relation to the computing device as covering a display device of the computing device.
Figure 10:
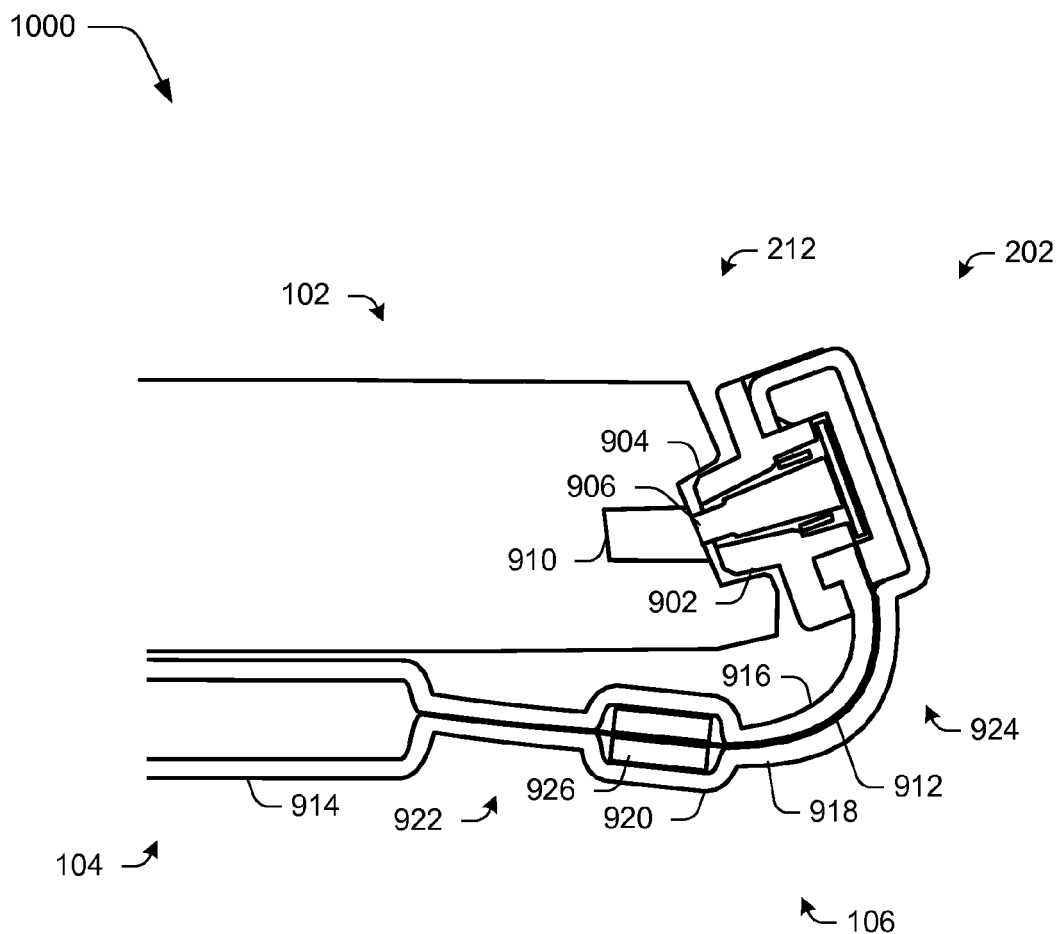
FIG. 10 depicts a cross section of the computing device, connection portion, and flexible hinge of the input device as being oriented as shown in FIG. 3 in which the input device acts as a cover for a display device of the computing device.

FIG. 10 depicts a cross section of the computing device 102, connection portion 202 and flexible hinge 106 of the input device 104 as being oriented as shown in FIG. 3 in which the input device 104 acts as a cover for a display device 110 of the computing device 102. As illustrated, this orientation causes the flexible hinge 106 to bend. Through inclusion of the mid-spine 920 and sizing of the first and second flexible portions 922, 924, however, the bend does not exceed an operational bend radius of the conductor 912 as previously described. In this way, the mechanical stiffness provided by the mid-spine 920 (which is greater than a mechanical stiffness of other portions of the flexible hinge 106) may protect the conductors 912.

The mid-spine 920 may also be used to support a variety of other functionality. For example, the mid-spine 920 may support movement along a longitudinal axis as shown in FIG. 1 yet help restrict movement along a latitudinal axis that otherwise may be encountered due to the flexibility of the flexible hinge 106.

Other techniques may also be leveraged to provide desired flexibility at particular points along the flexible hinge 106. For example, embossing may be used in which an embossed area, e.g., an area that mimics a size and orientation of the mid-spine 920, is configured to increase flexibility of a material, such as one or more of the first and second outer layers 916, 918, at locations that are embossed. An example of an embossed line 214 that increases flexibility of a material along a particular axis is shown in FIG. 2. It should be readily apparent, however, that a wide variety of shapes, depths, and orientations of an embossed area are also contemplated to provide desired flexibility of the flexible hinge 106.

Figure 11:
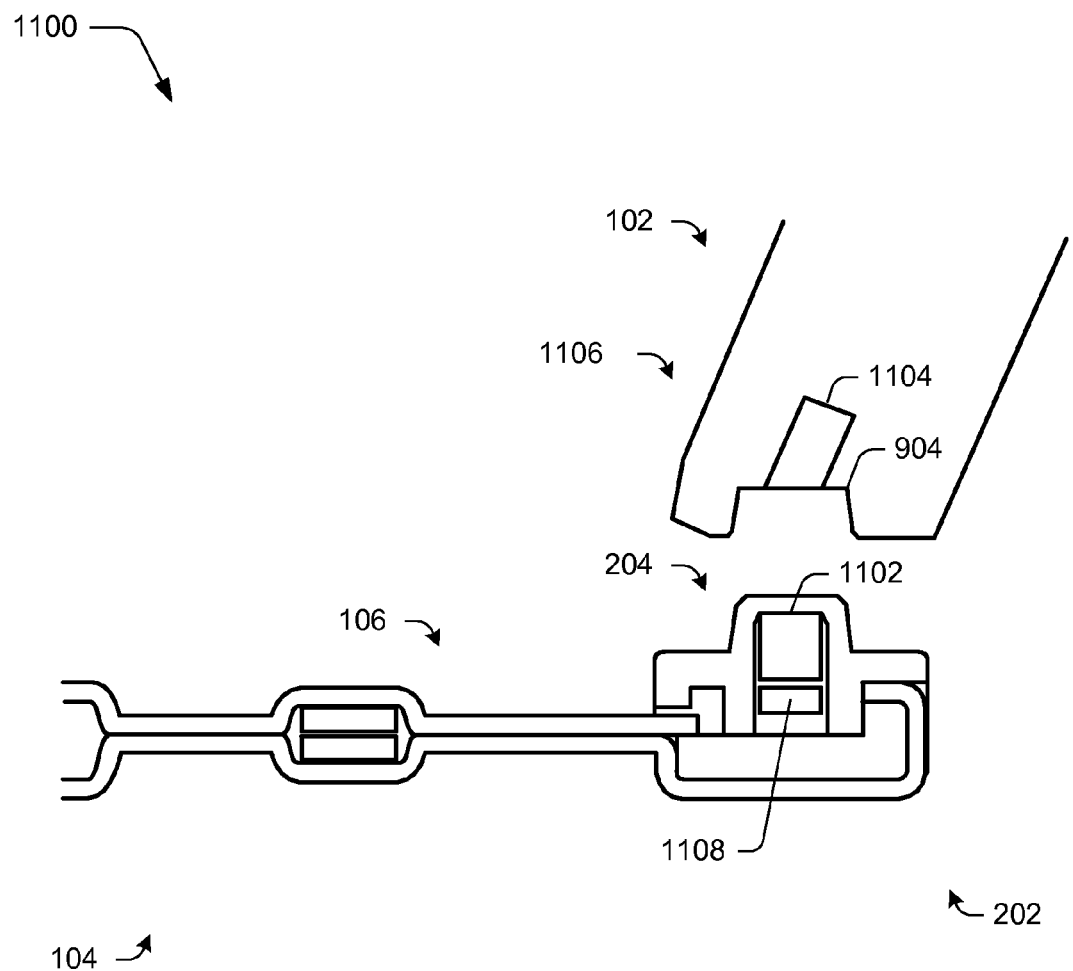
FIG. 11 depicts a cross section taken along an axis showing a magnetic coupling device as well as a cross section of the cavity of the computing device in greater detail.

FIG. 11 depicts a cross section taken along an axis 1100 of FIGS. 2 and 8 showing the magnetic coupling device 204 as well as a cross section of the cavity 904 of the computing device 102 in greater detail. In this example, a magnet of the magnetic coupling device 204 is illustrated as disposed within the connection portion 202.

Movement of the connection portion 202 and the channel 904 together may cause the magnet 1102 to be attracted to a magnet 1104 of a magnetic coupling device 1106 of the computing device 102, which in this example is disposed within the channel 904 of a housing of the computing device 102. In one or more implementations, flexibility of the flexible hinge 106 may cause the connection portion 202 to "snap into" the channel 904. Further, this may also cause the connection portion 202 to "line up" with the channel 904, such that the mechanical coupling protrusion 208 is aligned for insertion into the cavity 1002 and the communication contacts 208 are aligned with respective contacts 910 in the channel.

The magnetic coupling devices 204, 1106 may be configured in a variety of ways. For example, the magnetic coupling device 204 may employ a backing 1108 (e.g., such as steel) to cause a magnetic field generated by the magnet 1102 to extend outward away from the backing 1108. Thus, a range of the magnetic field generated by the magnet 1102 may be extended. A variety of other configurations may also be employed by the magnetic coupling device 204, 1106, examples of which are described and shown in relation to the following referenced figure.

Figure 12:
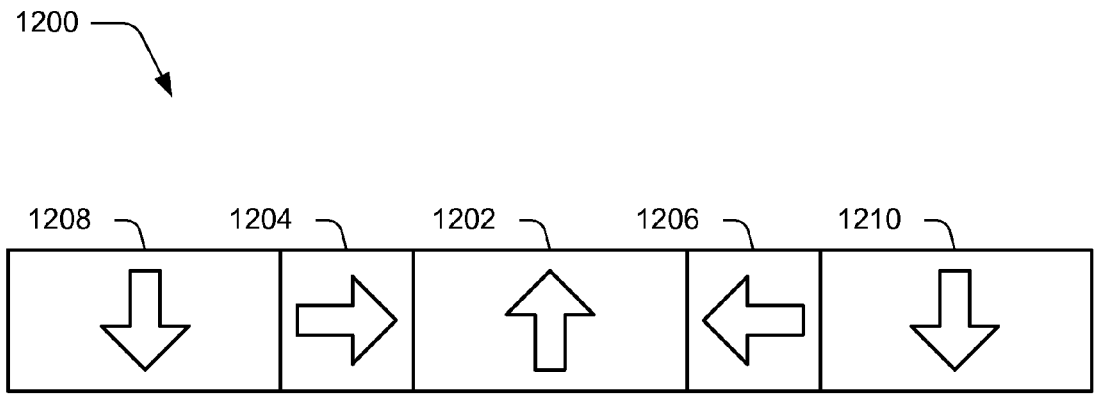
FIG. 12 depicts an example of a magnetic coupling portion that may be employed by the input device or computing device to implement a flux fountain.

FIG. 12 depicts an example 1200 of a magnetic coupling portion that may be employed by the input device 104 or computing device 102 to implement a flux fountain. In this example, alignment of a magnet field is indicted for each of a plurality of magnets using arrows.

A first magnet 1202 is disposed in the magnetic coupling device having a magnetic field aligned along an axis. Second and third magnets 1204, 1206 are disposed on opposing sides of the first magnet 1202. The alignment of the respective magnetic fields of the second and third magnets 1204, 1206 is substantially perpendicular to the axis of the first magnet 1202 and generally opposed each other.

In this case, the magnetic fields of the second and third magnets are aimed towards the first magnet 1202. This causes the magnetic field of the first magnet 1202 to extend further along the indicated axis, thereby increasing a range of the magnetic field of the first magnet 1202.

The effect may be further extended using fourth and fifth magnets 1208, 1210. In this example, the fourth and fifth magnets 1208, 1210 have magnetic fields that are aligned as substantially opposite to the magnetic field of the first magnet 1202. Further, the second magnet 1204 is disposed between the fourth magnet 1208 and the first magnet 1202. The third magnet 1206 is disposed between the first magnet 1202 and the fifth magnet 1210. Thus, the magnetic fields of the fourth and fifth magnets 1208, 1210 may also be caused to extend further along their respective axes which may further increase the strength of these magnets as well as other magnets in the collection. This arrangement of five magnets is suitable to form a flux fountain. Although five magnets were described, any odd number of magnets of five and greater may repeat this relationship to form flux fountains of even greater strength.

To magnetically attach to another magnetic coupling device, a similar arrangement of magnets may be disposed "on top" or "below" of the illustrated arrangement, e.g., so the magnetic fields of the first, fourth and fifth magnets 1202, 1208, 1210 are aligned with corresponding magnets above or below those magnets. Further, in the illustrated example, the strength of the first, fourth, and fifth magnets 1202, 1208, 1210 is stronger than the second and third magnets 1204, 1206, although other implementations are also contemplated. Another example of a flux fountain is described in relation to the following discussion of the figure.

Figure 13:
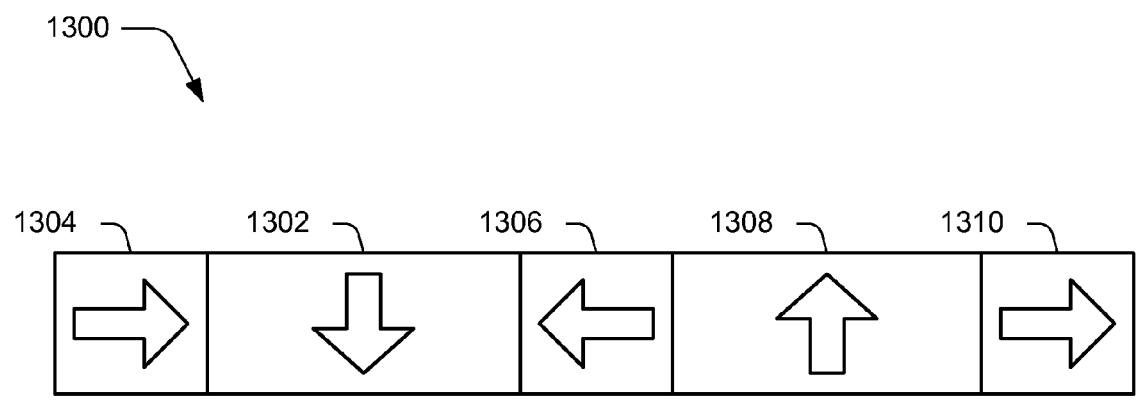
FIG. 13 depicts another example of a magnetic coupling portion that may be employed by the input device or computing device to implement a flux fountain.

FIG. 13 depicts an example 1300 of a magnetic coupling portion that may be employed by the input device 104 or computing device 102 to implement a flux fountain. In this example, alignment of a magnet field is also indicted for each of a plurality of magnets using arrows.

Like the example 1200 of FIG. 12, a first magnet 1302 is disposed in the magnetic coupling device having a magnetic field aligned along an axis. Second and third magnets 1304, 1306 are disposed on opposing sides of the first magnet 1302. The alignment of the magnetic fields of the second and third magnets 1304, 1306 are substantially perpendicular the axis of the first magnet 1302 and generally opposed each other like the example 1200 of FIG. 12.

In this case, the magnetic fields of the second and third magnets are aimed towards the first magnet 1302. This causes the magnetic field of the first magnet 1302 to extend further along the indicated axis, thereby increasing a range of the magnetic field of the first magnet 1302.

This effect may be further extended using fourth and fifth magnets 1308, 1310. In this example, the fourth magnet 1308 has a magnetic field that is aligned as substantially opposite to the magnetic field of the first magnet 1302. The fifth magnet 1310 has a magnetic field that is aligned as substantially corresponding to the magnet field of the second magnet 1304 and is substantially opposite to the magnetic field of the third magnet 1306. The fourth magnet 1308 is disposed between the third and fifth magnets 1306, 1310 in the magnetic coupling device.

This arrangement of five magnets is suitable to form a flux fountain. Although five magnets are described, any odd number of magnets of five and greater may repeat this relationship to form flux fountains of even greater strength. Thus, the magnetic fields of the first 1302 and fourth magnet 1308 may also be caused to extend further along its axis which may further increase the strength of this magnet.

To magnetically attach to another magnetic coupling device, a similar arrangement of magnets may be disposed "on top" or "below" of the illustrated arrangement, e.g., so the magnetic fields of the first and fourth magnets 1302, 1308 are aligned with corresponding magnets above or below those magnets. Further, in the illustrated example, the strength of the first and fourth magnets 1302, 1308 (individually) is stronger than a strength of the second, third and fifth magnets 1304, 1306, 1310, although other implementations are also contemplated.

Further, the example 1200 of FIG. 12, using similar sizes of magnets, may have increased magnetic coupling as opposed to the example 1300 of FIG. 13. For instance, the example 1200 of FIG. 12 uses three magnets (e.g. the first, fourth, and fifth magnets 1202, 1208, 1210) to primarily provide the magnetic coupling, with two magnets used to "steer" the magnetic fields of those magnets, e.g., the second and third magnets 1204, 1206. However, the example 1300 of FIG. 13 uses two magnets (e.g., the first and fourth magnets 1302, 1308) to primarily provide the magnetic coupling, with three magnets used to "steer" the magnetic fields of those magnets, e.g., the second, third, and fifth magnets 1304, 1306, 1308.

Accordingly, though, the example 1300 of FIG. 13, using similar sizes of magnets, may have increased magnetic alignment capabilities as opposed to the example 1200 of FIG. 12. For instance, the example 1300 of FIG. 13 uses three magnets (e.g. the second, third, and fifth magnets 1304, 1306, 1310) to "steer" the magnetic fields of the first and fourth magnets 1302, 1308, which are used to provide primary magnetic coupling. Therefore, the alignment of the fields of the magnets in the example 1300 of FIG. 13 may be closer than the alignment of the example 1200 of FIG. 12.

Regardless of the technique employed, it should be readily apparent that the "steering" or "aiming" of the magnetic fields described may be used to increase an effective range of the magnets, e.g., in comparison with the use of the magnets having similar strengths by themselves in a conventional aligned state. In one or more implementations, this causes an increase from a few millimeters using an amount of magnetic material to a few centimeters using the same amount of magnetic material.

Figure 14:
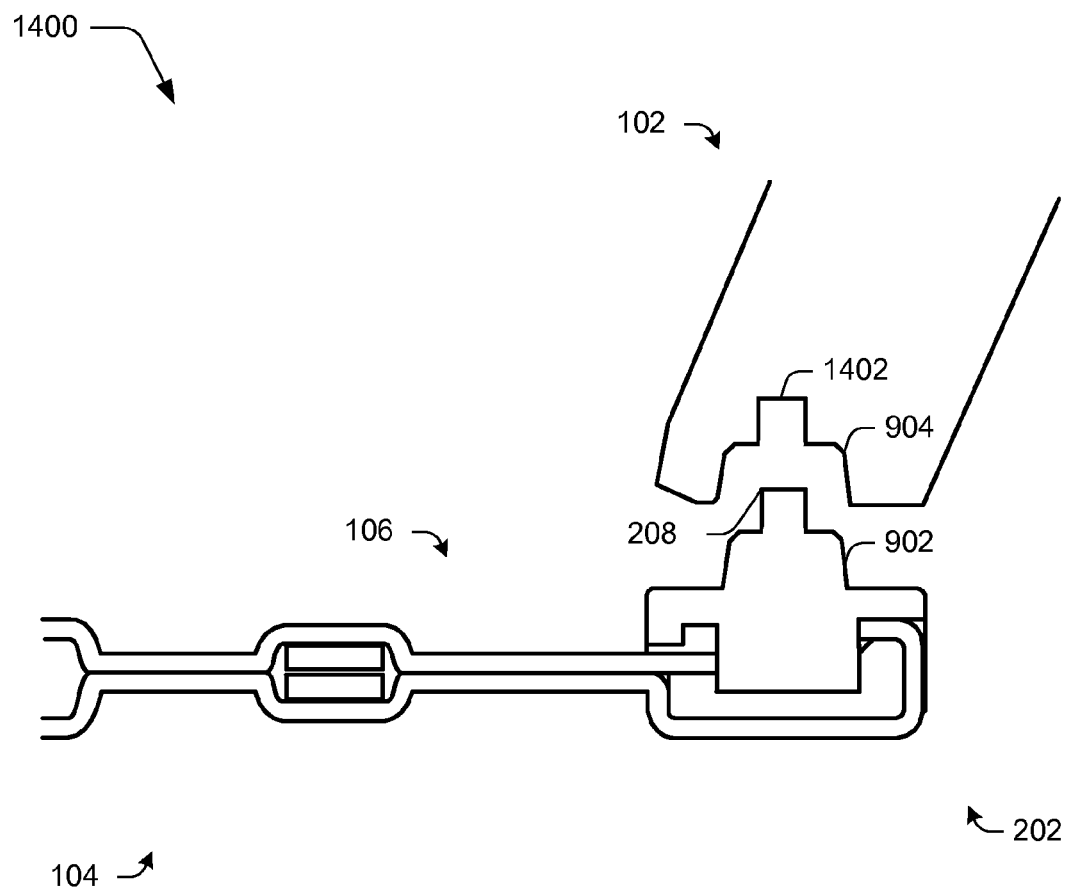
FIG. 14 depicts a cross section taken along an axis showing a mechanical coupling protrusion as well as a cross section of the cavity of the computing device in greater detail.

FIG. 14 depicts a cross section taken along an axis 1400 of FIGS. 2 and 8 showing the mechanical coupling protrusion 208 as well as a cross section of the cavity 904 of the computing device 102 in greater detail. As before, the projection 902 and channel 904 are configured to have complementary sizes and shapes to limit movement of the connection portion 202 with respect to the computing device 102.

In this example, the projection 902 of the connection portion 202 also includes disposed thereon the mechanical coupling protrusion 208 that is configured to be received in a complementary cavity 1402 disposed within the channel 904. The cavity 1402, for instance, may be configured to receive the protrusion 1002 when configured as a substantially oval post as shown in FIG. 8, although other examples are also contemplated.

When a force is applied that coincides with a longitudinal axis that follows the height of the mechanical coupling protrusion 208 and the depth of the cavity 1002, a user overcomes the magnetic coupling force applied by the magnets solely to separate the input device 104 from the computing device 102. However, when a force is applied along another axis (i.e., at other angles) the mechanical coupling protrusion 208 is configured to mechanically bind within the cavity 1002. This creates a mechanical force to resist removal of the input device 104 from the computing device 102 in addition to the magnetic force of the magnetic coupling devices 204, 206.

In this way, the mechanical coupling protrusion 208 may bias the removal of the input device 104 from the computing device 102 to mimic tearing a page from a book and restrict other attempts to separate the devices. Referring again to FIG. 1, a user may grasp the input device 104 with one hand and the computing device 102 with another and pull the devices generally away from each other while in this relatively "flat" orientation. Through bending of the flexible hinge 106 the protrusion 208 and an axis of the cavity 1402 may be generally aligned to permit removal.

However, at other orientations, such as those shown in FIGS. 3-7, sides of the protrusion 208 may bind against sides of the cavity 1402, thereby restricting removal and promoting a secure connection between the devices. The protrusion 208 and cavity 1402 may be oriented in relation to each other in a variety of other ways as described to promote removal along a desired axis and promote a secure connection along other axes without departing from the spirit and scope thereof. The protrusion 208 may also be leveraged to provide a variety of other functionality besides mechanical retention, examples of which are discussed in relation to the following figures.

Figure 15:
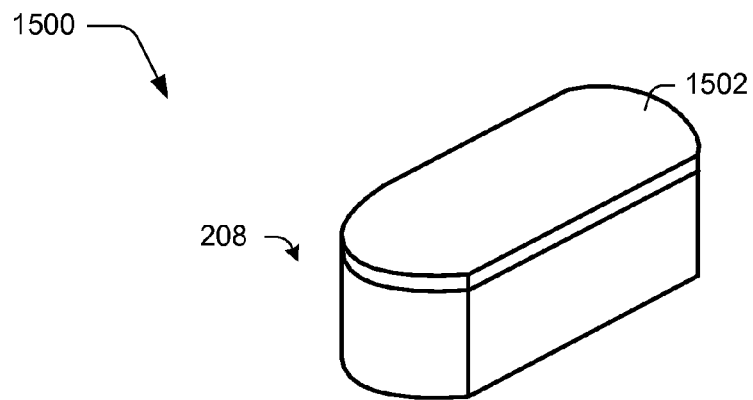
FIG. 15 depicts a perspective view of a protrusion as configured to communicate signals and/or transmit power between the input device and the computing device.

FIG. 15 depicts a perspective view 1500 of the protrusion as configured to communicate signals and/or transmit power between the input device 104 and the computing device 102. In this example, a top surface 1502 of the protrusion is configured to communicatively connect with a contact disposed within a cavity 1402 of the computing device 1402, or vice versa.

This contact may be used for a variety of purposes, such as to transmit power from the computing device 102 to the input device 104, from auxiliary power of the input device 104 to the computing device, communicate signals (e.g., signals generated from the keys of the keyboard), and so forth. Further, as shown in the top view 1600 of FIG. 16, the surface 1502 may be divided to support a plurality of different contacts, such as first and second contacts 1602, 1604 although other numbers, shapes, and sizes are also contemplated.

Figure 16:
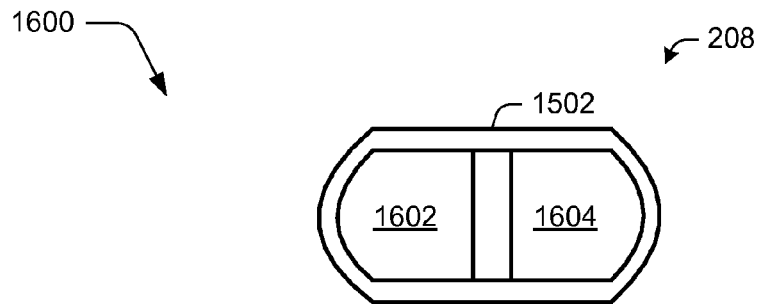
FIG. 16 illustrates a top view of a protrusion in which a surface is divided to support a plurality of different contacts.
Figure 17:
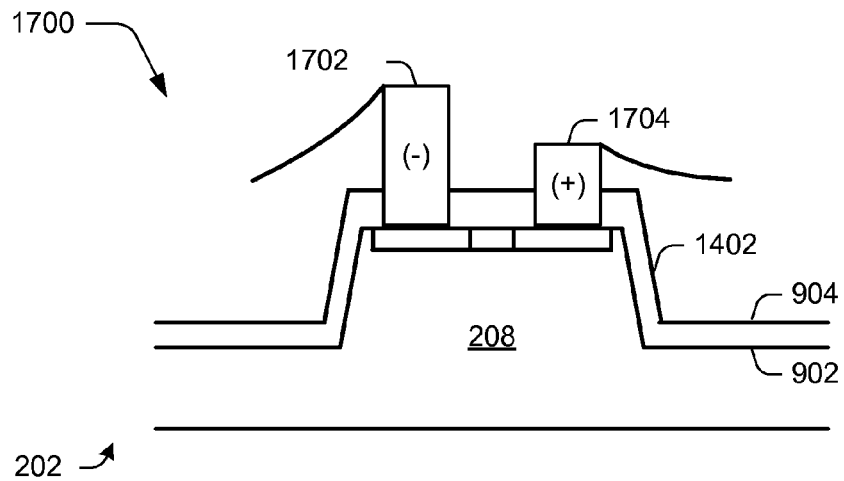
FIG. 17 depicts a cross section view of the protrusion of FIG. 16 as disposed within a cavity of the computing device.

FIG. 17 depicts a cross section view 1700 of the protrusion 208 of FIG. 16 as disposed within the cavity 1402 of the computing device 102. In this example, first and second contacts 1702, 1704 include spring features to bias the contacts outward from the cavity 1402. The first and second contacts 1702, 1704 are configured to contact the first and second contacts 1602, 1602 of the protrusion, respectively. Further, the first contact 1702 is configured as a ground that is configured to contact the first contact 1602 of the protrusion 208 before the second contact 1704 touches the second contact 1604 of the protrusion 208. In this way, the input device 104 and the computing device 102 may be protected against electrical shorts. A variety of other examples are also contemplated without departing from the spirit and scope thereof.

Figure 18:
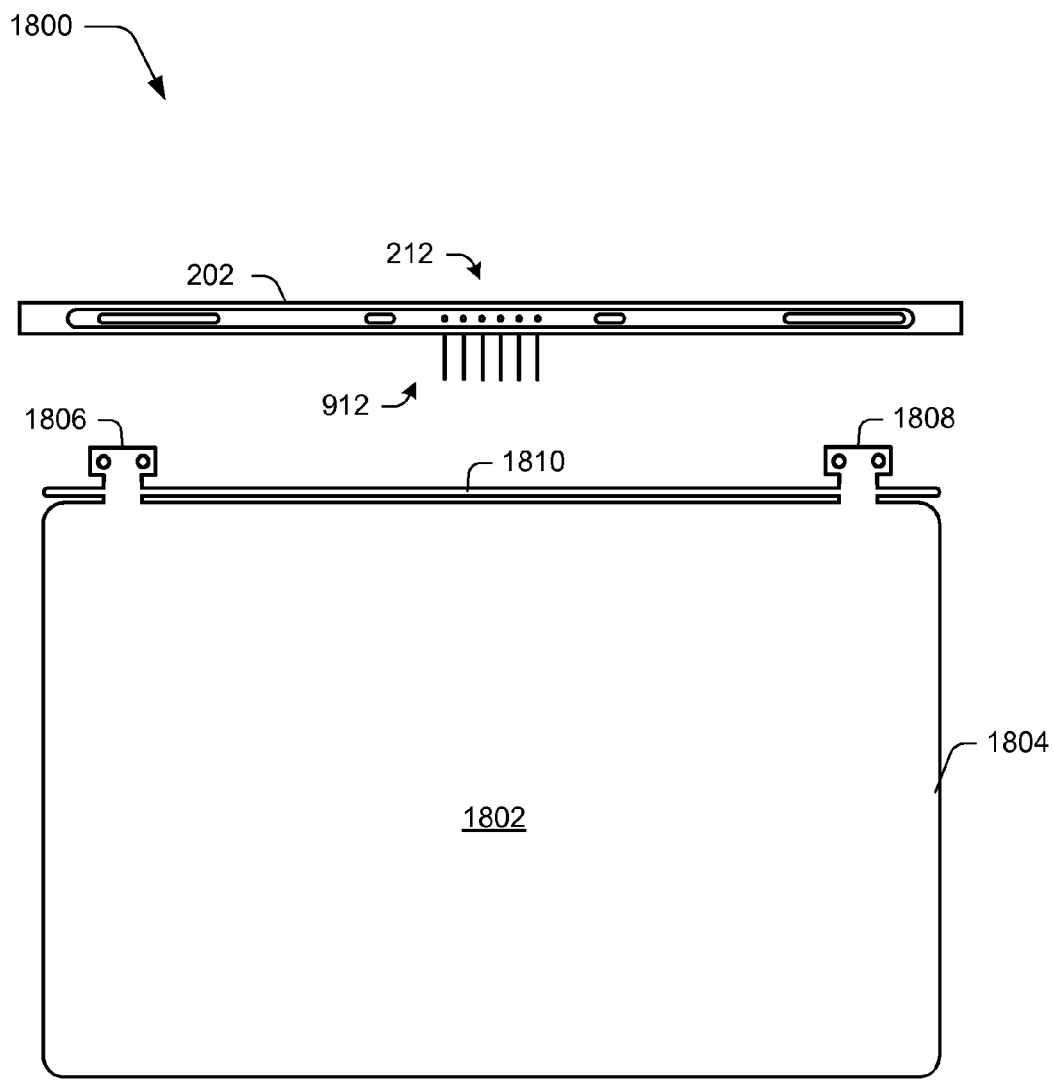
FIG. 18 depicts an example implementation showing a support layer that is configured to support operation of the flexible hinge as well as protect components of the input device during this operation.

FIG. 18 depicts an example implementation 1800 showing a support layer 1802 that is configured to support operation of the flexible hinge 106 as well as protect components of the input device 104 during this operation. As shown in relation to FIGS. 3-7, the flexible hinge 106 may be configured to support various degrees of bending to assume the different configurations.

However, materials chosen to form the flexible hinge 106, such as to form the first and second outer layers 916, 918 of the flexible hinge 106 may be chosen to support a desired "look and feel" and therefore may not provide desired resiliency against tearing and stretching. Therefore, in such an instance this could have an effect on operability of the conductors 912. For example, as previously described a user may grasp the input device 104 with one hand to pull it away from the computing device 102 by disengaging the protrusions 208 and magnetic attraction supported by the magnets. Therefore, this could result in an amount of force being applied to the conductors that is sufficient to break them absent sufficient support from the first or second outer surfaces 916, 918 or other structure.

Accordingly, the input device 104 may include a support layer 804 that may be configured to protect the flexible hinge 106 and other components of the input device 104. For example, the support layer 804 may be formed of a material that has a higher resistance to tearing and stretching than a material used to form the first or second outer layers 916, 918, e.g., biaxially-oriented polyethylene terephthalate (BoPET) which is also known as Mylar.

Support provided by the support layer 1802 may thus help protect the material used to form the first and second outer surfaces 916, 918 of the flexible hinge 106. The support layer 1802 may also help protect components disposed through the hinge, such as the conductors 912 used to communicatively couple the connection portion 202 with the keys.

In the illustrated example, the support layer 1802 includes a portion 1804 configured to be disposed as part of the input portion 914 of the input device 104 that includes the keys, track pad, and so on as shown in FIG. 1. The support layer 1802 also includes first and second tabs 1806, 1808 that are configured to extend from the portion 1804 through the flexible hinge 106 to be secured to the connection portion 202. The tabs may be secured in a variety of ways, such as to include one or more holes as illustrated through which a protrusion (e.g., screw, pin, and so on) may be inserted to secure the tabs to the connection portion 202.

The first and second tabs 1806, 1808 are illustrated in this example as being configured to connect at approximate opposing ends of the connection portion 202. In this way, undesirable rotational movement may be restricted, e.g., that is perpendicular to a longitudinal axis defined by the connection portion 202. Thus, the conductors 912 disposed at a relative midpoint of the flexible hinge 106 and connection portion 202 may also be protected from tearing, stretching, and other forces The support layer 1802 in this illustrated example also includes a mid-spine portion 1810 that is configured to form part of the mid-spine 920 that is described in relation to FIGS. 9 and 10. Thus, the support layer 1802 may also act to increase the mechanical stiffness of the mid-spine 920 and contribute to the minimum bend radius as also previously described. Although first and second tabs 1806, 1808 are illustrated, it should be readily apparent that more or fewer tabs may also be employed by the support layer 1802 to support the functionality described.

Figure 19:
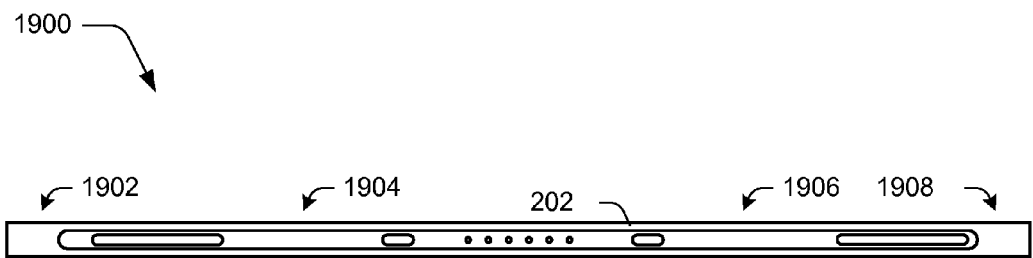
FIG. 19 depicts an example implementation in which a top view of the connection portion is shown.

FIG. 19 depicts an example implementation 1900 in which a top view of the connection portion 202 is shown. The connection portion 202 may be configured in a variety of ways and from a variety of materials, such as metals, plastics, and so on. These different materials may be chosen based on desired functionality.

For example, a designer may desire ease of insertion and removal of the connection portion 202 from the cavity of the computing device 102 and accordingly select a material that is smooth and that has a relatively high resistance to wear. However, such a material may not provide a desired resistance to flexing, which could cause inconsistent contact between portions of the connection portion 202 with the computing device 102. Accordingly, a designer may choose to utilize a plurality of pins at first, second, third, and fourth locations 1902, 1904, 1906, and 1908 along a longitudinal axis of the connection portion 202 to provide the desired stiffness.

Figure 20:
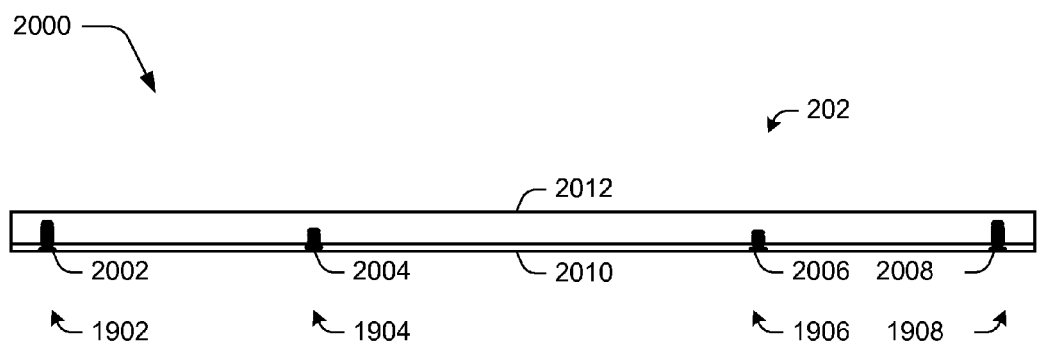
FIG. 20 depicts a cross section view of the connection portion of FIG. 19.

FIG. 20 depicts a cross section view 2000 of the connection portion 202 of FIG. 19. As illustrated, first, second, third, and fourth pins 2002, 2004, 2006, 2008 are utilize to secure a metal spine 2010 in this example to a plastic 2012 used to form a top surface of the connection portion 202. In this way, the pins in combination with the spine 2010 and plastic 2012 may form a laminate structure that is resistant to bending, e.g., along an axis perpendicular to a surface of the spine 2010 and the heights of the pins. It should be readily apparent that a wide range in the numbers and locations of the pins is contemplated, the previous discussion just one example thereof.

The use of the pins may also support a variety of other functionality. For example, the laminate structure may also be supported through use of an adhesive between the metal spine 2010 and the plastic 2012. The adhesive, however, may have an amount of time to cure before it is effective. Through use of the pins, however, the adhesive may be applied and then the pins inserted to secure the metal spine 2010 to the plastic 2012 during curing, thereby increasing speed of manufacturing and efficiency. The pins may be configured in a variety of ways, an example of which is described in relation to the following figure.

Figure 21:
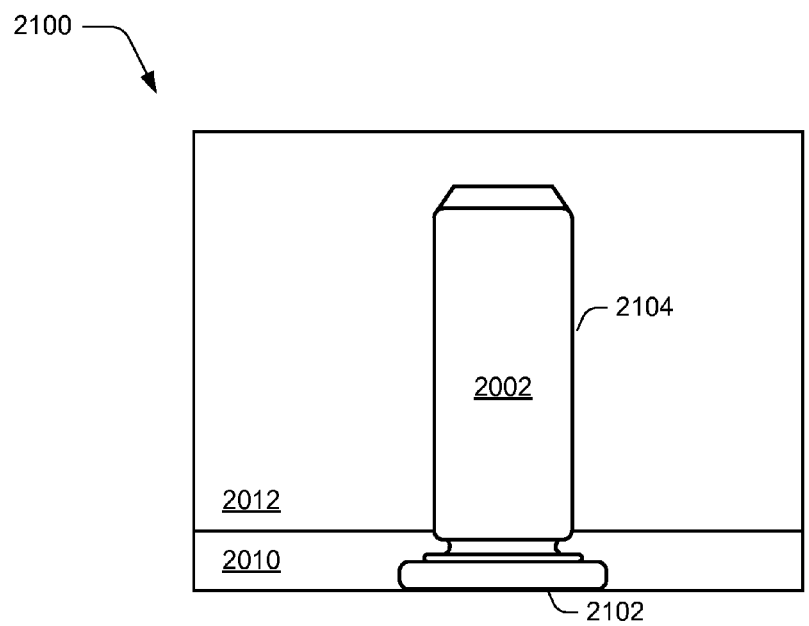
FIG. 21 depicts an example cross sectional view of a first pin of FIG. 20 as securing a metal spine to plastic of the connection portion to form a laminate structure.

FIG. 21 depicts an example cross sectional view of the first pin 2002 of FIG. 20 as securing the metal spine 2010 to the plastic of the connection portion 202. In this example, the first pin 2002 is configured to include self-clinching functionality such that the pin may be secured within a relatively thin material, such as a piece of sheet metal. In this way, the metal spine 2010 may cause a pressure to be applied against a head 2102 of the pin 2102 to secure the first pin 2002 to the metal spine 2010.

The first pin 2002 may also include a barrel 2104 that is secured within the plastic 2104. Therefore, the first pin 2002 may be pressed through an appropriate sized hole in the metal spine 2010 to cause the metal spine 2102 to self-clinch as well as the barrel 2104 to be secured within the plastic 2012. A variety of other types and configurations of pins may be utilized, such as screws, rivets, and so on.

Example System and Device

Figure 22:
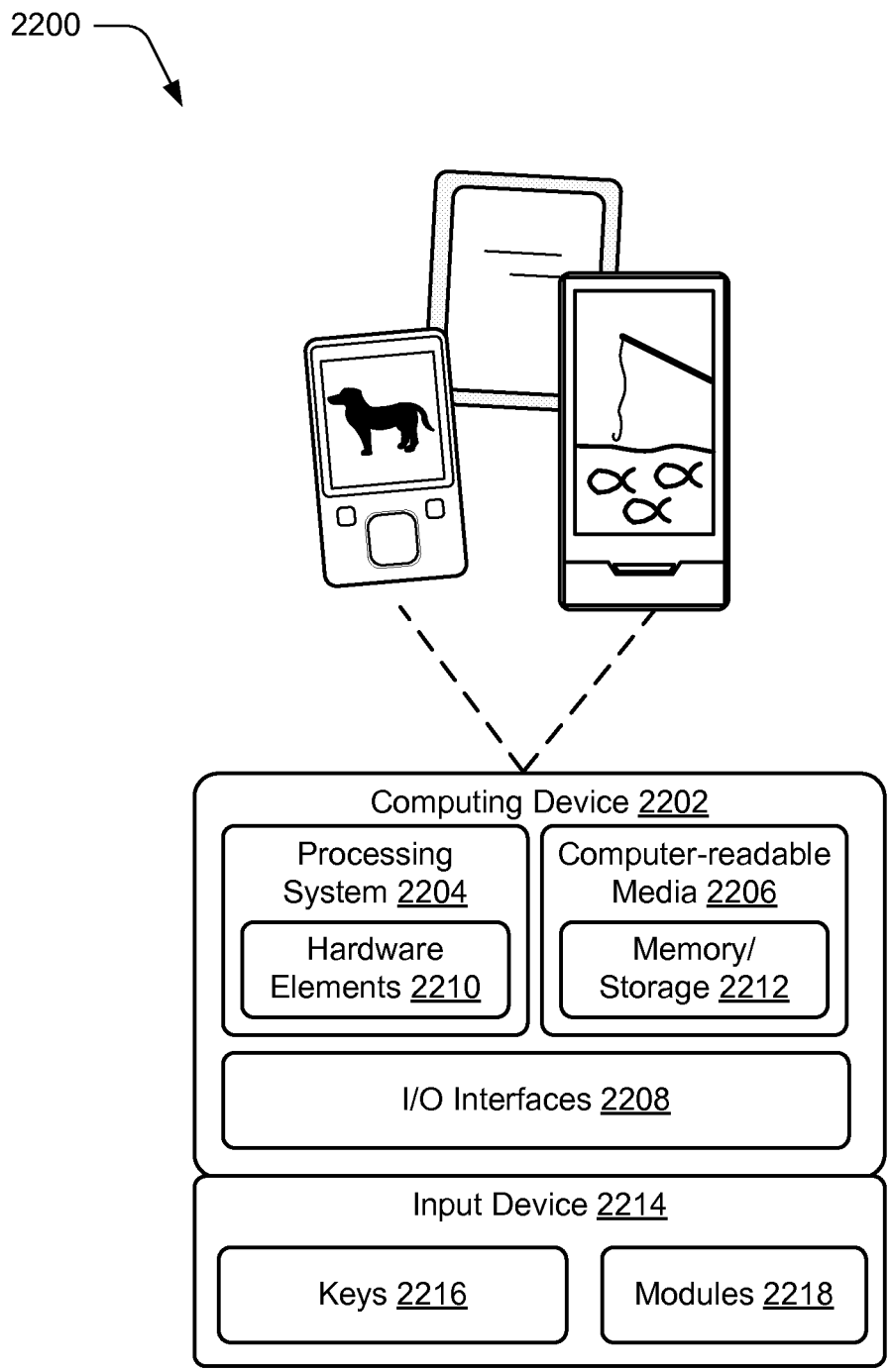
FIG. 22 illustrates an example system including various components of an example device that can be implemented as any type of computing device as described with reference to FIGS. 1-21 to implement embodiments of the techniques described herein.

FIG. 22 illustrates an example system generally at 2200 that includes an example computing device 2202 that is representative of one or more computing systems and/or devices that may implement the various techniques described herein. The computing device 2202 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 2202 as illustrated includes a processing system 2204, one or more computer-readable media 2206, and one or more I/O interface 2208 that are communicatively coupled, one to another. Although not shown, the computing device 2202 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 2204 is representative of functionality to perform one or more operations using hardware. Accordingly, the processing system 2204 is illustrated as including hardware element 2210 that may be configured as processors, functional blocks, and so forth. This may include implementation in hardware as an application specific integrated circuit or other logic device formed using one or more semiconductors. The hardware elements 2210 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 2206 is illustrated as including memory/storage 2212. The memory/storage 2212 represents memory/storage capacity associated with one or more computer-readable media. The memory/storage component 2212 may include volatile media (such as random access memory (RAM)) and/or nonvolatile media (such as read only memory (ROM), Flash memory, optical disks, magnetic disks, and so forth). The memory/storage component 2212 may include fixed media (e.g., RAM, ROM, a fixed hard drive, and so on) as well as removable media (e.g., Flash memory, a removable hard drive, an optical disc, and so forth). The computer-readable media 2206 may be configured in a variety of other ways as further described below.

Input/output interface(s) 2208 are representative of functionality to allow a user to enter commands and information to computing device 2202, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 2202 may be configured in a variety of ways to support user interaction.

The computing device 2202 is further illustrated as being communicatively and physically coupled to an input device 2214 that is physically and communicatively removable from the computing device 2202. In this way, a variety of different input devices may be coupled to the computing device 2202 having a wide variety of configurations to support a wide variety of functionality. In this example, the input device 2214 includes one or more keys 2216, which may be configured as pressure sensitive keys, mechanically switched keys, and so forth.

The input device 2214 is further illustrated as include one or more modules 2218 that may be configured to support a variety of functionality. The one or more modules 2218, for instance, may be configured to process analog and/or digital signals received from the keys 2216 to determine whether a keystroke was intended, determine whether an input is indicative of resting pressure, support authentication of the input device 2214 for operation with the computing device 2202, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 2202. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 2202, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 2210 and computer-readable media 2206 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 2210. The computing device 2202 may be configured to implement particular instructions and/or functions corresponding to the software and/or hardware modules. Accordingly, implementation of a module that is executable by the computing device 2202 as software may be achieved at least partially in hardware, e.g., through use of computer-readable storage media and/or hardware elements 2210 of the processing system 2204. The instructions and/or functions may be executable/operable by one or more articles of manufacture (for example, one or more computing devices 2202 and/or processing systems 2204) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:
1. An input device comprising:
an input portion configured to generate signals to be processed by a computing device using a plurality of keys; and
a connection portion attached to the input portion using a flexible hinge, the connection portion configured to be physically coupled to the computing device using:
a magnetic coupling device; and
a protrusion configured to be received within a cavity formed as part of a channel along an axis and mechanically bind along at least one other axis thereby restricting removal of the protrusion from the cavity.

2. An input device as described in claim 1, wherein the flexible hinge comprises a mid-spine configured to supply mechanical stiffness to a location of the flexible hinge.

3. An input devices as described in claim 1, wherein the protrusion is configured to be removed from the cavity along the axis as defined by a height of the protrusion from the projection and to resist movement along the at least one other axis.

4. An input device as described in claim 1, wherein the protrusion includes a side that is configured to contact the cavity to support transmission of power between the input device and the computing device.

5. An input device as described in claim 1, wherein the connection portion includes a plurality of said protrusions formed as posts.

6. An input device as described in claim 1, wherein the magnetic coupling device is configured to form a physical coupling to a corresponding magnetic coupling device of the computing device.

7. An input device as described in claim 1, wherein the connection portion further includes a plurality of communication contacts that are configured to contact contacts of the computing device to provide the communicative coupling.

8. An input device as described in claim 1, wherein the protrusion is configured to support transmission of power from the input device to the computing device.

9. An input device as described in claim 1, wherein the protrusion is configured to support the communicative coupling between the input device and the computing device.

10. An apparatus comprising:

a housing;

a kickstand attached to the housing as supporting rotational movement of the kickstand in relation to the housing; and an input device having an input portion configured to generate signals to be processed by a computing device using a plurality of keys and a connection portion attached to the input portion using a flexible hinge, the connection portion configured to be physically coupled to the housing using a magnetic coupling device.

11. An apparatus as described in claim 10, wherein the connection portion further comprises a protrusion configured to be received within a cavity of the housing to restrict removal of the connection portion via mechanical binding caused by attempted off-axis removal.

12. An apparatus as described in claim 10, wherein the kickstand is configured to lie flat against a rear surface of the housing and to extend away from the housing to support a typing arrangement.

* * * * *